(12) United States Patent
Suzuki et al.

(10) Patent No.: US 7,652,346 B2
(45) Date of Patent: Jan. 26, 2010

(54) SEMICONDUCTOR DEVICE AND MANUFACTURING METHOD THEREOF

(75) Inventors: Ken Suzuki, Osaka (JP); Masafumi Tsutsui, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/939,027

(22) Filed: Nov. 13, 2007

(65) Prior Publication Data

US 2008/0149969 A1 Jun. 26, 2008

(30) Foreign Application Priority Data

Dec. 25, 2006 (JP) ............................. 2006-347387

(51) Int. Cl.
*H01L 21/76* (2006.01)
(52) U.S. Cl. .................. 257/510; 257/499; 257/506; 257/521; 257/522; 257/E29.02
(58) Field of Classification Search ................ 257/499, 257/510, 506, 521, 522, E29.02
See application file for complete search history.

(56) References Cited

U.S. PATENT DOCUMENTS

| | | | |
|---|---|---|---|
| 6,657,276 B1 * | 12/2003 | Karlsson et al. ............. 257/510 |
| 6,828,646 B2 * | 12/2004 | Marty et al. ................. 257/501 |
| 7,119,442 B2 * | 10/2006 | Ito et al. ..................... 257/758 |
| 2002/0171118 A1 * | 11/2002 | Mandelman et al. ........ 257/510 |
| 2006/0108661 A1 * | 5/2006 | Ohta .......................... 257/506 |
| 2006/0145287 A1 * | 7/2006 | Kim ........................... 257/510 |
| 2006/0197161 A1 * | 9/2006 | Takao ......................... 257/369 |
| 2007/0018215 A1 * | 1/2007 | Sandhu et al. .............. 257/296 |
| 2007/0155121 A1 * | 7/2007 | Frohberg et al. ............ 438/424 |

FOREIGN PATENT DOCUMENTS

JP 2002-198368 7/2002

* cited by examiner

*Primary Examiner*—Davienne Monbleau
*Assistant Examiner*—Eduardo A Rodela
(74) *Attorney, Agent, or Firm*—McDermott Will & Emery LLP

(57) ABSTRACT

A semiconductor device includes an active region formed on a semiconductor substrate, an element isolation region formed on the semiconductor substrate so as to surround the active region, and a gate electrode formed on the active region. A region that causes tensile stress so as to improve carrier mobility in the active region is provided in the element isolation region.

15 Claims, 30 Drawing Sheets

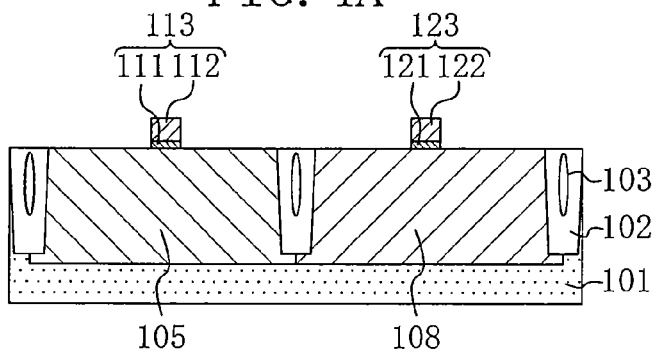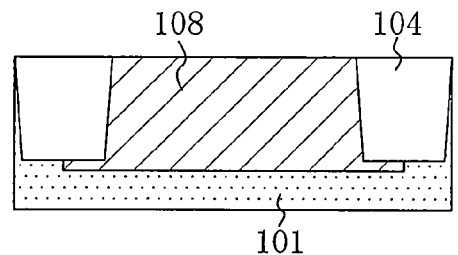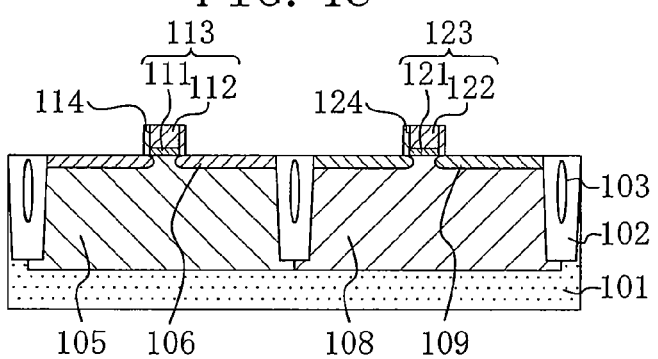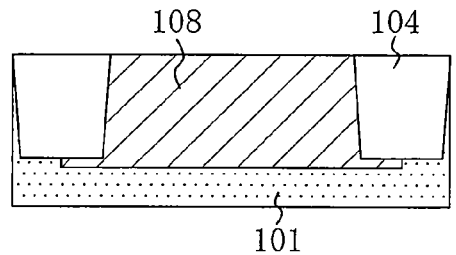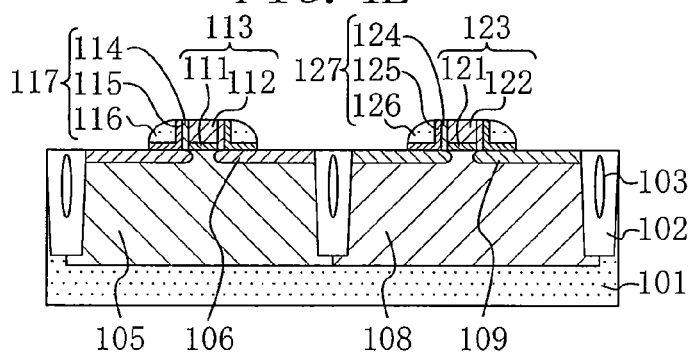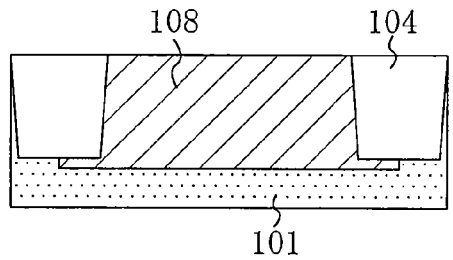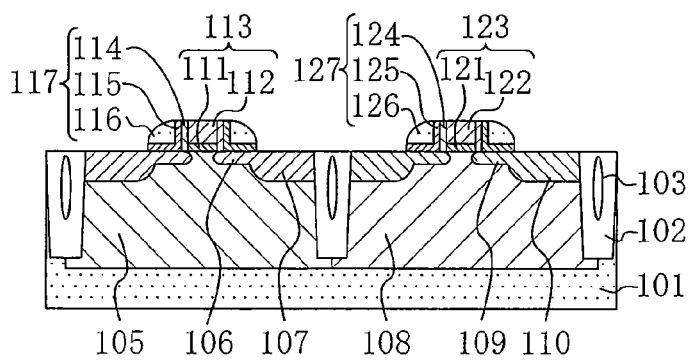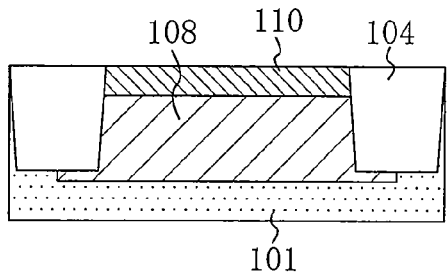

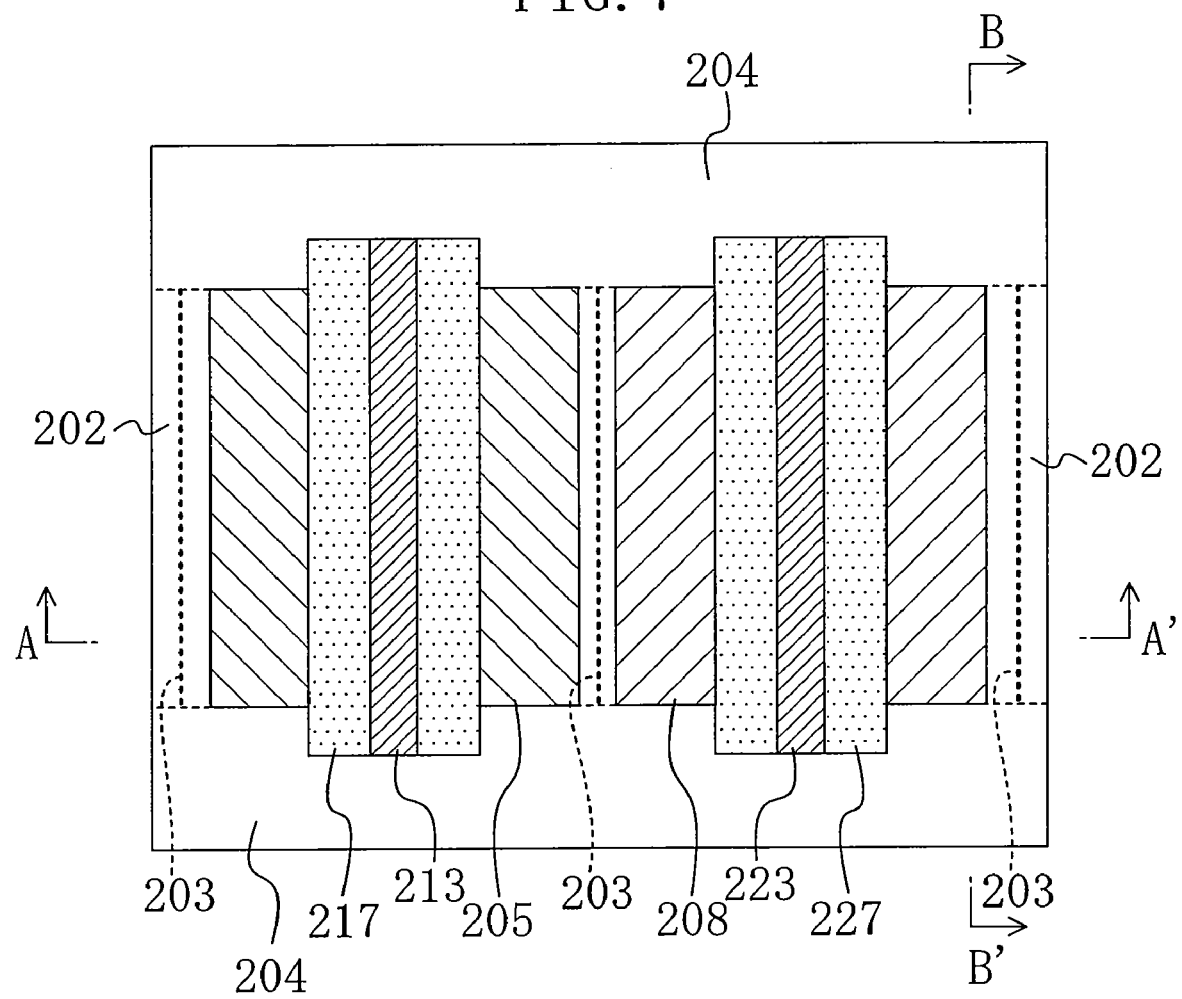

SEMICONDUCTOR DEVICE AND MANUFACTURING METHOD THEREOF

BACKGROUND OF THE INVENTION

1. Field of the Invention

The invention generally relates to a semiconductor device and a manufacturing method thereof. More particularly, the invention relates to a semiconductor device with its driving capability improved by appropriately adjusting carrier mobility in a channel region of a MIS (Metal Insulator Semiconductor) transistor.

2. Background Art

One of the methods for improving driving capability of a semiconductor device such as a MIS transistor is to increase a drain current as a driving current. There are some factors that determine a drain current, and one of the factors is carrier mobility.

It has been known in the art that carrier mobility can be changed by changing a scattering probability or an effective mass of carriers, and the scattering probability or the effective mass of carriers can be changed by changing lattice spacing of atoms that form a semiconductor substrate.

Recently, stress application to a channel region has attracted attention as one of the methods for improving driving capability of a transistor. In this method, stress is applied to silicon that forms a substrate. As a result, a band structure of the substrate is changed and carrier mobility is improved. According to conventional study, it has been known in the art that applying tensile stress to a channel region in a channel length direction (a gate length direction) is effective to improve mobility of an n-channel MIS transistor (NMIS). It has also been known in the art that applying compressive stress to a channel region in a channel length direction (a gate length direction) is effective to improve mobility of a p-channel MIS transistor (PMIS).

Hereinafter, a conventional semiconductor device will be described in terms of carrier mobility in a channel region with reference to the accompanying drawings. FIG. 30 is a cross-sectional view showing the structure of a main part of a conventional semiconductor device.

As shown in FIG. 30, an NMOS (Negative-channel Metal-Oxide-Semiconductor) region 1005 including a p-type well is formed in a semiconductor substrate 1001. For example, the semiconductor substrate 1001 is formed from silicon. The NMOS region 1005 is defined by an element isolation region 1002. A gate portion 1013 is formed on the NMOS region 1005. The gate portion 1013 is formed from a gate insulating film 1011 and a gate electrode 1012, and the gate insulating film 1011 and the gate electrode 1012 are sequentially formed on the NMOS region 1005 in this order. A gate length direction is herein a <100> orientation. In the NMOS region 1005, an n-type source/drain diffusion layer 1007 is formed on both sides of the gate portion 1013. The n-type source/drain diffusion layers 1007 are impurity diffusion layers formed by implanting n-type impurity ions such as arsenic. Each n-type source/drain diffusion layer 1007 has an n-type extension diffusion layer 1006 having a relatively shallow junction depth. The n-type extension diffusion layer 1006 is formed under both side surfaces of the gate insulating film 1011 and the gate electrode 1012. A sidewall 1017 formed from an insulating film is formed on both side surfaces of the gate insulating film 1011 and the gate electrode 1012. The sidewall 1017 is formed from an I-shaped offset spacer 1014, an L-shaped oxide film 1015, and a SiN film 1016. The I-shaped offset spacer 1014 is in contact with the side surface of the gate portion 1013. The L-shaped oxide film 1015 covers the offset spacer 1014. The SiN film 1016 covers the oxide film 1015. A liner film 1030 is formed on the whole surface of the semiconductor substrate 1001 by a CVD (Chemical Vapor Deposition) method. In other words, the liner film 1030 covers the respective surfaces of the gate portion 1013, the sidewalls 1017, and the semiconductor substrate 1001. The liner film 1030 is a silicon nitride film including tensile stress (for example, see Japanese Patent Laid-Open Publication No. 2002-198368).

SUMMARY OF THE INVENTION

However, the above conventional semiconductor device has the following problem due to stress caused in an element isolation region.

In general, a silicon oxide film is used as an insulating film for an element isolation region of a semiconductor substrate. Since silicon oxide has a larger thermal expansion coefficient than that of silicon, compressive stress is applied from an element isolation region to an active region during formation of the element isolation region and the subsequent heat treatment. Compressive stress is thus applied to the whole active region of the semiconductor substrate.

However, electron mobility and hole mobility in a semiconductor change with different sensitivities to change in compressive stress and tensile stress. Therefore, it is difficult to improve both electron mobility and hole mobility at the same time.

In view of the above problem, it is an object of the invention to improve driving capability of a transistor by improving carrier mobility in an active region of the transistor which is surrounded by an element isolation region.

In order to achieve the above object, the inventors arrived at the invention by paying attention to the following fact: by forming, e.g., a void in an oxide film of an element isolation region surrounding an active region, the oxide film can be made to expand toward the void in the oxide film. As a result, contraction occurs in the element isolation region having a void, whereby tensile stress can be applied to the active region.

By selectively forming a void in an element isolation region, in other words, by forming an element isolation insulating film with a void and an element isolation insulating film without a void on the same semiconductor substrate, tensile stress and compressive stress can be optimally applied to the active region according to a transistor type.

For example, when a CMOS (Complementary Metal-Oxide-Semiconductor) transistor has a fixed channel length direction (gate length direction), carrier mobility in a channel region changes according to whether stress is applied from the channel length direction or from the direction perpendicular to the channel length direction (hereinafter, this direction is referred to as a channel width direction (a gate width direction)). More specifically, provided that the channel length direction on a silicon substrate is a <100> orientation, electron mobility is improved in an NMOS (Negative-channel Metal-Oxide-Semiconductor) transistor when tensile stress is applied in the channel length direction and compressive stress is applied in the channel width direction. In a PMOS (Positive-channel Metal-Oxide-Semiconductor) transistor, on the other hand, carrier (hole) mobility is hardly changed whatever stress is applied in the channel length direction and in the channel width direction.

Accordingly, when an NMOS transistor and a PMOS transistor are provided next to each other in the channel length direction, mobility of electrons of the NMOS transistor can be improved by the following method: in order to apply tensile stress to the active region of the NMOS transistor in the channel length direction, a void is formed in an element isolation insulating film that is adjacent to an active region in the channel length direction (i.e., an element isolation insulating film extending in the channel width direction). Moreover, in order to apply compressive stress to the active region of the NMOS transistor in the channel width direction, a normal oxide film (an oxide film without a void) is formed as an element isolation insulating film that is adjacent to the active region in the channel width direction (i.e., an element isolation insulating film extending in the channel length direction).

According to a first aspect of the invention, a semiconductor device includes: an active region formed on a semiconductor substrate; an element isolation region formed on the semiconductor substrate so as to surround the active region; and a gate electrode formed on the active region. A region that causes tensile stress so as to improve carrier mobility in the active region is provided in the element isolation region.

In the semiconductor device of the first aspect of the invention, the region that causes tensile stress so as to improve carrier mobility in the active region is provided in the element isolation region. Therefore, transistor driving capability can be reliably improved.

It should be noted that the above effect can be obtained even when the volume ratio of the region that causes tensile stress to the element isolation region is 0.1%. This volume ratio is preferably 10% or less in order to prevent reduction in strength.

Preferably, a void is formed in the region that causes tensile stress. With this structure, tensile stress can be reliably produced.

Preferably, a material having a lower Young's modulus than a Young's modulus of a remaining portion of the element isolation region is provided in the region that causes tensile stress. With this structure, tensile stress can be reliably produced. When the material having a lower Young's modulus is provided in the element isolation region, the element isolation region contracts less than the case where the void is formed (in other words, tensile stress is reduced). However, if overetching occurs during an etching process in a transistor formation step, etching of the element isolation region proceeds at a lower rate than that in the case where the void is formed.

Preferably, a material having contractile characteristics is provided in the region that causes tensile stress. With this structure, tensile stress can be reliably produced. When the material having contractile characteristics (highly contractile material) is provided in the element isolation region, a larger number of steps are required than in the case where the void is formed. However, if overetching occurs during an etching process in the transistor formation step, etching of the element isolation region proceeds at a lower rate than that in the case where the void is formed. Moreover, the element isolation region contracts more than the case where the void is formed (that is, larger tensile stress is produced).

It should be noted that a material having contractile characteristics herein refers to a material that causes tensile stress.

Preferably, the active region is an N-type MISFET (Metal Insulator Semiconductor Field Effect Transistor) region, and the region that causes tensile stress is provided in a portion of the element isolation region which is adjacent to the active region in a gate length direction. In this case, in an N-type MISFET having a gate length direction of <100> orientation, for example, a void is formed in an element isolation insulating film that is adjacent to the active region in the gate length direction (channel length direction), whereby tensile stress can be applied to the active region in the channel length direction. Moreover, an insulating film without a void is provided as an element isolation insulating film that is adjacent to the active region in the gate width direction (channel width direction), whereby compressive stress can be applied to the active region in the channel width direction. Accordingly, carrier mobility (electron mobility) of the N-type MISFET is improved, whereby driving capability of the N-type MISFET can be reliably improved.

In this case, the semiconductor device of the first aspect of the invention may further include another active region as a P-type MISFET region that is formed on the semiconductor substrate so as to be located next to the active region in the gate length direction and to be surrounded by the element isolation region. The another active region may have a gate length direction of <100> orientation. In a P-type MISFET having a gate length direction of <100> orientation, carrier mobility (hole mobility) in the active region of the P-type MISFET is hardly changed by tensile stress that is applied in the channel length direction and compressive stress that is applied in the channel width direction. Therefore, a region that causes tensile stress such as a void may be provided in an element isolation region that divides the active region of the N-type MISFET and the active region of the P-type MISFET or in an element isolation region that is adjacent to the active region of the P-type MISFET in the channel length direction on the opposite side of the N-type MISFET.

In this case, the semiconductor device of the first aspect of the invention may further include another active region as a P-type MISFET region that is formed on the semiconductor substrate so as to be located next to the active region in a gate width direction and to be surrounded by the element isolation region. The another active region may have a gate length direction of <100> orientation. In a P-type MISFET having a gate length direction of <100> orientation, carrier mobility (hole mobility) in the active region of the P-type MISFET is hardly changed by tensile stress that is applied in the channel length direction and compressive stress that is applied in the channel width direction. Therefore, a region that causes tensile stress such as a void may be provided in an element isolation region that is adjacent to the active region of the P-type MISFET in the channel length direction.

Preferably, the active region is a P-type MISFET region, and the region that causes tensile stress is provided in a portion of the element isolation region which is adjacent to the active region in a gate width direction. In this case, in a P-type MISFET having a gate length direction of <110> orientation, for example, a void is formed in an element isolation insulating film that is adjacent to the active region in the gate width direction (channel width direction), whereby tensile stress can be applied to the active region in the channel width direction. Moreover, an insulating film without a void is provided as an element isolation insulating film that is adjacent to the active region in the gate length direction (channel length direction), whereby compressive stress can be applied to the active region in the channel length direction. Accordingly, carrier mobility (hole mobility) of the P-type MISFET is improved, whereby driving capability of the P-type MISFET can be reliably improved.

In this case, the semiconductor device of the first aspect of the invention may further include another active region as an N-type MISFET region that is formed on the semiconductor substrate so as to be located next to the active region in a gate length direction and to be surrounded by the element isolation region. The another active region may have a gate length direction of <110> orientation. When an N-type MISFET has a gate length direction of <110> orientation and a region that causes tensile stress such as a void is provided in an element isolation region that is adjacent to the active region of the N-type MISFET in the channel width direction, carrier mobility (electron mobility) in the active region of the N-type MISFET is increased by tensile stress that is applied in the channel width direction, and is decreased by compressive stress that is applied in the channel length direction. Preferably, a portion of the element isolation region which is located between the active region and the another active region is divided by a substrate region that extends in a gate width direction, and the region that causes tensile stress is provided also in one of the divided portions which is located adjacent to the another active region. In this case, in the P-type MISFET having a gate length direction of <110> orientation, carrier mobility (hole mobility) is improved, whereby driving capability of the P-type MISFET can be improved. At the same time, in the N-type MISFET having a gate length direction of <110> orientation, tensile stress can be applied to the active region of the N-type MISFET both in the channel width direction and the channel length direction. As a result, carrier mobility (electron mobility) in the active region of the N-type MISFET is improved, whereby driving capability of the N-type MISFET can be improved.

The semiconductor device of the first aspect of the invention may further include another active region as an N-type MISFET region that is formed on the semiconductor substrate so as to be located next to the active region in the gate width direction and to be surrounded by the element isolation region. The another active region may have a gate length direction of <110> orientation. When a region that causes tensile stress such as a void is provided in an element isolation region that divides the respective active regions of an N-type MISFET and a P-type MISFET both having a gate length direction of <110> orientation or in an element isolation region that is adjacent to the active region of the N-type MISFET in the channel width direction on the opposite side of the P-type MISFET, carrier mobility (electron mobility) in the active region of the N-type MISFET is increased by tensile stress that is applied in the channel width direction, but is decreased by compressive stress that is applied in the channel length direction. Preferably, the region that causes tensile stress is provided also in a portion of the element isolation region which is adjacent to the another active region in a gate length direction. In this case, in the P-type MISFET having a gate length direction of <110> orientation, carrier mobility (hole mobility) is improved, whereby driving capability of the P-type MISFET can be improved. At the same time, in the N-type MISFET having a gate length direction of <110> orientation, tensile stress can be applied to the active region of the N-type MISFET both in the channel width direction and the channel length direction. As a result, carrier mobility (electron mobility) in the active region of the N-type MISFET is improved, whereby driving capability of the N-type MISFET can be improved.

According to a second aspect of the invention, a method for manufacturing a semiconductor device including an active region formed on a semiconductor substrate, an element isolation region formed on the semiconductor substrate so as to surround the active region, and a gate electrode formed on the active region includes the steps of: (a) forming a trench corresponding to the element isolation region; and (b) forming an insulating film in the trench. In the step (a), a width or a sidewall taper angle of a prescribed portion of the trench is made smaller than a width or a sidewall taper angle of another portion of the trench.

According to the manufacturing method of the second aspect of the invention, by making the width or the sidewall taper angle of the prescribed portion of the trench smaller than the width or the sidewall taper angle of another portion of the trench, the following process can be conducted: in the step (b), a void is formed in the prescribed portion of the trench by closing a top of the prescribed portion during formation of the insulating film; or after the void is formed, the void is opened and a material having a lower Young's modulus than a Young's modulus of the insulating film or a material having contractile characteristics is provided in the opening. In the latter process, the material in the opening may be covered with another insulating film. Instead of the former process, the following process may be conducted: in the step (b), by making a top part of the prescribed portion of the trench narrower than a top part of the another portion of the trench during formation of the insulating film, introduction of a deposition species into the prescribed portion is suppressed, whereby a material having a lower Young's modulus than a Young's modulus of the insulating film that is formed in the another portion is provided in the prescribed portion.

According to the manufacturing method of the second aspect of the invention, by merely adjusting the layout of a trench formation mask, a region that causes tensile stress so as to improve carrier mobility in the active region can be selectively formed in the element isolation region. Accordingly, a semiconductor device of the invention having improved transistor driving capability can be easily implemented.

Preferably, the manufacturing method of the second aspect of the invention may further includes after the step (b) the step of heat treating the insulating film formed in the trench. In this case, stress of the element isolation insulating film can be released toward a region where the void or the lower Young's modulus material is provided. Therefore, tensile stress can be reliably applied to an active region located near that region. When the material having contractile characteristics is provided in the element isolation insulating film, a region where the material having contractile characteristics is provided contracts by heat treatment such as an annealing process or by ultraviolet radiation. As a result, tensile stress can be reliably applied to the active region near that region.

The manufacturing method of the second aspect of the invention may further include: between the steps (a) and (b) the step of oxidizing a side wall of the trench; and after the step (b) the step of planarizing a surface of the semiconductor substrate.

According to a third aspect of the invention, a method for manufacturing a semiconductor device including an active region formed on a semiconductor substrate, an element isolation region formed on the semiconductor substrate so as to surround the active region, and a gate electrode formed on the active region includes the steps of: (a) forming a first trench corresponding to the element isolation region; (b) forming an insulating film in the first trench; (c) forming a second trench in the insulating film formed in a prescribed portion of the first trench; and (d) closing at least a top of the second trench.

According to the manufacturing method of the third aspect of the invention, a second trench is formed in an insulating film formed in a prescribed portion of the first trench, and then at least a top of the second trench is closed. More specifically, in the step (d), a void is formed in the second trench by closing the top of the second trench. Alternatively, in the step (d), a material having a lower Young's modulus than a Young's modulus of the insulating film or a material having contractile characteristics is provided in the second trench. In the latter case, the material provided in the second trench may be covered with another insulating film.

According to the manufacturing method of the third aspect of the invention, by merely adjusting the layout of a trench formation mask, a region that causes tensile stress so as to improve carrier mobility in the active region can be selectively formed in the element isolation region. Accordingly, a semiconductor device of the invention having improved transistor driving capability can be easily implemented. Unlike the manufacturing method of the second aspect of the invention, the manufacturing method of the third aspect of the invention requires two separate trench formation steps in order to form a void or the like, but does not require formation of, e.g., a region with a smaller element isolation width. Therefore, dimensional restrictions need not be considered in the manufacturing method of the third aspect of the invention.

Preferably, the manufacturing method of the third aspect of the invention further comprises after the step (d) the step of heat treating the insulating film formed in the first trench. In this case, stress of the element isolation insulating film can be released toward a region where the void or the lower Young's modulus material is provided. Therefore, tensile stress can be reliably applied to an active region located near that region. When the material having contractile characteristics is provided in the element isolation insulating film, a region where the material having contractile characteristics is provided contracts by heat treatment such as an annealing process or by ultraviolet radiation. As a result, tensile stress can be reliably applied to the active region near that region.

The manufacturing method according to the third aspect of the invention may further include: between the steps (a) and (b), the step of oxidizing a side wall of the first trench; and after the step (d), the step of planarizing a surface of the semiconductor substrate.

As has been described above, according to the invention, tensile stress or compressive stress can be selectively applied by using an element isolation region formed on a semiconductor substrate. Accordingly, by optimally determining a direction to which stress is applied, carrier mobility in a channel region of a transistor can be improved. As a result, driving capability of a transistor can be improved.

In other words, the invention relates to a semiconductor device and a manufacturing method thereof, and is useful because the invention can implement a semiconductor device having a transistor with improved driving capability.

BRIEF DESCRIPTION OF THE DRAWINGS

FIGS. 2A and 2B are cross-sectional views showing a main part of the structure of the semiconductor device according to the first embodiment of the invention, wherein FIG. 2A is a cross-sectional view taken along line A-A' of FIG. 1 and FIG. 2B is a cross-sectional view taken along line B-B' of FIG. 1;

FIGS. 4A, 4B, 4C, 4D, 4E, 4F, 4G, and 4H are cross-sectional views illustrating the steps of the method for manufacturing a semiconductor device according to the first embodiment of the invention;

FIG. 7 is a plan view showing a main part of the structure of a semiconductor device according to a second embodiment of the invention;

FIGS. 8A and 8B are cross-sectional views showing a main part of the structure of the semiconductor device according to the second embodiment of the invention, wherein FIG. 8A is a cross-sectional view taken along line A-A' of FIG. 7 and FIG. 8B is a cross-sectional view taken along line B-B' of FIG. 7;

FIGS. 11A and 11B are cross-sectional views showing a main part of the structure of the semiconductor device according to the third embodiment of the invention, wherein FIG. 11A is a cross-sectional view taken along line A-A' of FIG. 10 and FIG. 11B is a cross-sectional view taken along line B-B' of FIG. 10;

FIGS. 19A and 19B are cross-sectional views showing a main part of the structure of the semiconductor device according to the fourth embodiment of the invention, wherein FIG. 19A is a cross-sectional view taken along line A-A' of FIG. 18 and FIG. 19B is a cross-sectional view taken along line B-B' of FIG. 18;

FIGS. 21A and 21B are cross-sectional views showing a main part of the structure of the semiconductor device according to the fifth embodiment of the invention, wherein FIG. 21A is a cross-sectional view taken along line A-A' of FIG. 20 and FIG. 21B is a cross-sectional view taken along line B-B' of FIG. 20;

FIGS. 23A and 23B are cross-sectional views showing a main part of the structure of a semiconductor device according to the sixth embodiment of the invention, wherein FIG. 23A is a cross-sectional view taken along line A-A' of FIG. 22 and FIG. 23B is a cross-sectional view taken along line B-B' of FIG. 22;

FIGS. 25A, 25B, and 25C are cross-sectional views showing a main part of the structure of the semiconductor device according to the seventh embodiment of the invention, wherein FIG. 25A is a cross-sectional view taken along line A-A' of FIG. 24, FIG. 25B is a cross-sectional view taken along line B-B' of FIG. 24, and FIG. 25C is a cross-sectional view taken along line C-C' of FIG. 24;

FIGS. 27A, 27B, and 27C are cross-sectional views showing a main part of the structure of the semiconductor device according to the eighth embodiment of the invention, wherein FIG. 27A is a cross-sectional view taken along line A-A' of FIG. 26, FIG. 27B is a cross-sectional view taken along line B-B' of FIG. 26, and FIG. 27C is a cross-sectional view taken along line C-C' of FIG. 26;

FIGS. 29A, 29B, and 29C are cross-sectional views showing a main part of the structure of the semiconductor device according to the ninth embodiment of the invention, wherein FIG. 29A is a cross-sectional view taken along line A-A' of FIG. 28, FIG. 29B is a cross-sectional view taken along line B-B' of FIG. 28, and FIG. 29C is a cross-sectional view taken along line C-C' of FIG. 28.

DETAILED DESCRIPTION OF THE PREFERRED EMBODIMENTS

First Embodiment

Hereinafter, a semiconductor device and a manufacturing method thereof according to a first embodiment of the invention will be described with reference to the accompanying drawings. In this embodiment, a CMOSFET (Complementary Metal-Oxide-Semiconductor Field Effect Transistor) will be described as an example of a semiconductor device of the invention. It should be noted that, in this embodiment, a gate length direction (a channel length direction) of an NMOSFET (Negative-channel Metal-Oxide-Semiconductor Field Effect Transistor) and a PMOSFET (Positive-channel Metal-Oxide-Semiconductor Field Effect Transistor) is a <100> orientation (an allowable tolerance from the <100> orientation is about ±10°).

Figure 1:
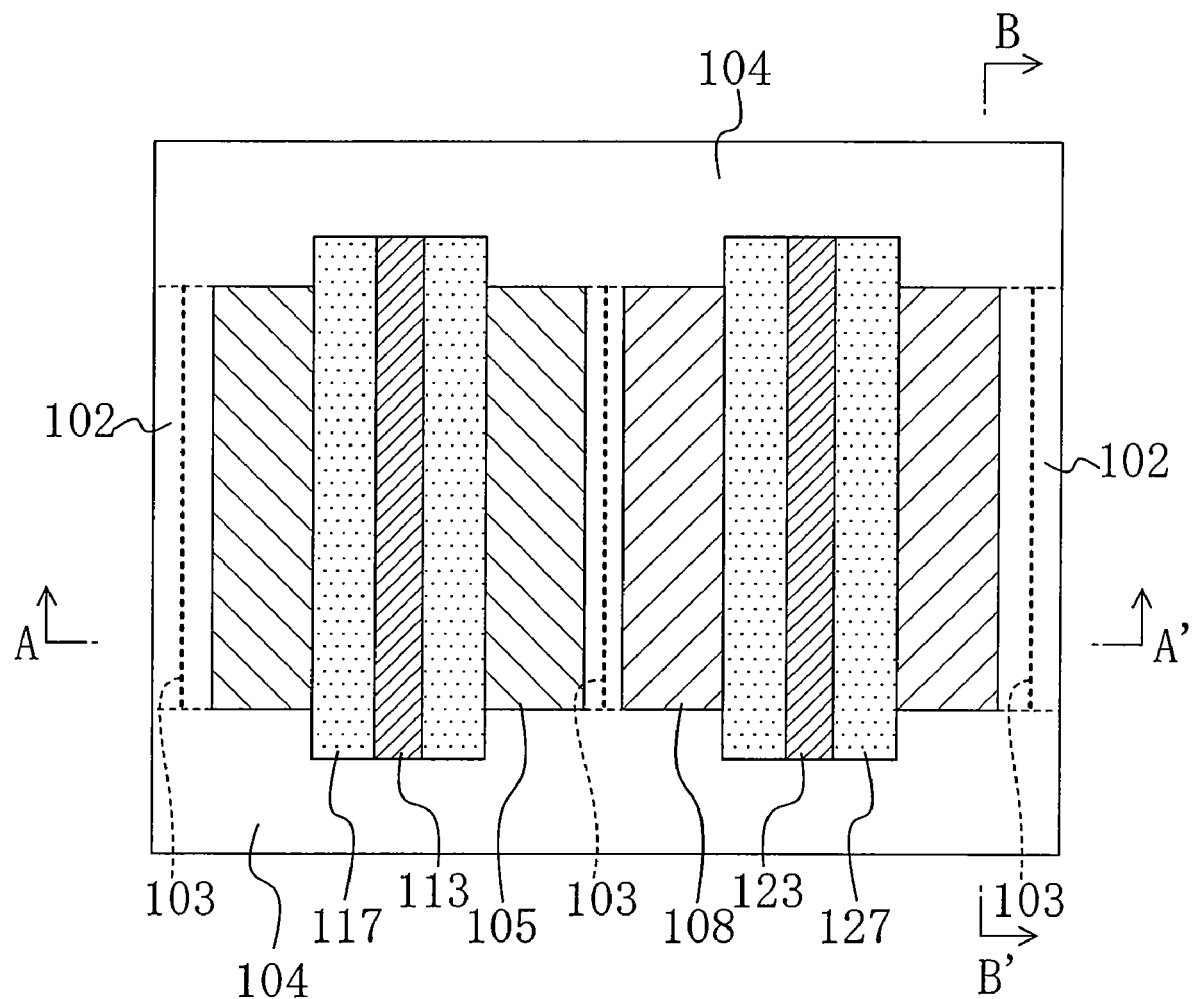
FIG. 1 is a plan view showing a main part of the structure of a semiconductor device according to a first embodiment of the invention.
Figure 2A:
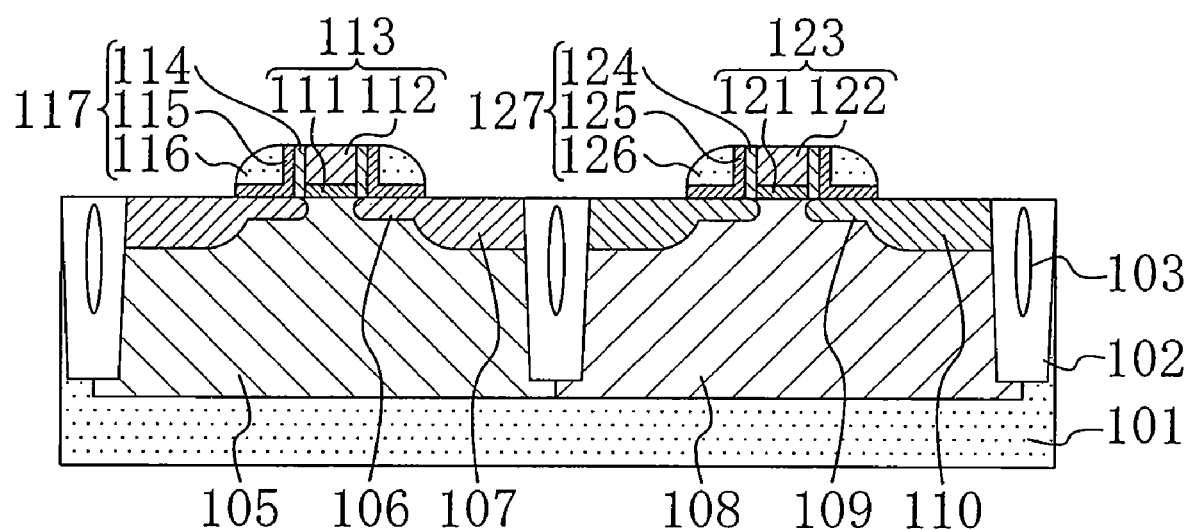
Figure 2B:
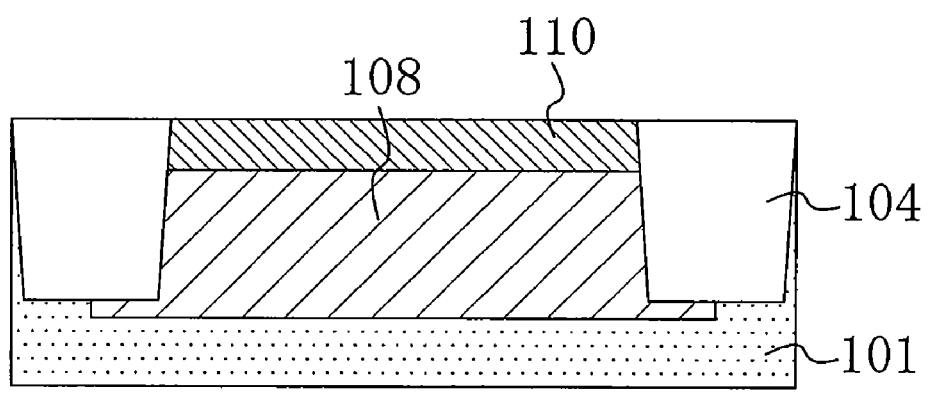

FIG. 1 and FIGS. 2A and 2B show the structure of a semiconductor device according to the first embodiment of the invention. FIG. 1 is a plan view, FIG. 2A is a cross-sectional view taken along line A-A' of FIG. 1, and FIG. 2B is a cross-sectional view taken along line B-B' of FIG. 1.

As shown in FIG. 1 and FIGS. 2A and 2B, an NMOS region (active region) 105 including a p-type well is formed in a first region of a semiconductor substrate 101. The first region is a region defined by element isolation regions 102 and 104. The semiconductor substrate 101 is formed from, e.g., silicon. The element isolation region 102 is located adjacent to the NMOS region 105 in a channel length direction and the element isolation region 104 is located adjacent to the NMOS region 105 in a channel width direction. A gate insulating film 111 and a gate electrode 112 are sequentially formed on the NMOS region 105. The gate insulating film 111 and the gate electrode 112 form a gate portion 113. An insulating sidewall spacer 117 is formed on the side wall of the gate portion 113. The sidewall spacer 117 is formed from, e.g., an I-shaped (plate-like) offset spacer 114, an L-shaped oxide film 115, and a SiN film 116. The I-shaped offset spacer 114 is formed from an oxide film and is in contact with the side wall of the gate portion 113. The L-shaped oxide film 115 covers the side surface of the offset spacer 114. The SiN film 116 covers the side surface and the bottom surface of the L-shaped oxide film 115. An n-type extension diffusion layer 106 and an n-type source/drain diffusion layer 107 are formed on both sides of the gate portion 113 in the NMOS region 105. The n-type extension diffusion layer 106 is an impurity diffusion layer formed by implantation of n-type impurity ions such as arsenic. The n-type source/drain diffusion layer 107 has a deeper junction depth than that of the n-type extension diffusion layer 106. In the NMOS region 105, the n-type extension diffusion layer 106 is formed on both sides of the gate portion 113, and the n-type source/drain diffusion layer 107 is formed in a region located outside the sidewall spacer 117 when viewed from the gate portion 113. Each n-type source/drain diffusion layer 107 connects to a corresponding n-type extension diffusion layer 106.

As shown in FIG. 1 and FIGS. 2A and 2B, a PMOS region (active region) 108 including an n-type well is formed in a second region of the semiconductor substrate 101. The second region is a region defined by the element isolation regions 102 and 104. The PMOS region 108 is located next to the NMOS region 105 in the channel length direction. The element isolation region 102 is located adjacent to the PMOS region 108 in the channel length direction and the element isolation region 104 is located adjacent to the PMOS region 108 in the channel width direction. A gate insulating film 121 and a gate electrode 122 are sequentially formed on the PMOS region 108. The gate insulating film 121 and the gate electrode 122 form a gate portion 123. An insulating sidewall spacer 127 is formed on the side wall of the gate portion 123. The sidewall spacer 127 is formed from, e.g., an I-shaped (plate-like) offset spacer 124, an L-shaped oxide film 125, and a SiN film 126. The I-shaped offset spacer 124 is formed from an oxide film and is in contact with the side wall of the gate portion 123. The L-shaped oxide film 125 covers the side surface of the offset spacer 124. The SiN film 126 covers the side surface and the bottom surface of the L-shaped oxide film 125. A p-type extension diffusion layer 109 and a p-type source/drain diffusion layer 110 are formed on both sides of the gate portion 123 in the PMOS region 108. The p-type extension diffusion layer 109 is an impurity diffusion layer formed by implantation of p-type impurity ions such as boron. The p-type source/drain diffusion layer 110 has a deeper junction depth than that of the p-type extension diffusion layer 109. In the PMOS region 108, the p-type extension diffusion layer 109 is formed on both sides of the gate portion 123, and the p-type source/drain diffusion layer 110 is formed in a region located outside the sidewall spacer 127 when viewed from the gate portion 123. Each p-type source/drain diffusion layer 110 connects to a corresponding p-type extension diffusion layer 109.

This embodiment is characterized in that, as shown in FIG. 1 and FIG. 2A, a void region 103 is formed in the element isolation region 102 that is adjacent to the NMOS region 105 in the channel length direction. With this structure, tensile stress can be applied to the NMOS region 105 in the channel length direction in an NMOSFET having a gate length direction of <100> orientation. No void region is formed in the element isolation region 104 that is adjacent to the NMOS region 105 in the channel width direction (the gate width direction). Therefore, compressive stress can be applied to the NMOS region 105 in the channel width direction. As a result, carrier mobility (electron mobility) of the NMOSFET can be improved, whereby driving capability of the NMOSFET can be reliably improved.

It should be noted that the above effect can be obtained even when the volume ratio of the void region 103 to the element isolation region 102 is 0.1%. However, this volume ratio is preferably 10% or less in order to prevent reduction in strength.

In this embodiment, the void region 103 is formed in the element isolation region 102 that divides the NMOS region 105 and the PMOS region 108 and in the element isolation region 102 that is adjacent to the PMOS region 108 in the channel length direction on the opposite side of the NMOS region 105. However, in a PMOSFET having a gate length direction of <100> orientation, carrier mobility (hole mobility) of the PMOSFET is hardly changed by tensile stress that is applied in the channel length direction by the void region 103 and compressive stress that is applied in the channel width direction by the element isolation region 104 having no void region 103.

FIG. 1 shows that the sidewall spacers 117 and 127 are respectively formed on the side walls of the gate portions 113 and 123 which face the channel length direction. However, the sidewall spacers 117 and 127 may also be formed on the end faces of the gate portions 113 and 123 which face the channel width direction, respectively.

Hereinafter, a method for manufacturing a semiconductor device according to the first embodiment of the invention will be described.

FIGS. 3A through 3H and FIGS. 4A through 4H sequentially illustrate in cross section the steps of the method for manufacturing a semiconductor device according to the first embodiment of the invention. FIGS. 3A, 3C, 3E, and 3G and FIGS. 4A, 4C, 4E, and 4G show cross-sectional structures taken along line A-A' of FIG. 1, and FIGS. 3B, 3D, 3F, and 3H and FIGS. 4B, 4D, 4F, and 4H show cross-sectional structures taken along line B-B' of FIG. 1.

Figure 3A:
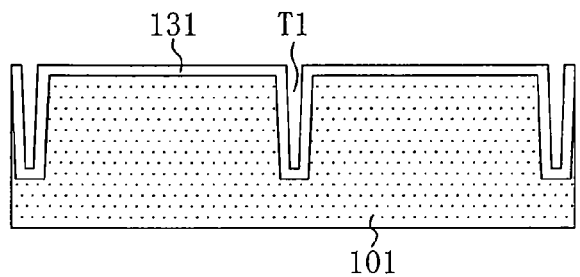
FIGS. 3A, 3B, 3C, 3D, 3E, 3F, 3G, and 3H are cross-sectional views illustrating the steps of a method for manufacturing a semiconductor device according to the first embodiment of the invention.
Figure 3B:
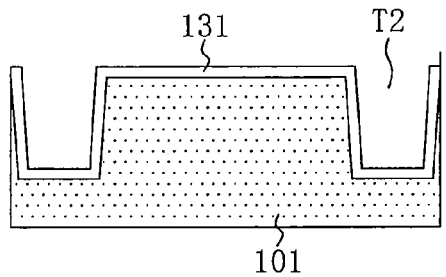

As shown in FIGS. 3A and 3B, a trench etching process is conducted in an element isolation formation region of the semiconductor substrate 101 by using, e.g., a resist mask (not shown). The resist mask layout is determined so that the width of a trench T1 becomes narrower than that of a trench T2. The trench T1 is a trench that is formed in an element isolation formation region that is adjacent to each transistor region (each region to be an active region) in the semiconductor substrate 101 in the channel length direction. The trench T2 is a trench that is formed in an element isolation formation region that is adjacent to each transistor region in the channel width direction. For example, the width of the trench T1 is 80 nm and the width of the trench T2 is 120 nm. The whole surface of the semiconductor substrate 101 including the side walls of the trenches T1 and T2 is then thermally oxidized to form a silicon oxide film 131 that covers the side walls of the trenches T1 and T2.

Figure 3C:
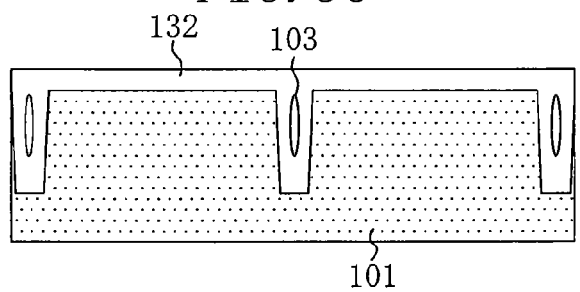
Figure 3D:
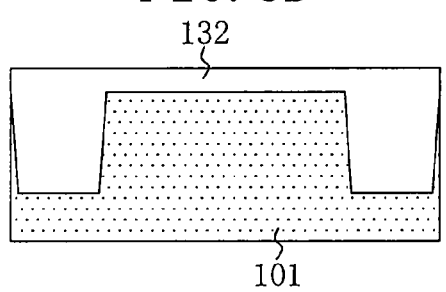

As shown in FIGS. 3C and 3D, a silicon oxide film 132 having a thickness of 100 nm to 150 nm is then formed on the semiconductor substrate 101 by, e.g., a CVD (Chemical Vapor Deposition) method at 800° C. to 900° C. The trenches T1 and T2 are thus filled with the silicon oxide film 132 (in FIGS. 3C and 3D, the silicon oxide film 131 and the silicon oxide film 132 are collectively shown as the silicon oxide film 132). As described above, the trench T1 formed in the element isolation formation region that is adjacent to each transistor region in the channel length direction has a narrower width. Therefore, during deposition of the silicon oxide film 132, the silicon oxide film 132 covers the top of the trench T1 before completely filling the trench T1, forming the void region 103. After the silicon oxide film 132 is formed, an annealing process is conducted as required at e.g., about 900° C. to about 1,000° C.

A thermal expansion coefficient of the silicon oxide film 132 is different from that of silicon that forms the semiconductor substrate 101. Therefore, compressive stress is generated when the semiconductor substrate 101 is cooled to room temperature after deposition of the silicon oxide film 132 at a high temperature. However, in the case where heat treatment is conducted after deposition of the silicon oxide film 132, compressive stress of the silicon oxide film 132 in the trench T1 is released toward the void region 103. Therefore, tensile stress is applied from the element isolation region to the transistor region located near the trench T1 when the semiconductor substrate 101 is cooled to room temperature.

Figure 3E:
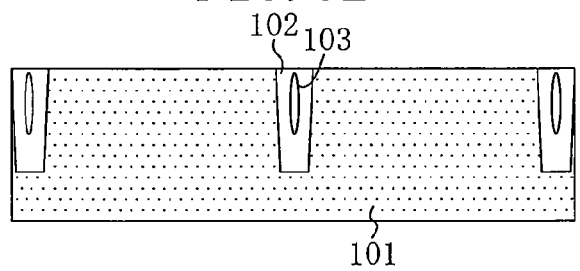
Figure 3F:
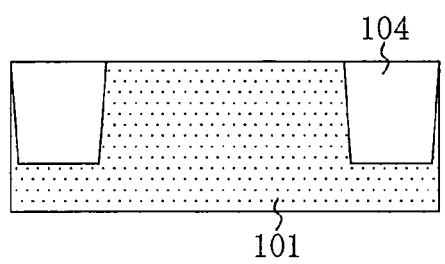

As shown in FIGS. 3E and 3F, after the silicon oxide film 132 is deposited on the semiconductor substrate 101, the surface of the semiconductor substrate 101 is planarized so as to expose the substrate surface of the transistor regions. This planarization process is conducted so as not to open the top end of the void region 103. As a result, an element isolation region 102 that is adjacent to each transistor region in the channel length direction and an element isolation region 104 that is adjacent to each transistor region in the channel width direction are formed. The element isolation region 102 has a void region 103 while the element isolation region 104 does not have a void region 103.

Figure 3G:
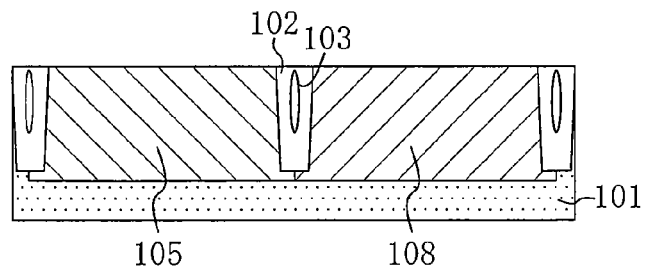
Figure 3H:
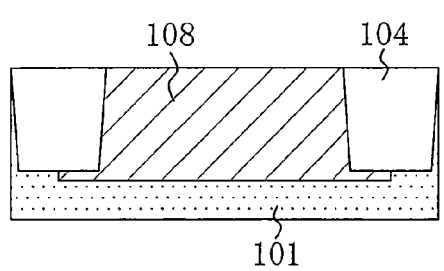

As shown in FIGS. 3G and 3H, an NMOS region 105 including a p-type well and a PMOS region 108 including an n-type well are then formed in the respective transistor regions of the semiconductor substrate 101 by an ion implantation method using a resist mask (not shown). As a result, an active region of an NMOSFET which is surrounded by the element isolation regions 102 and 104 is formed in the NMOS region 105 of the semiconductor substrate 101, and an active region of a PMOSFET which is surrounded by the element isolation regions 102 and 104 is formed in the PMOS region 108 of the semiconductor substrate 101.

As shown in FIGS. 4A and 4B, a silicon oxide film is then formed on the whole surface of the NMOS region 105 and the PMOS region 108 by, e.g., a thermal oxidation method, and a polysilicon film, for example, is deposited thereafter. The polysilicon film and the silicon oxide film are then patterned by a photolithography method and a dry etching method to form a gate portion 113 of the NMOSFET and a gate portion 123 of the PMOSFET. More specifically, the gate portion 113 is formed on the NMOS region 105 and the element isolation region 104 so as to extend across the NMOS region 105 (see FIG. 1). The gate portion 123 is formed on the PMOS region 108 and the element isolation region 104 so as to extend across the PMOS region 108 (see FIG. 1). The gate portion 113 is formed from the gate insulating film 111 and the gate electrode 112. The gate portion 123 is formed from the gate insulating film 121 and the gate electrode 122.

As shown in FIGS. 4C and 4D, a silicon oxide film is then formed on the whole surface of the semiconductor substrate 101 by, e.g., a CVD method so as to cover the side surfaces and the top surfaces of the gate portions 113 and 123. The silicon oxide film is then etched back to form I-shaped offset spacers 114 and 124 of the silicon oxide film. The I-shaped offset spacer 114 is formed on the side surface of the gate portion 113 on the NMOS region 105 and the element isolation region 104. The I-shaped offset spacer 124 is formed on the side surface of the gate portion 123 on the PMOS region 108 and the element isolation region 104.

Thereafter, an n-type extension diffusion layer 106 is formed on both sides of the gate portion 113 in the NMOS region 105, and a p-type extension diffusion layer 109 is formed on both sides of the gate portion 123 in the PMOS region 108. The n-type extension diffusion layer 106 is formed by implanting n-type impurities such as arsenic into the NMOS region 105 by using the gate portion 113 and the offset spacer 114 as a mask. The p-type extension diffusion layer 109 is formed by implanting p-type impurities such as boron into the PMOS region 108 by using the gate portion 123 and the offset spacer 124 as a mask.

As shown in FIGS. 4E and 4F, a silicon oxide film and a silicon nitride film, for example, are then sequentially deposited on the whole surface of the semiconductor substrate 101. The silicon nitride film and the silicon oxide film are then sequentially etched by a dry etching method to form an oxide film 115 and a SiN film 116 on the side surface of the gate portion 113 having the offset spacer 114 formed thereon and to form an oxide film 125 and a SiN film 126 on the side surface of the gate portion 123 having the offset spacer 124 formed thereon. The oxide film 115 has an L shape in cross section and the SiN film 116 covers the side surface and the bottom surface of the L-shaped oxide film 115. The oxide film 125 has an L shape in cross section and the SiN film 126 covers the side surface and the bottom surface of the L-shaped oxide film 125.

Thereafter, n-type impurities are implanted into the NMOS region 105 by using a sidewall spacer 117 as an implantation mask, and p-type impurities are implanted into the PMOS region 108 by using a sidewall spacer 127 as an implantation mask. The sidewall spacer 117 is formed from the offset spacer 114, the L-shaped oxide film 115, and the SiN film 116. The sidewall spacer 127 is formed from the offset spacer 124, the L-shaped oxide film 125, and the SiN film 126. As shown in FIGS. 4G and 4H, an n-type source/drain diffusion layer 107 connecting to the n-type extension diffusion layer 106 and a p-type source/drain diffusion layer 110 connecting to the p-type extension diffusion layer 109 are then formed by activating the n-type impurities and the p-type impurities by heat treatment. The n-type source/drain diffusion layer 107 is formed in a region located outside the sidewall spacer 117 in the NMOS region 105 when viewed from the gate portion 113. The p-type source/drain diffusion layer 110 is formed in a region located outside the sidewall spacer 127 in the PMOS region 108 when viewed from the gate portion 123.

According to the manufacturing method of this embodiment, by merely adjusting the layout of the trench formation mask, the void region 103, a region that causes tensile stress, can be selectively formed in the element isolation region 102 so that carrier mobility in the NMOS region 105 is improved. In other words, a semiconductor device of this embodiment having improved transistor driving capability as shown in FIG. 1 and FIGS. 2A and 2B can be easily implemented by the manufacturing method of this embodiment.

In the description below, the steps from the well formation to the source/drain formation will be collectively referred to as a transistor formation step.

First Modification of the First Embodiment

Figure 5A:
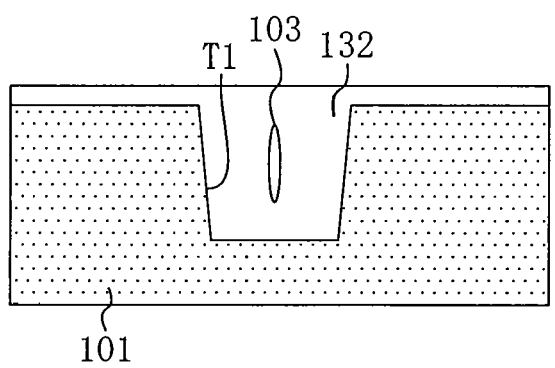
FIGS. 5A and 5B are cross-sectional views illustrating a step of a method for manufacturing a semiconductor device according to a first modification of the first embodiment of the invention.
Figure 5B:
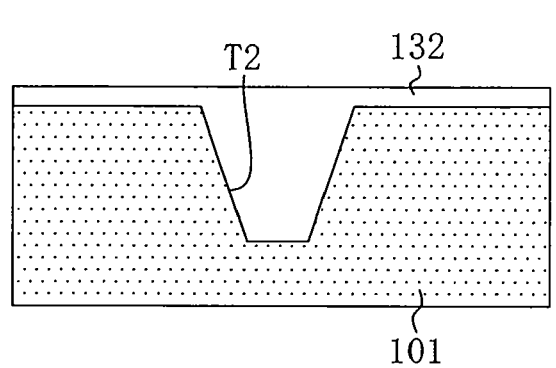

Hereinafter, a method for manufacturing a semiconductor device according to a first modification of the first embodiment of the invention will be described. FIGS. 5A and 5B show cross-sectional structures in a step of the manufacturing method of this modification. FIG. 5A is a cross-sectional view taken along line A-A' of FIG. 1 and FIG. 5B is a cross-sectional view taken along line B-B' of FIG. 1.

This modification is different from the first embodiment in the following point: in the first embodiment, as shown in FIGS. 3C and 3D, a trench T1 having a narrower width is formed in the element isolation formation region that is adjacent to each transistor region in the channel length direction, and a void region 103 is thus formed in the silicon oxide film 132 in the trench T1, that is, in the element isolation region 102. In this modification, on the other hand, as shown in FIGS. 5A and 5B, the width of the trench T1 (to be exact, the width at the top of the trench T1) is the same as the width of the trench T2 (to be exact, the width at the top of the trench T2) which is formed in the element isolation formation region that is adjacent to each transistor region in the channel width direction. However, the sidewall taper angle of the trench T1 (an angle of the side wall of the trench T1 to the vertical direction) is made smaller than the sidewall taper angle of the trench T2. By using the difference in sidewall taper angle between the trenches T1 and T2, a void region 103 is formed in the silicon oxide film 132 in the trench T1, that is, in the element isolation region 102. For example, the sidewall taper angle of the trench T1 is about 0° to about 5° and the sidewall taper angle of the trench T2 is about 10° to about 15°. The trench T2 with a larger sidewall taper angle can be filled with the silicon oxide film 132 without forming a void region.

The manufacturing method of this modification is otherwise the same as that of the first embodiment, and the same effects as those of the first embodiment can be obtained in this modification. Unlike the first embodiment, this modification requires two separate trench formation steps, but does not require formation of, e.g., a region with a smaller element isolation width. Therefore, dimensional restrictions need not be considered in this modification.

Second Modification of the First Embodiment

Hereinafter, a method for manufacturing a semiconductor device according to a second modification of the first embodiment of the invention will be described.

FIGS. 6A through 6J sequentially illustrate in cross section the steps of the manufacturing method of the second modification. FIGS. 6A, 6C, 6E, 6G, and 6I are cross-sectional views taken along line A-A' of FIG. 1 and FIGS. 6B, 6D, 6F, 6H, and 6J are cross-sectional views taken along line B-B' of FIG. 1.

Figure 6A:
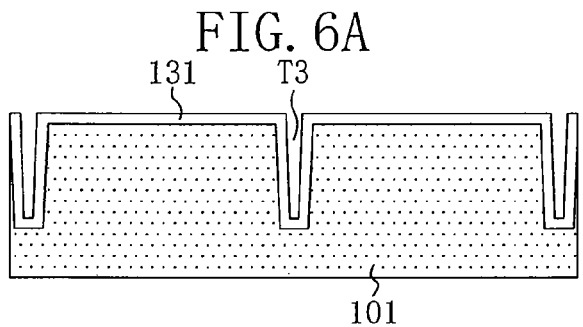
FIGS. 6A, 6B, 6C, 6D, 6E, 6F, 6G, 6H, 6I, and 6J are cross-sectional views illustrating the steps of a method for manufacturing a semiconductor device according to a second modification of the first embodiment of the invention.
Figure 6B:
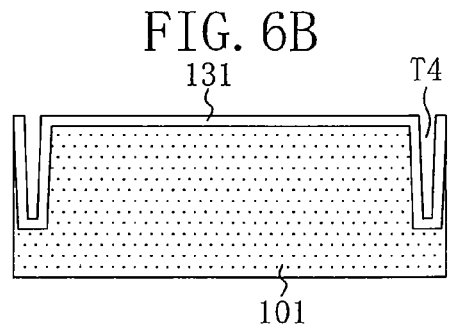

As shown in FIGS. 6A and 6B, first trenches T3 and T4 having a width of, e.g., 120 nm are formed in the element isolation formation region in the semiconductor substrate 101 by a trench etching process using, e.g., a resist mask (not shown). The first trench T3 is formed in the element isolation formation region that is adjacent to each transistor region in the channel length direction, and the first trench T4 is formed in the element isolation formation region that is adjacent to each transistor region in the channel width direction. Unlike the first embodiment (see FIGS. 3A and 3B), in this modification, the width of the first trench T3 need not be made narrower than that of the first trench T4, and the resist mask layout is determined so that the first trenches T3 and T4 have the same width. The whole surface of the semiconductor substrate 101 including the side walls of the first trenches T3 and T4 are then thermally oxidized to form a silicon oxide film 131 that covers the side walls of the first trenches T3 and T4.

Figure 6C:
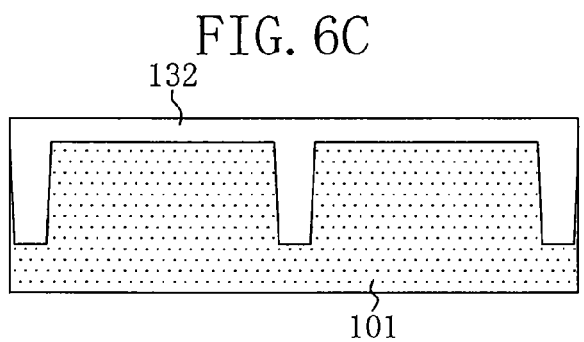
Figure 6D:
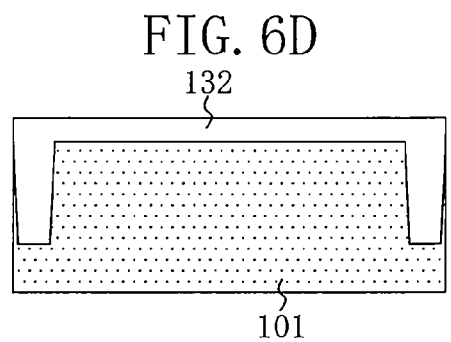

As shown in FIGS. 6C and 6D, a silicon oxide film 132 having a thickness of 100 nm to 150 nm is then formed on the semiconductor substrate 101 by, e.g., a CVD method at 800° C. to 900° C. The first trenches T3 and T4 are thus filled with the silicon oxide film 132 (in FIGS. 6C and 6D, the silicon oxide film 131 and the silicon oxide film 132 are collectively shown as the silicon oxide film 132).

Figure 6E:
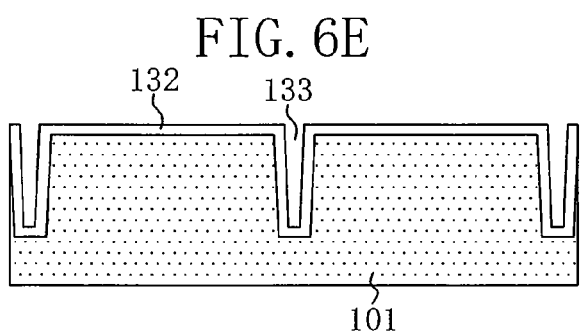
Figure 6F:
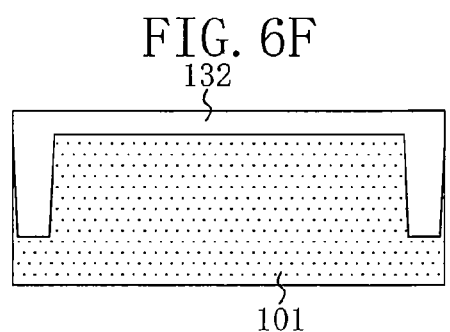

As shown in FIGS. 6E and 6F, the silicon oxide film 132 in the first trench T3 is then patterned by a photolithography method and a dry etching method to form a second trench 133. The width of the second trench 133 is, e.g., 80 nm, and the depth of the second trench 133 is, e.g., about one half to about two thirds of the depth of the first trench 133. In this patterning step, the silicon oxide film 132 in the first trench T4 is not patterned so that the silicon oxide film 132 remains in the first trench T4.

Figure 6G:
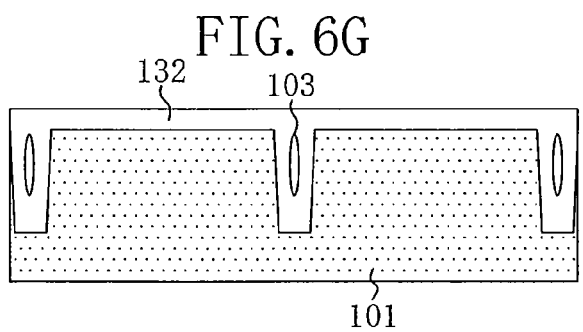
Figure 6H:
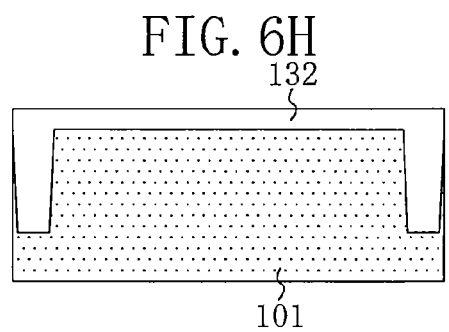

As shown in FIGS. 6G and 6H, a silicon oxide film 132 having a thickness of 50 nm to 70 nm is further formed on the whole surface of the semiconductor substrate 101 by, e.g., a CVD method at 800° C. to 900° C. During deposition of the silicon oxide film 132, the silicon oxide film 132 covers the top of the second trench 133. As a result, a void region 103 is formed in the silicon oxide film 132 in the first trench T3 formed in the element isolation formation region that is adjacent to each transistor region in the channel length direction. In this modification, the width of the second trench 133 needs to be determined so that the void region 103 is formed. After the silicon oxide film 132 is formed, an annealing process is conducted as required at e.g., about 900° C. to about 1,000° C.

A thermal expansion coefficient of the silicon oxide film 132 is different from that of silicon that forms the semiconductor substrate 101. Therefore, compressive stress is generated when the semiconductor substrate 101 is cooled to room temperature after deposition of the silicon oxide film 132 at a high temperature. However, in the case where heat treatment is conducted after deposition of the silicon oxide film 132, compressive stress of the silicon oxide film 132 in the first trench T3 is released toward the void region 103. Therefore, when the semiconductor substrate 101 is cooled to room temperature, tensile stress is applied from the element isolation region to the transistor region located near the first trench T3.

Figure 6I:
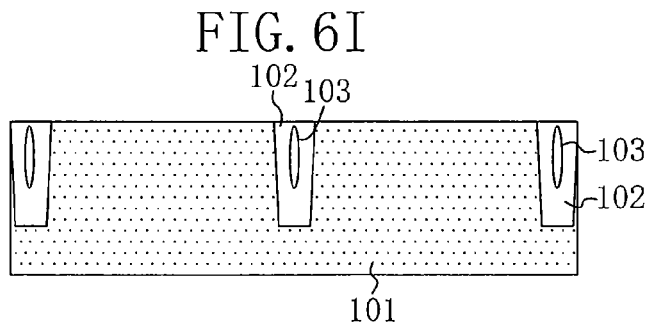
Figure 6J:
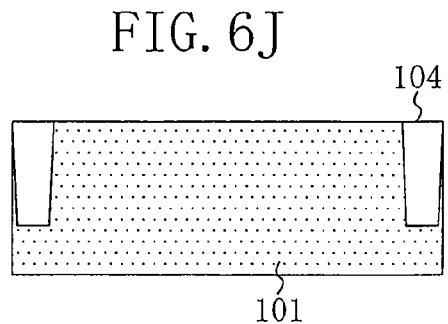

As shown in FIGS. 6I and 6J, after the silicon oxide film 132 is formed on the semiconductor substrate 101, the surface of the semiconductor substrate 101 is planarized so as to expose the substrate surface of the transistor regions. This planarization process is conducted so as not to open the top end of the void region 103. As a result, an element isolation region 102 that is adjacent to each transistor region in the channel length direction and an element isolation region 104 that is adjacent to each transistor region in the channel width direction are formed. The element isolation region 102 has a void region 103 while the element isolation region 104 does not have a void region 103.

Since the subsequent steps are the same as the transistor formation step of the first embodiment shown in FIGS. 3G and 3H and FIGS. 4A through 4H, description thereof will be omitted.

According to the manufacturing method of this modification, by merely adjusting the layout of the trench formation mask, the void region 103, a region that causes tensile stress, can be selectively formed in the element isolation region 102 so that carrier mobility in the NMOS region 105 is improved. In other words, a semiconductor device of the first embodiment having improved transistor driving capability as shown in FIG. 1 and FIGS. 2A and 2B can be easily implemented by the manufacturing method of this modification. Unlike the first embodiment, this modification requires two separate trench formation steps in order to form the void region 103, but does not require formation of, e.g., a region with a smaller element isolation width. Therefore, dimensional restrictions need not be considered in this modification.

In this modification, the void region 103 may alternatively be formed as follows: after the second trench 133 is formed as shown in FIGS. 6E and 6F, the substrate surface is planarized, and the top of the second trench 133 is covered in the subsequent step of depositing an insulating film such as an interlayer film.

Second Embodiment

Hereinafter, a semiconductor device and a manufacturing method thereof according to a second embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <100> orientation (an allowable tolerance from the <100> orientation is about ±10°).

Figure 8A:
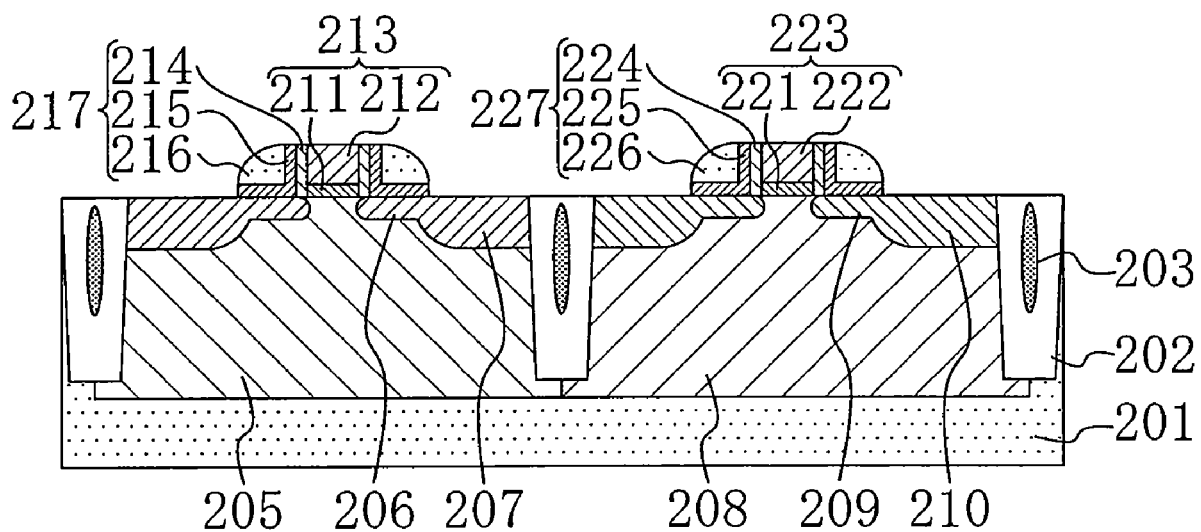
Figure 8B:
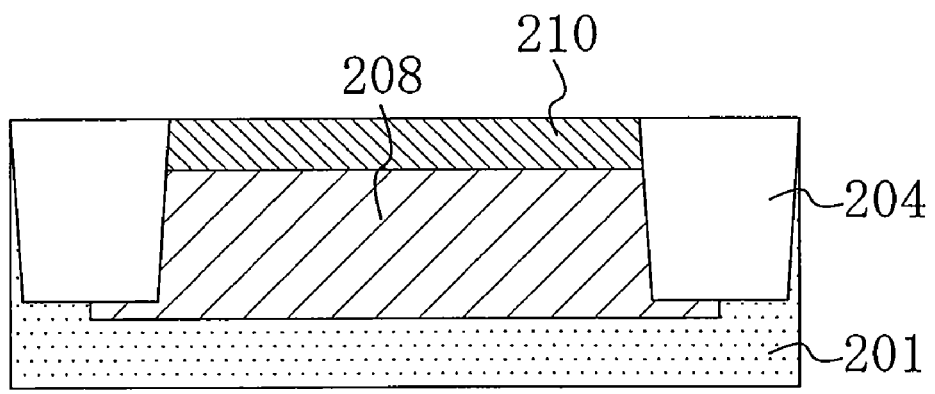

FIG. 7 and FIGS. 8A and 8B show the structure of a semiconductor device according to the second embodiment of the invention. FIG. 7 is a plan view, FIG. 8A is a cross-sectional view taken along line A-A' of FIG. 7, and FIG. 8B is a cross-sectional view taken along line B-B' of FIG. 7.

As shown in FIG. 7 and FIGS. 8A and 8B, an NMOS region (active region) 205 including a p-type well is formed in a first region of a semiconductor substrate 201. The first region is a region defined by element isolation regions 202 and 204. The semiconductor substrate 201 is formed from, e.g., silicon. The element isolation region 202 is located adjacent to the NMOS region 205 in a channel length direction and the element isolation region 204 is located adjacent to the NMOS region 205 in a channel width direction. A gate insulating film 211 and a gate electrode 212 are sequentially formed on the NMOS region 205. The gate insulating film 211 and the gate electrode 212 form a gate portion 213. An insulating sidewall spacer 217 is formed on the side wall of the gate portion 213. The sidewall spacer 217 is formed from, e.g., an I-shaped (plate-like) offset spacer 214, an L-shaped oxide film 215, and a SiN film 216. The I-shaped offset spacer 214 is formed from an oxide film and is in contact with the side wall of the gate portion 213. The L-shaped oxide film 215 covers the side surface of the offset spacer 214. The SiN film 216 covers the side surface and the bottom surface of the L-shaped oxide film 215. An n-type extension diffusion layer 206 and an n-type source/drain diffusion layer 207 are formed on both sides of the gate portion 213 in the NMOS region 205 in the same manner as that shown in the first embodiment. The n-type extension diffusion layer 206 is an impurity diffusion layer formed by implantation of n-type impurity ions such as arsenic. The n-type source/drain diffusion layer 207 has a deeper junction depth than that of the n-type extension diffusion layer 206.

As shown in FIG. 7 and FIGS. 8A and 8B, a PMOS region (active region) 208 including an n-type well is formed in a second region of the semiconductor substrate 201. The second region is a region defined by the element isolation regions 202 and 204. The PMOS region 208 is located next to the NMOS region 205 in the channel length direction. The element isolation region 202 is located adjacent to the PMOS region 208 in the channel length direction and the element isolation region 204 is located adjacent to the PMOS region 208 in the channel width direction. A gate insulating film 221 and a gate electrode 222 are sequentially formed on the PMOS region 208. The gate insulating film 221 and the gate electrode 222 form a gate portion 223. An insulating sidewall spacer 227 is formed on the side wall of the gate portion 223. The sidewall spacer 227 is formed from, e.g., an I-shaped (plate-like) offset spacer 224, an L-shaped oxide film 225, and a SiN film 226. The I-shaped offset spacer 224 is formed from an oxide film and is in contact with the side wall of the gate portion 223. The L-shaped oxide film 225 covers the side surface of the offset spacer 224. The SiN film 226 covers the side surface and the bottom surface of the L-shaped oxide film 225. A p-type extension diffusion layer 209 and a p-type source/drain diffusion layer 210 are formed on both sides of the gate portion 223 in the PMOS region 208 in the same manner as that shown in the first embodiment. The p-type extension diffusion layer 209 is an impurity diffusion layer formed by implantation of p-type impurity ions such as boron. The p-type source/drain diffusion layer 210 has a deeper junction depth than that of the p-type extension diffusion layer 209.

This embodiment is characterized in that, as shown in FIG. 7 and FIG. 8A, a lower Young's modulus material region 203 is formed in the element isolation region 202 that is adjacent to the NMOS region 205 in the channel length direction. The lower Young's modulus material region 203 is a region that is formed from a material having a lower Young's modulus than that of the remaining portion of the element isolation region 202. With this structure, tensile stress can be applied to the NMOS region 205 in the channel length direction in an NMOSFET having a gate length direction of <100> orientation. No lower Young's modulus material region is formed in the element isolation region 204 that is adjacent to the NMOS region 205 in the channel width direction (the gate width direction). Therefore, compressive stress can be applied to the NMOS region 205 in the channel width direction. As a result, carrier mobility (electron mobility) of the NMOSFET can be improved, whereby driving capability of the NMOSFET can be reliably improved.

When the lower Young's modulus material region 203 is formed in the element isolation region 202 as in this embodiment, the element isolation region 202 contracts less than the case where the void region is formed. However, if overetching occurs during an etching process in the transistor formation step, etching of the element isolation region 202 proceeds at a lower rate than that in the case where the void region is formed.

It should be noted that the above effect can be obtained even when the volume ratio of the lower Young's modulus material region 203 to the element isolation region 202 is 1%. However, this volume ratio is preferably 30% or less in order to prevent reduction in strength.

In this embodiment, the lower Young's modulus material region 203 is formed in the element isolation region 202 that divides the NMOS region 205 and the PMOS region 208 and in the element isolation region 202 that is adjacent to the PMOS region 208 in the channel length direction on the opposite side of the NMOS region 205. However, in a PMOS-FET having a gate length direction of <100> orientation, carrier mobility (hole mobility) of the PMOSFET is hardly changed by tensile stress that is applied in the channel length direction by the lower Young's modulus material region 203 and compressive stress that is applied in the channel width direction by the element isolation region 204 having no lower Young's modulus material region 203.

FIG. 7 shows that the sidewall spacers 217 and 227 are respectively formed on the side walls of the gate portions 213 and 223 which face the channel length direction. However, the sidewall spacers 217 and 227 may also be formed on the end faces of the gate portions 213 and 223 which face the channel width direction, respectively.

Hereinafter, a method for manufacturing a semiconductor device according to the second embodiment of the invention will be described.

Figure 9A:
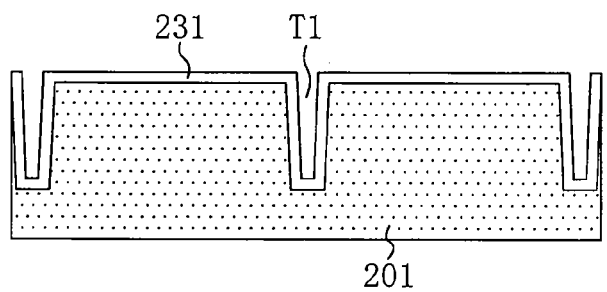
FIGS. 9A, 9B, 9C, 9D, 9E, and 9F are cross-sectional views illustrating the steps of a method for manufacturing a semiconductor device according to the second embodiment of the invention.
Figure 9B:
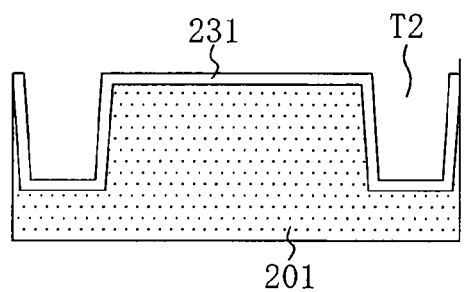
Figure 9C:
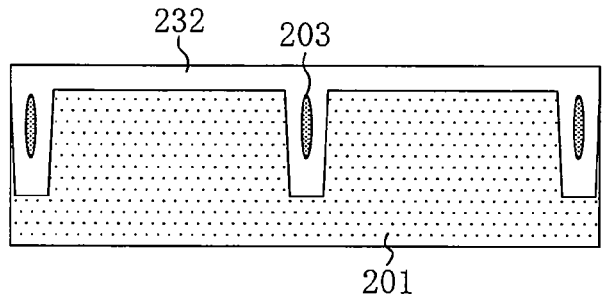

FIGS. 9A through 9F sequentially illustrate in cross section the steps of the method for manufacturing a semiconductor device according to the second embodiment of the invention. FIGS. 9A, 9C, and 3E show cross-sectional structures taken along line A-A' of FIG. 7, and FIGS. 9B, 9D, and 9F show cross-sectional structures taken along line B-B' of FIG. 7.

As shown in FIGS. 9A and 9B, a trench etching process is conducted in an element isolation formation region of the semiconductor substrate 201 by using, e.g., a resist mask (not shown). The resist mask layout is determined so that the width of a trench T1 becomes narrower than that of a trench T2. The trench T1 is a trench that is formed in an element isolation formation region that is adjacent to each transistor region (each region to be an active region) in the semiconductor substrate 201 in the channel length direction. The trench T2 is a trench that is formed in an element isolation formation region that is adjacent to each transistor region in the channel width direction. For example, the width of the trench T1 is 80 nm and the width of the trench T2 is 120 nm. The whole surface of the semiconductor substrate 201 including the side walls of the trenches T1 and T2 is then thermally oxidized to form a silicon oxide film 231 that covers the side walls of the trenches T1 and T2.

Figure 9D:
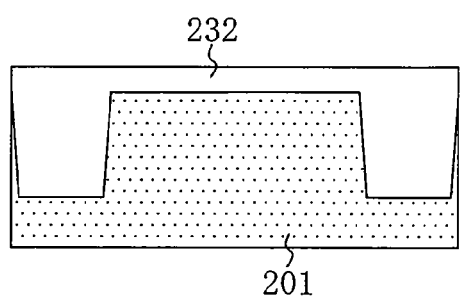

As shown in FIGS. 9C and 9D, a silicon oxide film 232 having a thickness of 100 nm to 150 nm is then formed on the semiconductor substrate 201 by, e.g., a CVD method at 500° C. or less. The trenches T1 and T2 are thus filled with the silicon oxide film 232 (in FIGS. 9C and 9D, the silicon oxide film 231 and the silicon oxide film 232 are collectively shown as the silicon oxide film 232). As described above, the trench T1 formed in the element isolation formation region that is adjacent to each transistor region in the channel length direction has a narrower width. Therefore, during deposition of the silicon oxide film 232, the width at the top of the trench T1 becomes narrower than the width at the top of the trench T2. As a result, a gas flow rate into the trench T1 is reduced. In other words, introduction of a deposition species into the trench T1 is suppressed. Therefore, a lower Young's modulus material region 203 (a region that is formed from a material having a sparser composition and a lower Young's modulus than the silicon oxide film 232) is formed in the silicon oxide film 232 in the trench T1. After the silicon oxide film 232 is formed, an annealing process is conducted as required at e.g., about 900° C. to about 1,000° C.

A thermal expansion coefficient of the silicon oxide film 232 is different from that of silicon that forms the semiconductor substrate 201. Therefore, compressive stress is generated when the semiconductor substrate 201 is cooled to room temperature after deposition of the silicon oxide film 232 at a high temperature. However, in the case where heat treatment is conducted after deposition of the silicon oxide film 232, compressive stress of the silicon oxide film 232 in the trench T1 is released toward the lower Young's modulus material region 203. Therefore, tensile stress is applied from the element isolation region to the transistor region located near the trench T1 when the semiconductor substrate 201 is cooled to room temperature.

Figure 9E:
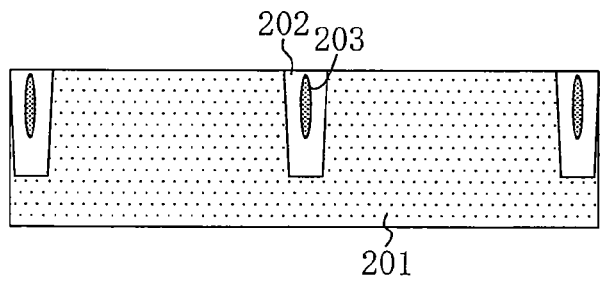
Figure 9F:
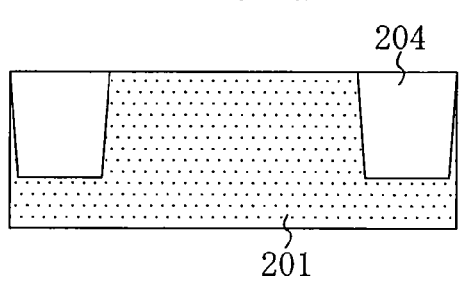

As shown in FIGS. 9E and 9F, after the silicon oxide film 232 is formed on the semiconductor substrate 201, the surface of the semiconductor substrate 201 is planarized so as to expose the substrate surface of the transistor regions. This planarization process is conducted so as not to open the top end of the lower Young's modulus material region 203. As a result, an element isolation region 202 that is adjacent to each transistor region in the channel length direction and an element isolation region 204 that is adjacent to each transistor region in the channel width direction are formed. The element isolation region 202 has a lower Young's modulus material region 203 while the element isolation region 204 does not have a lower Young's modulus material region 203.

Since the subsequent steps are the same as the transistor formation step of the first embodiment shown in FIGS. 3G and 3H and FIGS. 4A through 4H, description thereof will be omitted.

According to the manufacturing method of this embodiment, by merely adjusting the layout of the trench formation mask, the lower Young's modulus material region 203, a region that causes tensile stress, can be selectively formed in the element isolation region 202 so that carrier mobility in the NMOS region 205 is improved. In other words, a semiconductor device of this embodiment having improved transistor driving capability as shown in FIG. 7 and FIGS. 8A and 8B can be easily implemented by the manufacturing method of this embodiment.

In this embodiment, as shown in FIGS. 9C and 9D, a trench T1 having a narrower width is formed in the element isolation formation region that is adjacent to each transistor region in the channel length direction, and a lower Young's modulus material region 203 is thus formed in the silicon oxide film 232 in the trench T1, that is, in the element isolation region 202. Alternatively, however, the width of the trench T1 (to be exact, the width at the top of the trench T1) may be the same as the width of the trench T2 (to be exact, the width at the top of the trench T2) which is formed in the element isolation formation region that is adjacent to each transistor region in the channel width direction. In this case, the sidewall taper angle of the trench T1 (an angle of the side wall of the trench T1 to the vertical direction) is made smaller than the sidewall taper angle of the trench T2. By using the difference in sidewall taper angle between the trenches T1 and T2, a lower Young's modulus material region 203 is formed in the silicon oxide film 232 in the trench T1, that is, in the element isolation region 202 (see FIGS. 5A and 5B). In this alternative example, the same effects as those of this embodiment can be obtained. Unlike this embodiment, this alternative example requires two separate trench formation steps, but does not require formation of, e.g., a region with a smaller element isolation width. Therefore, dimensional restrictions need not be considered in this alternative example.

Third Embodiment

Hereinafter, a semiconductor device and a manufacturing method thereof according to a third embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <100> orientation (an allowable tolerance from the <100> orientation is about ±10°).

Figure 10:
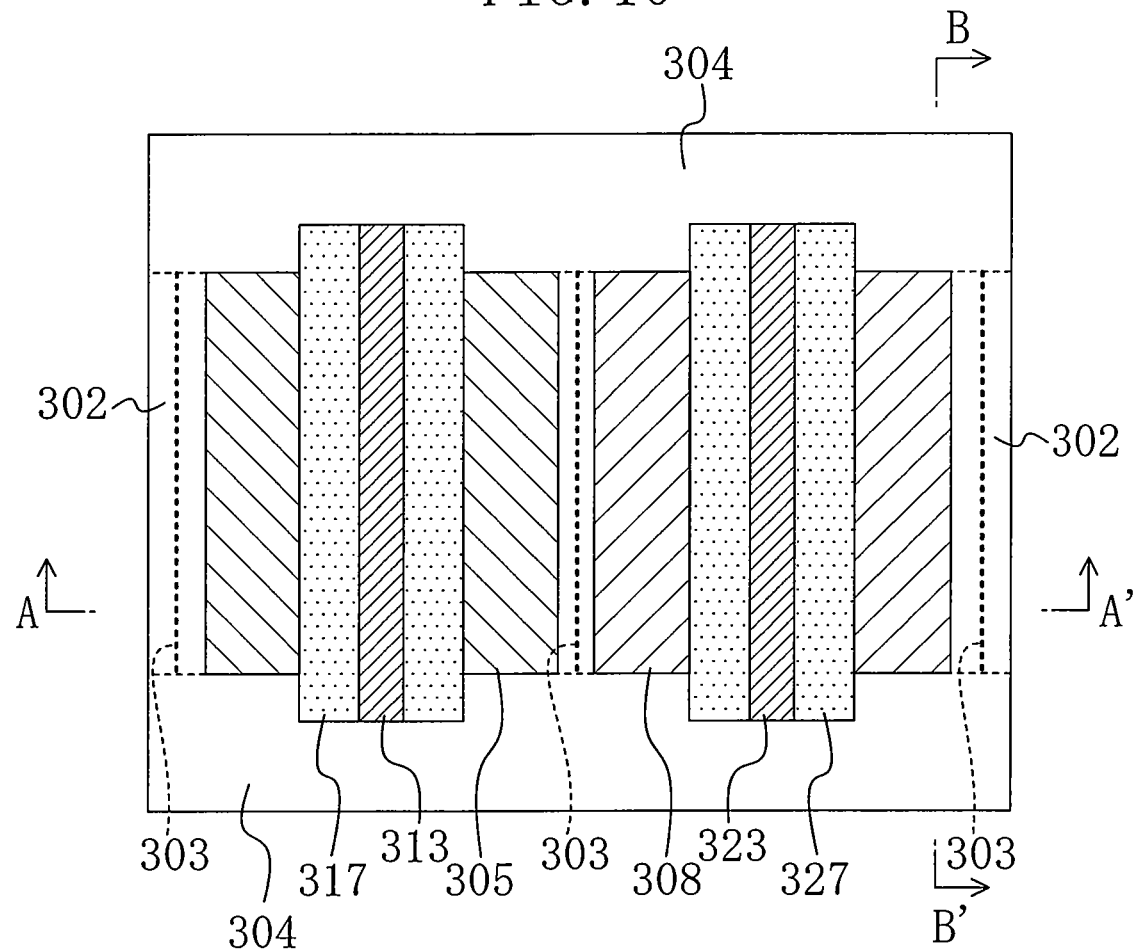
FIG. 10 is a plan view showing a main part of the structure of a semiconductor device according to a third embodiment of the invention.
Figure 11A:
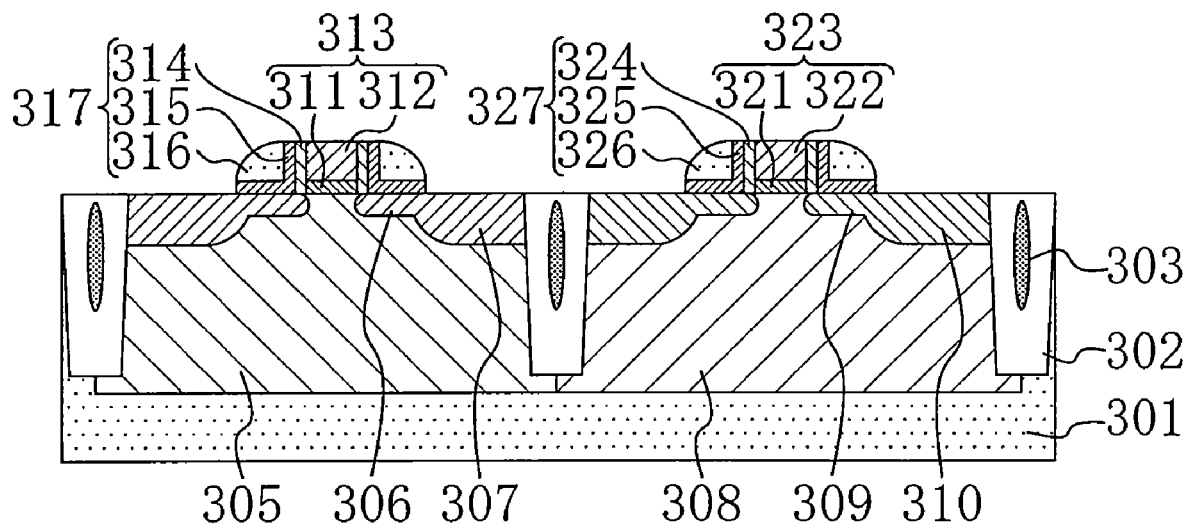
Figure 11B:
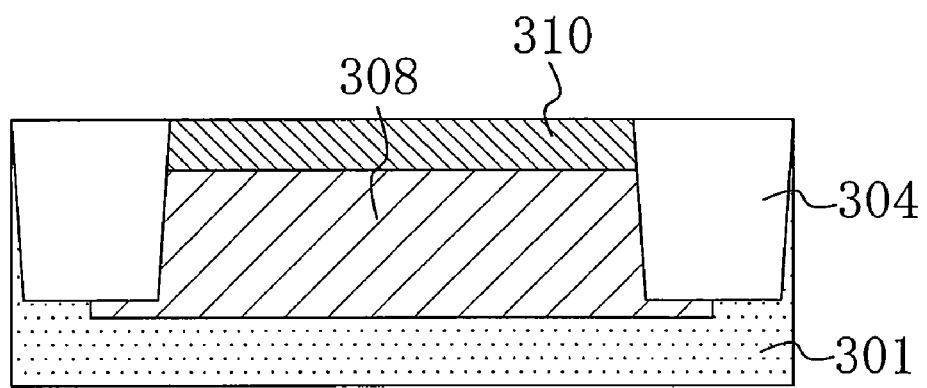

FIG. 10 and FIGS. 11A and 11B show the structure of a semiconductor device according to the third embodiment of the invention. FIG. 10 is a plan view, FIG. 11A is a cross-sectional view taken along line A-A' of FIG. 10, and FIG. 11B is a cross-sectional view taken along line B-B' of FIG. 10.

As shown in FIG. 10 and FIGS. 11A and 11B, an NMOS region (active region) 305 including a p-type well is formed in a first region of a semiconductor substrate 301. The first region is a region defined by element isolation regions 302 and 304. The semiconductor substrate 301 is formed from, e.g., silicon. The element isolation region 302 is located adjacent to the NMOS region 305 in a channel length direction and the element isolation region 304 is located adjacent to the NMOS region 305 in a channel width direction. A gate insulating film 311 and a gate electrode 312 are sequentially formed on the NMOS region 305. The gate insulating film 311 and the gate electrode 312 form a gate portion 313. An insulating sidewall spacer 317 is formed on the side wall of the gate portion 313. The sidewall spacer 317 is formed from, e.g., an I-shaped (plate-like) offset spacer 314, an L-shaped oxide film 315, and a SiN film 316. The I-shaped offset spacer 314 is formed from an oxide film and is in contact with the sidewall of the gate portion 313. The L-shaped oxide film 315 covers the side surface of the offset spacer 314. The SiN film 316 covers the side surface and the bottom surface of the L-shaped oxide film 315. An n-type extension diffusion layer 306 and an n-type source/drain diffusion layer 307 are formed on both sides of the gate portion 313 in the NMOS region 305 in the same manner as that shown in the first embodiment. The n-type extension diffusion layer 306 is an impurity diffusion layer formed by implantation of n-type impurity ions such as arsenic. The n-type source/drain diffusion layer 307 has a deeper junction depth than that of the n-type extension diffusion layer 306.

Figure 12A:
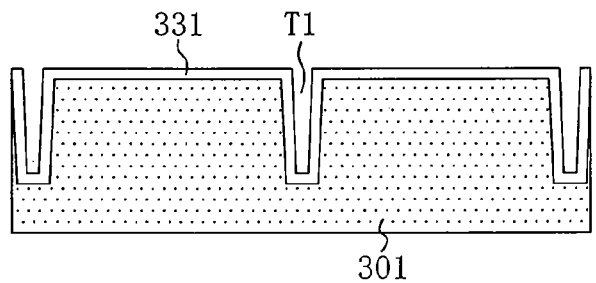
FIGS. 12A, 12B, 12C, 12D, 12E, 12F, 12G, and 12H are cross-sectional views illustrating the steps of a method for manufacturing a semiconductor device according to the third embodiment of the invention.
Figure 12B:
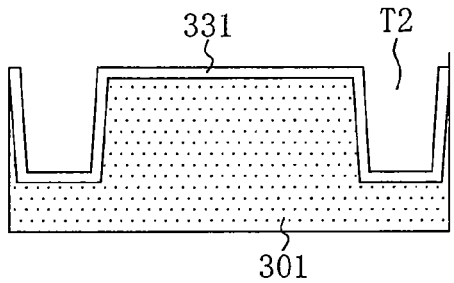

As shown in FIG. 10 and FIGS. 11A and 12B, a PMOS region (active region) 308 including an n-type well is formed in a second region of the semiconductor substrate 301. The second region is a region defined by the element isolation regions 302 and 304. The PMOS region 308 is located next to the NMOS region 305 in the channel length direction. The element isolation region 302 is located adjacent to the PMOS region 308 in the channel length direction and the element isolation region 304 is located adjacent to the PMOS region 308 in the channel width direction. A gate insulating film 321 and a gate electrode 322 are sequentially formed on the PMOS region 308. The gate insulating film 321 and the gate electrode 322 form a gate portion 323. An insulating sidewall spacer 327 is formed on the side wall of the gate portion 323. The sidewall spacer 327 is formed from, e.g., an I-shaped (plate-like) offset spacer 324, an L-shaped oxide film 325, and a SiN film 326. The I-shaped offset spacer 324 is formed from an oxide film and is in contact with the side wall of the gate portion 323. The L-shaped oxide film 325 covers the side surface of the offset spacer 324. The SiN film 326 covers the side surface and the bottom surface of the L-shaped oxide film 325. A p-type extension diffusion layer 309 and a p-type source/drain diffusion layer 310 are formed on both sides of the gate portion 323 in the PMOS region 308 in the same manner as that shown in the first embodiment. The p-type extension diffusion layer 309 is an impurity diffusion layer formed by implantation of p-type impurity ions such as boron. The p-type source/drain diffusion layer 310 has a deeper junction depth than that of the p-type extension diffusion layer 309.

This embodiment is characterized in that, as shown in FIG. 10 and FIG. 11A, a lower Young's modulus material region 303 is formed in the element isolation region 302 that is adjacent to the NMOS region 305 in the channel length direction. The lower Young's modulus material region 303 is a region that is formed from a material having a lower Young's modulus than that of the remaining portion of the element isolation region 202. With this structure, tensile stress can be applied to the NMOS region 305 in the channel length direction in an NMOSFET having a gate length direction of <100> orientation. No lower Young's modulus material region is formed in the element isolation region 304 that is adjacent to the NMOS region 305 in the channel width direction (the gate width direction). Therefore, compressive stress can be applied to the NMOS region 305 in the channel width direction. As a result, carrier mobility (electron mobility) of the NMOSFET can be improved, whereby driving capability of the NMOSFET can be reliably improved.

When the lower Young's modulus material region 303 is formed in the element isolation region 302 as in this embodiment, the element isolation region 302 contracts less than the case where the void region is formed. However, if overetching occurs during an etching process in the transistor formation step, etching of the element isolation region 302 proceeds at a lower rate than that in the case where the void region is formed.

It should be noted that the above effect can be obtained even when the volume ratio of the lower Young's modulus material region 303 to the element isolation region 302 is 1%. However, this volume ratio is preferably 30% or less in order to prevent reduction in strength.

In this embodiment, the lower Young's modulus material region 303 is formed in the element isolation region 302 that divides the NMOS region 305 and the PMOS region 308 and in the element isolation region 302 that is adjacent to the PMOS region 308 in the channel length direction on the opposite side of the NMOS region 305. However, in a PMOSFET having a gate length direction of <100> orientation, carrier mobility (hole mobility) of the PMOSFET is hardly changed by tensile stress that is applied in the channel length direction by the lower Young's modulus material region 303 and compressive stress that is applied in the channel width direction by the element isolation region 304 having no lower Young's modulus material region 303.

FIG. 10 shows that the sidewall spacers 317 and 327 are respectively formed on the side walls of the gate portions 313 and 323 which face the channel length direction. However, the sidewall spacers 317 and 327 may also be formed on the end faces of the gate portions 313 and 323 which face the channel width direction, respectively.

Hereinafter, a method for manufacturing a semiconductor device according to the third embodiment of the invention will be described.

FIGS. 12A through 12H and FIGS. 13A and 13B sequentially illustrate in cross section the steps of the method for manufacturing a semiconductor device according to the third embodiment of the invention. FIGS. 12A, 12C, 12E, and 12G and FIG. 13A show cross-sectional structures taken along line A-A' of FIG. 10, and FIGS. 12B, 12D, 12F, and 12H and FIG. 13B show cross-sectional structures taken along line B-B' of FIG. 10.

As shown in FIGS. 12A and 12B, a trench etching process is conducted in an element isolation formation region of the semiconductor substrate 301 by using, e.g., a resist mask (not shown). The resist mask layout is determined so that the width of a trench T1 becomes narrower than that of a trench T2. The trench T1 is a trench that is formed in an element isolation formation region that is adjacent to each transistor region (each region to be an active region) in the semiconductor substrate 301 in the channel length direction. The trench T2 is a trench that is formed in an element isolation formation region that is adjacent to each transistor region in the channel width direction. For example, the width of the trench T1 is 80 nm and the width of the trench T2 is 120 nm. The whole surface of the semiconductor substrate 301 including the side walls of the trenches T1 and T2 is then thermally oxidized to form a silicon oxide film 331 that covers the side walls of the trenches T1 and T2.

Figure 12C:
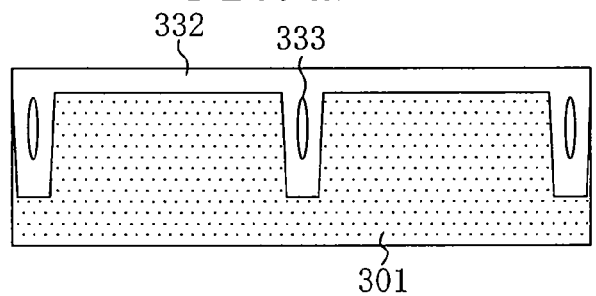
Figure 12D:
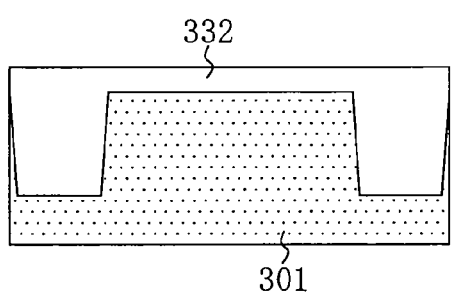

As shown in FIGS. 12C and 12D, a silicon oxide film 332 having a thickness of 100 nm to 150 nm is then formed on the semiconductor substrate 301 by, e.g., a CVD method at 800° C. to 900° C. The trenches T1 and T2 are thus filled with the silicon oxide film 332 (in FIGS. 12C and 12D, the silicon oxide film 331 and the silicon oxide film 332 are collectively shown as the silicon oxide film 332). As described above, the trench T1 formed in the element isolation formation region that is adjacent to each transistor region in the channel length direction has a narrower width. Therefore, during deposition of the silicon oxide film 332, the silicon oxide film 332 covers the top of the trench T1 before completely filling the trench T1, forming a void region 333.

Figure 12E:
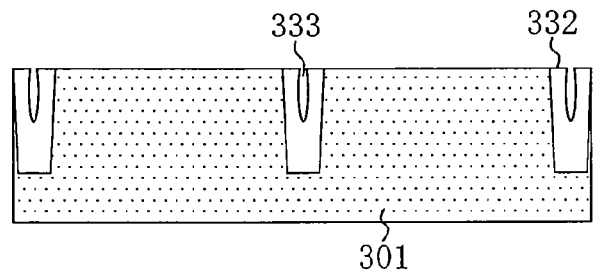
Figure 12F:
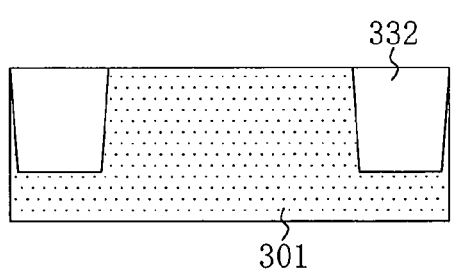

As shown in FIGS. 12E and 12F, after the silicon oxide film 332 is deposited on the semiconductor substrate 301, the surface of the semiconductor substrate 301 is planarized so as to open the top end of the void region 333. In this planarization process, an etching process may be conducted as required so as to selectively reduce the thickness of the silicon oxide film 332 in the trench T1.

Figure 12G:
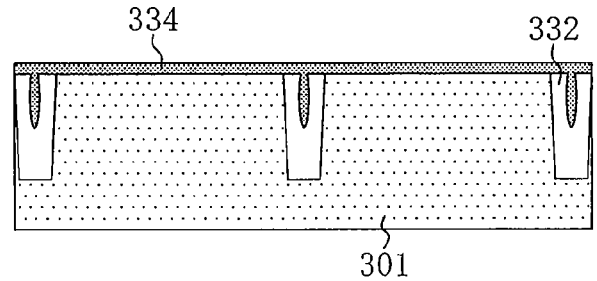
Figure 12H:
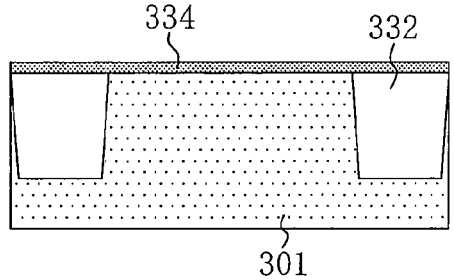

As shown in FIGS. 12G and 12H, a silicon oxide film 334 as a lower Young's modulus material is deposited with a thickness of, e.g., 5 nm to 20 nm on the whole surface of the semiconductor substrate 301 so as to fill the open void region 333. This deposition of the silicon oxide film 334 is conducted by, e.g., a CVD method at 500° C. or less in a gas atmosphere with a reduced oxygen composition. This silicon oxide film 334 has a lower Young's modulus and a lower density than the silicon oxide film 332.

Figure 13A:
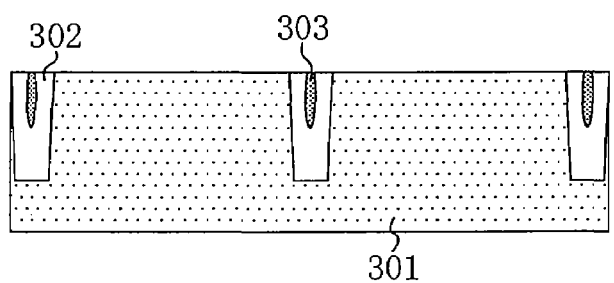
FIGS. 13A and 13B are cross-sectional views illustrating a step of the method for manufacturing a semiconductor device according to the third embodiment of the invention.
Figure 13B:
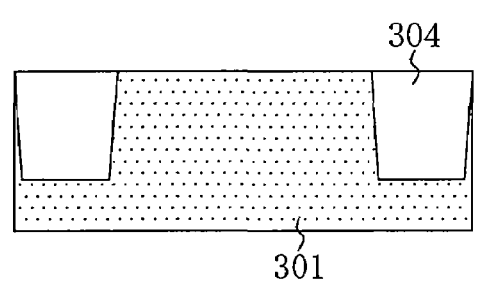

As shown in FIGS. 13A and 13B, after the silicon oxide film 334 is deposited on the semiconductor substrate 301, the surface of the semiconductor substrate 301 is planarized so as to expose the substrate surface of the transistor regions. As a result, an element isolation region 302 that is adjacent to each transistor region in the channel length direction and an element isolation region 304 that is adjacent to each transistor region in the channel width direction are formed. The element isolation region 302 has a lower Young's modulus material region 303 (a region that is formed from the silicon oxide film 334 having a sparser composition and a lower Young's modulus than the silicon oxide film 332) while the element isolation region 304 does not have a lower Young's modulus material region 303.

Since the subsequent steps are the same as the transistor formation step of the first embodiment shown in FIGS. 3G and 3H and FIGS. 4A through 4H, detailed description thereof will be omitted. In the step of depositing an insulating film such as an interlayer film after the transistor formation step, the lower Young's modulus material region 303 in the element isolation region 302 may be covered with an insulating film, and an annealing process may be subsequently conducted as required at, e.g., about 900° C. to about 1,000° C.

A thermal expansion coefficient of the silicon oxide film 332 as the element isolation region 302 is different from that of silicon that forms the semiconductor substrate 301. Therefore, compressive stress is generated when the semiconductor substrate 301 is cooled to room temperature after deposition of the silicon oxide film 332 at a high temperature. However, in the case where heat treatment is conducted after deposition of the silicon oxide film 332, compressive stress of the silicon oxide film 332 in the trench T1 is released toward the lower Young's modulus material region 303. Therefore, tensile stress is applied from the element isolation region to the transistor region located near the trench T1 when the semiconductor substrate 301 is cooled to room temperature.

According to the manufacturing method of this embodiment, by merely adjusting the layout of the trench formation mask, the lower Young's modulus material region 303, a region that causes tensile stress, can be selectively formed in the element isolation region 302 so that carrier mobility in the NMOS region 305 is improved. In other words, a semiconductor device of this embodiment having improved transistor driving capability as shown in FIG. 10 and FIGS. 11A and 11B can be easily implemented by the manufacturing method of this embodiment.

In this embodiment, as shown in FIGS. 12C and 12D, a trench T1 having a narrower width is formed in the element isolation formation region that is adjacent to each transistor region in the channel length direction, and a void region 303 is thus formed in the silicon oxide film 332 in the trench T1. Alternatively, however, the width of the trench T1 (to be exact, the width at the top of the trench T1) may be the same as the width of the trench T2 (to be exact, the width at the top of the trench T2) which is formed in the element isolation formation region that is adjacent to each transistor region in the channel width direction. In this case, the sidewall taper angle of the trench T1 (an angle of the side wall of the trench T1 to the vertical direction) is made smaller than the sidewall taper angle of the trench T2. By using the difference in sidewall taper angle between the trenches T1 and T2, a void region 303 is formed in the silicon oxide film 332 in the trench T1 (see FIGS. 5A and 5B). In this alternative example, the same effects as those of this embodiment can be obtained. Unlike this embodiment, this alternative example requires two separate trench formation steps, but does not require formation of, e.g., a region with a smaller element isolation width. Therefore, dimensional restrictions need not be considered in this alternative example.

In this embodiment, the silicon oxide film 334 having a sparser composition and a lower Young's modulus than a normal silicon oxide film is used as a lower Young's modulus material. However, another material having a lower Young's modulus than that of a normal silicon oxide film may alternatively be used. In the second embodiment, only a silicon oxide film having a lower Young's modulus than that of a normal silicon oxide film can be used as a lower Young's modulus material. In this embodiment, however, a lower Young's material other than a silicon oxide film can be used. Especially when a material having an etching selectivity to a silicon oxide film is used as a lower Young's modulus material, damage to the lower Young's modulus material region 303 can be prevented in the step of etching an insulating film after formation of the element isolation region.

First Modification of the Third Embodiment

Hereinafter, a method for manufacturing a semiconductor device according to a first modification of the third embodiment of the invention will be described.

Figure 14A:
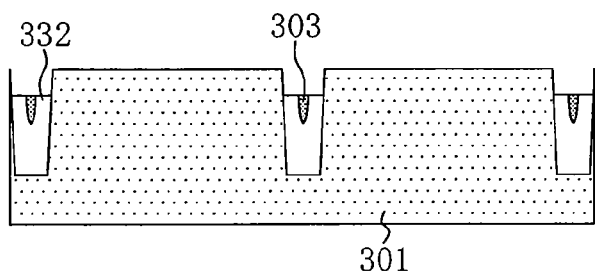
FIGS. 14A, 14B, 14C, 14D, 14E, and 14F are cross-sectional views illustrating the steps of a method for manufacturing a semiconductor device according to a first modification of the third embodiment of the invention.
Figure 14B:
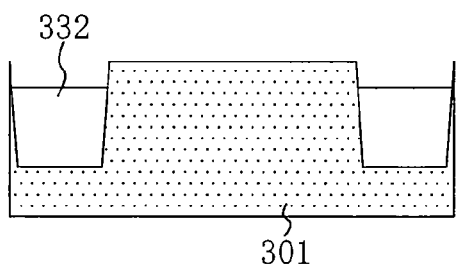
Figure 14C:
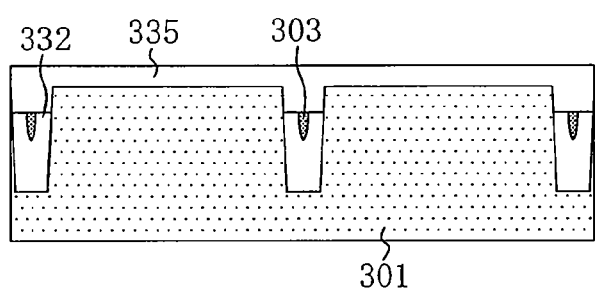
Figure 14D:
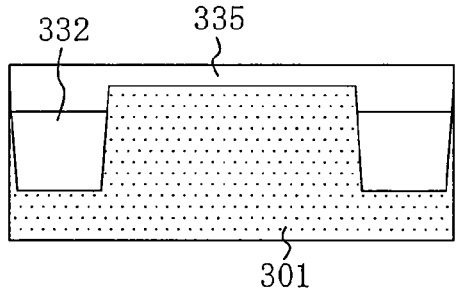
Figure 14E:
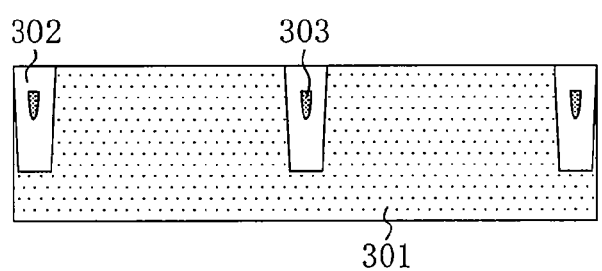

FIGS. 14A through 14F sequentially illustrate in cross section the steps of the method for manufacturing a semiconductor device according to the first modification of the third embodiment. FIGS. 14A, 14C, and 14E show cross-sectional structures taken along line A-A' of FIG. 10, and FIGS. 14B, 14D, and 14F show cross-sectional structures taken along line B-B' of FIG. 10.

The steps of the manufacturing method of the third embodiment as shown in FIGS. 12A through 12H are first conducted in the first modification of the third embodiment.

As shown in FIGS. 14A and 14B, the silicon oxide film 334 on the semiconductor substrate 301 and the silicon oxide film 332 in the trenches T1 and T2 are sequentially etched. Etching conditions are determined so that a sufficient amount of the silicon oxide film 334 in the void region 333 remains in the trench T1 as the lower Young's modulus material region 303. As a result, the top surface of the silicon oxide film 332 and the lower Young's modulus material region 303 in the trench T1 and the top surface of the silicon oxide film 332 in the trench T2 become lower than the top surface of each transistor region.

As shown in FIGS. 14C and 14D, a silicon oxide film 335 is then deposited with a thickness of 50 nm to 100 nm on the whole surface of the semiconductor substrate 301. The silicon oxide film 335 is deposited so as to completely fill the trenches T1 and T2, that is, so as to completely cover the lower Young's modulus material region 303. This deposition of the silicon oxide film 335 is conducted by, e.g., a CVD method at 800° C. to 900° C. Thereafter, an annealing process is conducted as required at, e.g., about 900° C. to about 1,000° C.

A thermal expansion coefficient of the silicon oxide films 332 and 335 of the element isolation region 302 is different from that of silicon that forms the semiconductor substrate 301. Therefore, compressive stress is generated when the semiconductor substrate 301 is cooled to room temperature after deposition of the silicon oxide films 332 and 335 at a high temperature. However, in the case where heat treatment is conducted after deposition of the silicon oxide films 332 and 335, compressive stress of the silicon oxide films 332 and 335 in the trench T1 is released toward the lower Young's modulus material region 303. Therefore, tensile stress is applied from the element isolation region to the transistor region located near the trench T1 when the semiconductor substrate 301 is cooled to room temperature.

Figure 14F:
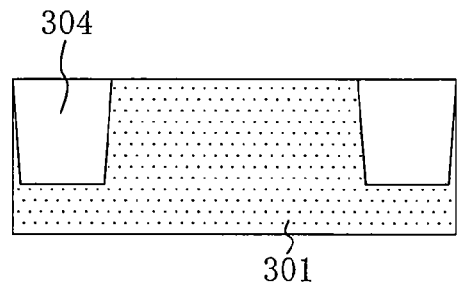

As shown in FIGS. 14E and 14F, after the silicon oxide film 335 is formed on the semiconductor substrate 301, the surface of the semiconductor substrate 301 is planarized so as to expose the substrate surface of the transistor regions. As a result, an element isolation region 302 that is adjacent to each transistor region in the channel length direction and an element isolation region 304 that is adjacent to each transistor region in the channel width direction are formed. The element isolation region 302 has a lower Young's modulus material region 303 while the element isolation region 304 does not have a lower Young's modulus material region 303.

Since the subsequent steps are the same as the transistor formation step of the first embodiment shown in FIGS. 3G and 3H and FIGS. 4A through 4H, detailed description thereof will be omitted.

According to the manufacturing method of the first modification of the third embodiment, by merely adjusting the layout of the trench formation mask, the lower Young's modulus material region 303, a region that causes tensile stress, can be selectively formed in the element isolation region 302 so that carrier mobility in the NMOS region 305 is improved. In other words, a semiconductor device of the third embodiment having improved transistor driving capability as shown in FIG. 10 and FIGS. 11A and 11B can be easily implemented by the manufacturing method of the first modification of the third embodiment. In the manufacturing method of the first modification of the third embodiment, the lower Young's modulus material region 303 is covered with the silicon oxide film 335 before the transistor formation step is conducted. Therefore, by heat treatment after deposition of the silicon oxide film 335, compressive stress of the silicon oxide films 332 and 335 can be sufficiently released toward the lower Young's modulus material region 303.

Second Modification of the Third Embodiment

Hereinafter, a method for manufacturing a semiconductor device according to a second modification of the third embodiment of the invention will be described.

FIGS. 15A through 15H and FIGS. 16A and 16B sequentially illustrate in cross section the steps of the method for manufacturing a semiconductor device according to the second modification of the third embodiment. FIGS. 15A, 15C, 15E, and 15G and FIG. 16A show cross-sectional structures taken along line A-A' of FIG. 10, and FIGS. 15B, 15D, 15F, and 15H and FIG. 16B show cross-sectional structures taken along line B-B' of FIG. 10.

Figure 15A:
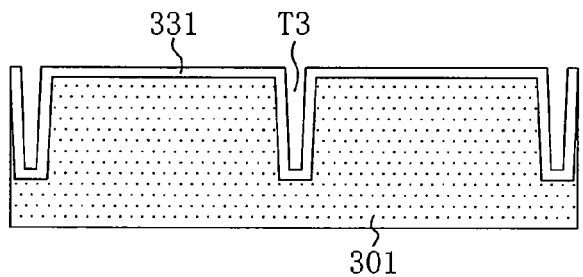
FIGS. 15A, 15B, 15C, 15D, 15E, 15F, 15G, and 15H are cross-sectional views illustrating the steps of a method for manufacturing a semiconductor device according to a second modification of the third embodiment of the invention.
Figure 15B:
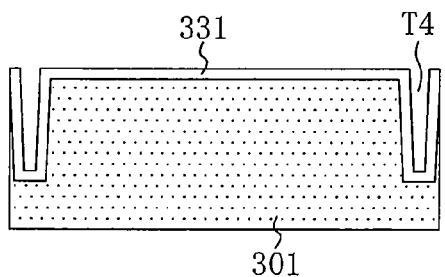

As shown in FIGS. 15A and 15B, first trenches T3 and T4 are formed in the element isolation formation region in the semiconductor substrate 301 by a trench etching process using, e.g., a resist mask (not shown). The first trench T3 is formed in the element isolation formation region that is adjacent to each transistor region in the channel length direction, and the first trench T4 is formed in the element isolation formation region that is adjacent to each transistor region in the channel width direction. Unlike the third embodiment (see FIGS. 12A and 12B), in the second modification of the third embodiment, the width of the first trench T3 need not be made narrower than that of the first trench T4. For example, the resist mask layout is determined so that the first trenches T3 and T4 have a width of 120 nm. The whole surface of the semiconductor substrate 301 including the side walls of the first trenches T3 and T4 are then thermally oxidized to form a silicon oxide film 331 that covers the side walls of the first trenches T3 and T4.

Figure 15C:
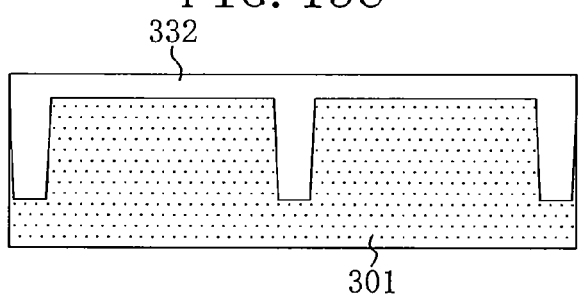
Figure 15D:
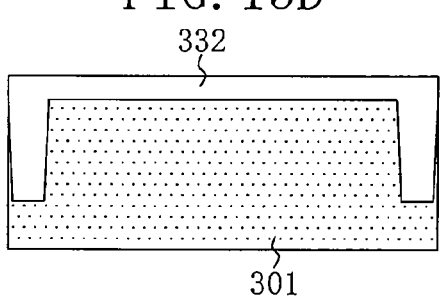

As shown in FIGS. 15C and 15D, a silicon oxide film 332 having a thickness of 100 nm to 150 nm is then formed on the semiconductor substrate 301 by, e.g., a CVD method at 800° C. to 900° C. The first trenches T3 and T4 are thus filled with the silicon oxide film 332 (in FIGS. 15C and 15D, the silicon oxide film 331 and the silicon oxide film 332 are collectively shown as the silicon oxide film 332).

Figure 15E:
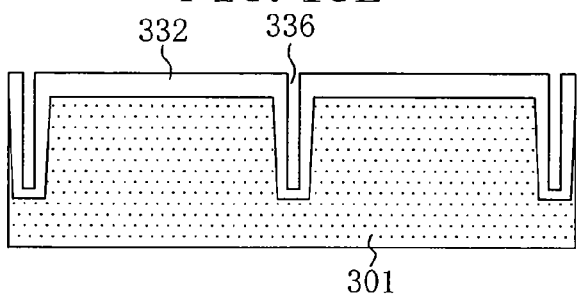
Figure 15F:
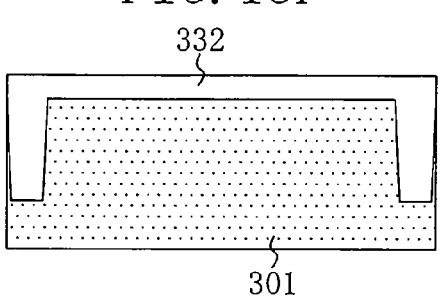

As shown in FIGS. 15E and 15F, the silicon oxide film 332 in the first trench T3 is then patterned by a photolithography method and a dry etching method to form a second trench 336. The width of the second trench 336 is, e.g., 80 nm, and the depth of the second trench 336 is, e.g., about one half to about two thirds of the depth of the first trench T3. In this patterning step, the silicon oxide film 332 in the first trench T4 is not patterned so that the silicon oxide film 332 remains in the first trench T4.

Figure 15G:
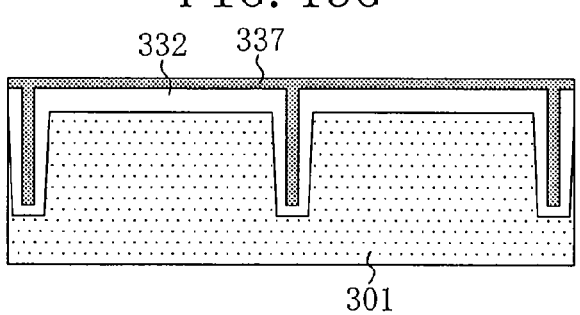
Figure 15H:
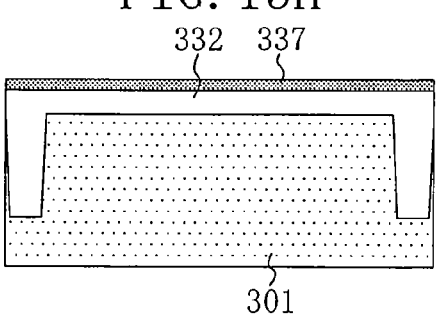

As shown in FIGS. 15G and 15H, a silicon oxide film 337 as a lower Young's modulus material is deposited with a thickness of, e.g., 5 nm to 20 nm on the whole surface of the semiconductor substrate 301 so as to fill the second trench 336. This deposition of the silicon oxide film 337 is conducted by, e.g., a CVD method at 500° C. or less in a gas atmosphere with a reduced oxygen composition. This silicon oxide film 337 has a lower Young's modulus and a lower density than the silicon oxide film 332.

Figure 16A:
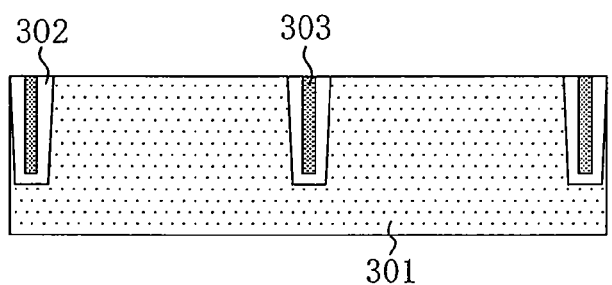
FIGS. 16A and 16B are cross-sectional views illustrating a step of the method for manufacturing a semiconductor device according to the second modification of the third embodiment of the invention.
Figure 16B:
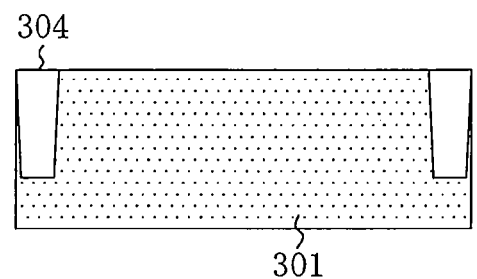

As shown in FIGS. 16A and 16B, after the silicon oxide film 337 is deposited on the semiconductor substrate 301, the surface of the semiconductor substrate 301 is planarized so as to expose the substrate surface of the transistor regions. As a result, an element isolation region 302 that is adjacent to each transistor region in the channel length direction and an element isolation region 304 that is adjacent to each transistor region in the channel width direction are formed. The element isolation region 302 has a lower Young's modulus material region 303 (a region that is formed from the silicon oxide film 337 having a lower Young's modulus) while the element isolation region 304 does not have a lower Young's modulus material region 303.

Since the subsequent steps are the same as the transistor formation step of the first embodiment shown in FIGS. 3G and 3H and FIGS. 4A through 4H, detailed description thereof will be omitted. In the step of depositing an insulating film such as an interlayer film after the transistor formation step, the lower Young's modulus material region 303 in the element isolation region 302 may be covered with an insulating film, and an annealing process may be subsequently conducted as required at, e.g., about 900° C. to about 1,000° C.

A thermal expansion coefficient of the silicon oxide film 332 as the element isolation region 302 is different from that of silicon that forms the semiconductor substrate 301. Therefore, compressive stress is generated when the semiconductor substrate 301 is cooled to room temperature after deposition of the silicon oxide film 332 at a high temperature. However, in the case where heat treatment is conducted after deposition of the silicon oxide film 332, compressive stress of the silicon oxide film 332 in the first trench T3 is released toward the lower Young's modulus material region 303. Therefore, tensile stress is applied from the element isolation region to the transistor region located near the first trench T3 when the semiconductor substrate 301 is cooled to room temperature.

According to the manufacturing method of the second modification of the third embodiment, by merely adjusting the layout of the trench formation mask, the lower Young's modulus material region 303, a region that causes tensile stress, can be selectively formed in the element isolation region 302 so that carrier mobility in the NMOS region 305 is improved. In other words, a semiconductor device of the third embodiment having improved transistor driving capability as shown in FIG. 10 and FIGS. 11A and 11B can be easily implemented by the manufacturing method of the second modification of the third embodiment. Unlike the third embodiment, the second modification of the third embodiment requires two separate trench formation steps, but does not require formation of, e.g., a region with a smaller element isolation width. Therefore, dimensional restrictions need not be considered in the second modification of the third embodiment. Moreover, in the second embodiment, only a silicon oxide film having a lower Young's modulus than that of a normal silicon oxide film can be used as a lower Young's modulus material. In the second modification of the third embodiment, however, a lower Young's material other than a silicon oxide film can be used.

In the second modification of the third embodiment, the silicon oxide film 337 having a sparser composition and a lower Young's modulus than a normal silicon oxide film is used as a lower Young's modulus material. However, another material having a lower Young's modulus than that of a normal silicon oxide film may alternatively be used. When a material having an etching selectivity to a silicon oxide film is used as a lower Young's modulus material, damage to the lower Young's modulus material region 303 can be prevented in the step of etching an insulating film after formation of the element isolation region.

Third Modification of the Third Embodiment

Hereinafter, a method for manufacturing a semiconductor device according to a third modification of the third embodiment of the invention will be described.

Figure 17A:
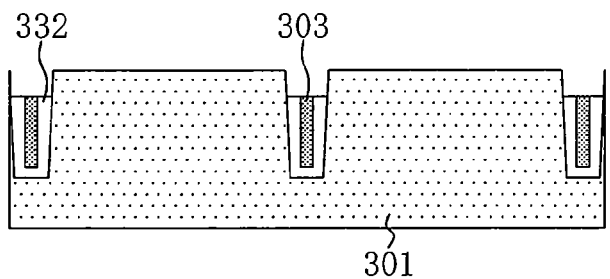
FIGS. 17A, 17B, 17C, 17D, 17E, and 17F are cross-sectional views illustrating the steps of a method for manufacturing a semiconductor device according to a third modification of the third embodiment of the invention.
Figure 17B:
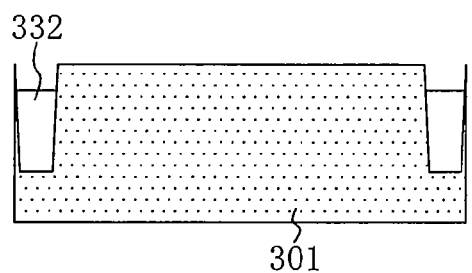
Figure 17C:
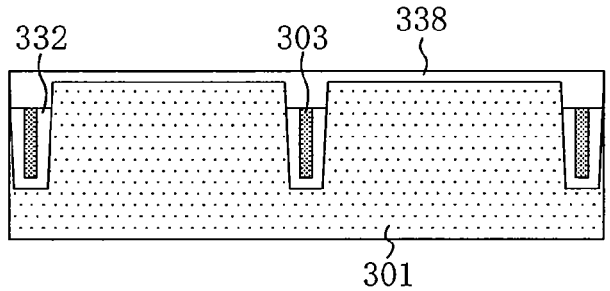
Figure 17D:
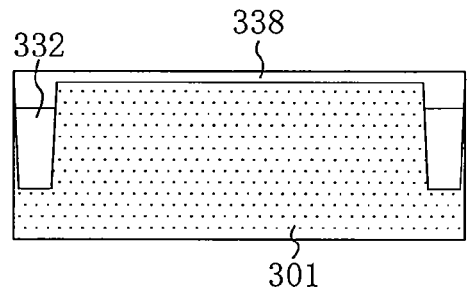
Figure 17E:
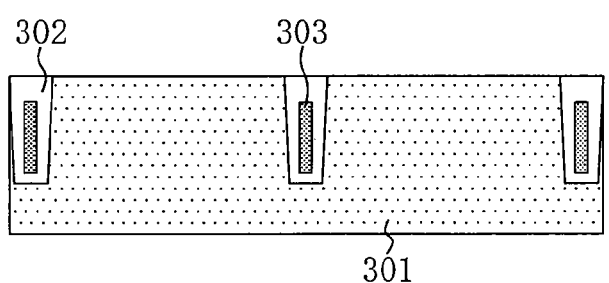
Figure 17F:
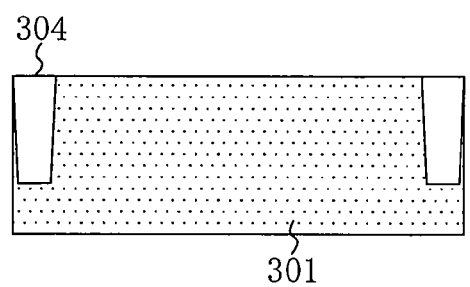

FIGS. 17A through 17F sequentially illustrate in cross section the steps of the method for manufacturing a semiconductor device according to the third modification of the third embodiment. FIGS. 17A, 17C, and 17E show cross-sectional structures taken along line A-A' of FIG. 10. FIGS. 17B, 17D, and 17F show cross-sectional structures taken along line B-B' of FIG. 10.

The steps of the manufacturing method according to the second modification of the third embodiment shown in FIGS. 15A through 15F are first conducted in the third modification of the third embodiment.

As shown in FIGS. 17A and 17B, the silicon oxide film 337 and the silicon oxide film 332 on the semiconductor substrate 301 are sequentially etched. Etching conditions are determined so that a sufficient amount of the silicon oxide film 337 remains in the second trench 336 as the lower Young's modulus material region 303 and that the top portion of the silicon oxide film 332 in the first trenches T3 and T4 can be removed. As a result, the top surface of the silicon oxide film 332 and the lower Young's modulus material region 303 in the first trench T3 and the top surface of the silicon oxide film 332 in the first trench T4 become lower than the top surface of each transistor region.

As shown in FIGS. 17C and 17D, a silicon oxide film 338 is then deposited with a thickness of 50 nm to 100 nm on the whole surface of the semiconductor substrate 301. The silicon oxide film 338 is deposited so as to completely fill the first trenches T3 and T4, that is, so as to completely cover the lower Young's modulus material region 303. This deposition of the silicon oxide film 338 is conducted by, e.g., a CVD method at 800° C. to 900° C. Thereafter, an annealing process is conducted as required at, e.g., about 900° C. to about 1,000° C.

A thermal expansion coefficient of the silicon oxide films 332 and 338 of the element isolation region 302 is different from that of silicon that forms the semiconductor substrate 301. Therefore, compressive stress is generated when the semiconductor substrate 301 is cooled to room temperature after deposition of the silicon oxide films 332 and 338 at a high temperature. However, in the case where heat treatment is conducted after deposition of the silicon oxide films 332 and 338, compressive stress of the silicon oxide films 332 and 338 in the first trench T3 is released toward the lower Young's modulus material region 303 in the first trench T3. Therefore, tensile stress is applied from the element isolation region to the transistor region located near the first trench T3 when the semiconductor substrate 301 is cooled to room temperature.

As shown in FIGS. 17E and 17F, after the silicon oxide film 338 is formed on the semiconductor substrate 301, the surface of the semiconductor substrate 301 is planarized so as to expose the substrate surface of the transistor regions. As a result, an element isolation region 302 that is adjacent to each transistor region in the channel length direction and an element isolation region 304 that is adjacent to each transistor region in the channel width direction are formed. The element isolation region 302 has a lower Young's modulus material region 303 while the element isolation region 304 does not have a lower Young's modulus material region 303.

Since the subsequent steps are the same as the transistor formation step of the first embodiment shown in FIGS. 3G and 3H and FIGS. 4A through 4H, detailed description thereof will be omitted.

According to the manufacturing method of the third modification of the third embodiment, by merely adjusting the layout of the trench formation mask, the lower Young's modulus material region 303, a region that causes tensile stress, can be selectively formed in the element isolation region 302 so that carrier mobility in the NMOS region 305 is improved. In other words, a semiconductor device of the third embodiment having improved transistor driving capability as shown in FIG. 10 and FIGS. 11A and 11B can be easily implemented by the manufacturing method of the third modification of the third embodiment. In the manufacturing method of the third modification of the third embodiment, the lower Young's modulus material region 303 is covered with the silicon oxide film 338 before the transistor formation step is conducted. Therefore, by heat treatment after deposition of the silicon oxide film 338, compressive stress of the silicon oxide films 332 and 338 can be sufficiently released toward the lower Young's modulus material region 303.

Fourth Embodiment

Hereinafter, a semiconductor device and a manufacturing method thereof according to a fourth embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <100> orientation (an allowable tolerance from the <100> orientation is about ±10°).

Figure 18:
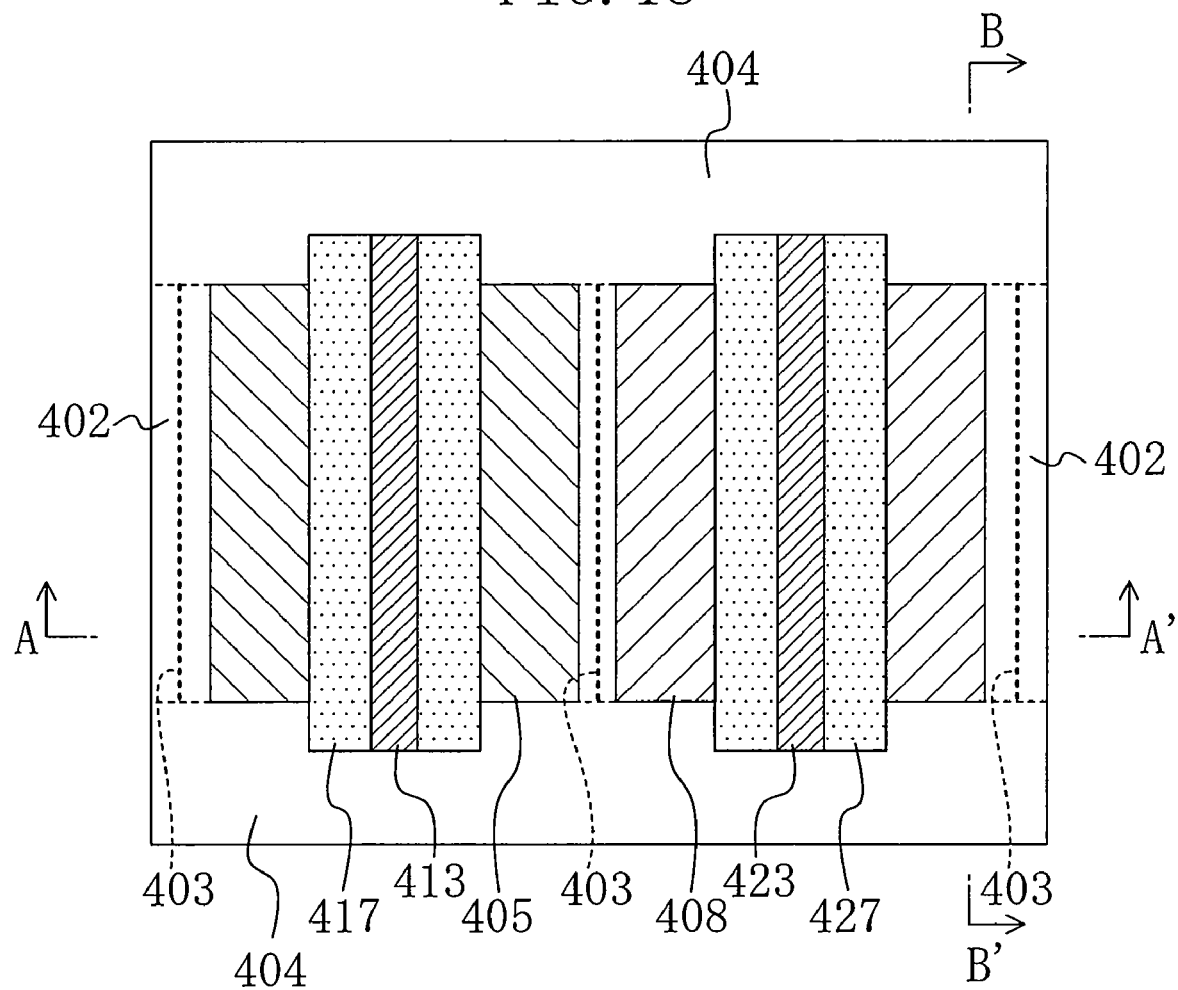
FIG. 18 is a plan view showing a main part of the structure of a semiconductor device according to a fourth embodiment of the invention.
Figure 19A:
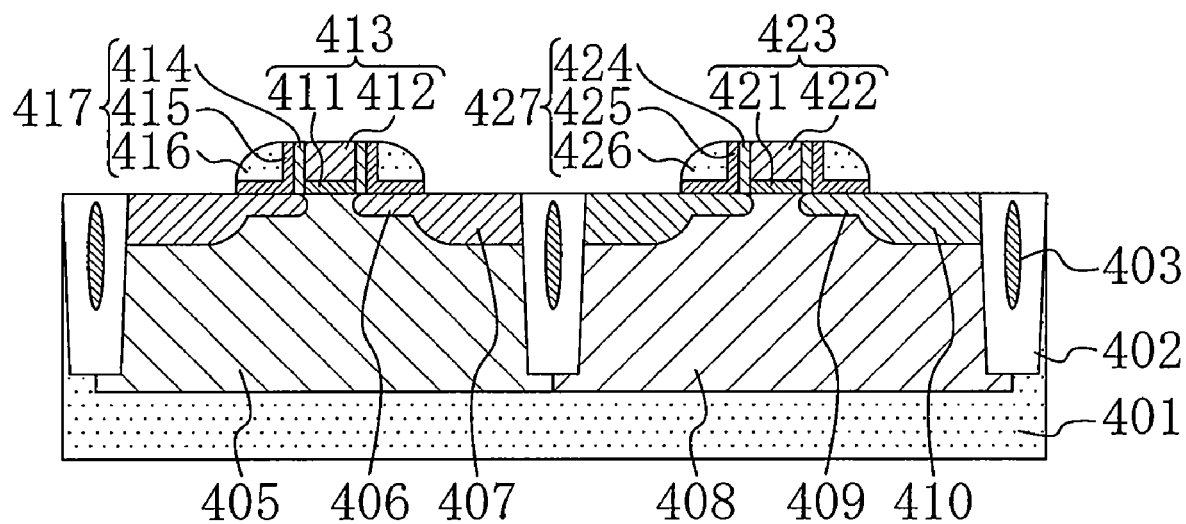
Figure 19B:
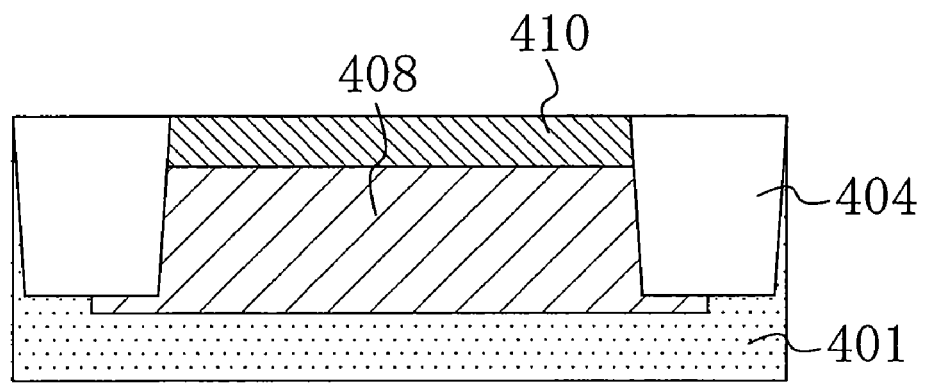

FIG. 18 and FIGS. 19A and 19B show the structure of a semiconductor device according to the fourth embodiment of the invention. FIG. 18 is a plan view, FIG. 19A is a cross-sectional view taken along line A-A' of FIG. 18, and FIG. 19B is a cross-sectional view taken along line B-B' of FIG. 18.

As shown in FIG. 18 and FIGS. 19A and 19B, an NMOS region (active region) 405 including a p-type well is formed in a first region of a semiconductor substrate 401. The first region is a region defined by element isolation regions 402 and 404. The semiconductor substrate 401 is formed from, e.g., silicon. The element isolation region 402 is located adjacent to the NMOS region 405 in a channel length direction and the element isolation region 404 is located adjacent to the NMOS region 405 in a channel width direction. A gate insulating film 411 and a gate electrode 412 are sequentially formed on the NMOS region 405. The gate insulating film 411 and the gate electrode 412 form a gate portion 413. An insulating sidewall spacer 417 is formed on the side wall of the gate portion 413. The sidewall spacer 417 is formed from, e.g., an I-shaped (plate-like) offset spacer 414, an L-shaped oxide film 415, and a SiN film 416. The I-shaped offset spacer 414 is formed from an oxide film and is in contact with the side wall of the gate portion 413. The L-shaped oxide film 415 covers the side surface of the offset spacer 414. The SiN film 416 covers the side surface and the bottom surface of the L-shaped oxide film 415. An n-type extension diffusion layer 406 and an n-type source/drain diffusion layer 407 are formed on both sides of the gate portion 413 in the NMOS region 405 in the same manner as that shown in the first embodiment. The n-type extension diffusion layer 406 is an impurity diffusion layer formed by implantation of n-type impurity ions such as arsenic. The n-type source/drain diffusion layer 407 has a deeper junction depth than that of the n-type extension diffusion layer 406.

As shown in FIG. 18 and FIGS. 19A and 19B, a PMOS region (active region) 408 including an n-type well is formed in a second region of the semiconductor substrate 401. The second region is a region defined by the element isolation regions 402 and 404. The PMOS region 408 is located next to the NMOS region 405 in the channel length direction. The element isolation region 402 is located adjacent to the PMOS region 408 in the channel length direction and the element isolation region 404 is located adjacent to the PMOS region 408 in the channel width direction. A gate insulating film 421 and a gate electrode 422 are sequentially formed on the PMOS region 408. The gate insulating film 421 and the gate electrode 422 form a gate portion 423. An insulating sidewall spacer 427 is formed on the side wall of the gate portion 423. The sidewall spacer 427 is formed from, e.g., an I-shaped (plate-like) offset spacer 424, an L-shaped oxide film 425, and a SiN film 426. The I-shaped offset spacer 424 is formed from an oxide film and is in contact with the side wall of the gate portion 423. The L-shaped oxide film 425 covers the side surface of the offset spacer 424. The SiN film 426 covers the side surface and the bottom surface of the L-shaped oxide film 425. A p-type extension diffusion layer 409 and a p-type source/drain diffusion layer 410 are formed on both sides of the gate portion 423 in the PMOS region 408 in the same manner as that shown in the first embodiment. The p-type extension diffusion layer 409 is an impurity diffusion layer formed by implantation of p-type impurity ions such as boron. The p-type source/drain diffusion layer 410 has a deeper junction depth than that of the p-type extension diffusion layer 409.

This embodiment is characterized in that, as shown in FIG. 18 and FIG. 19A, a highly contractile material region 403 is formed in the element isolation region 402 that is adjacent to the NMOS region 405 in the channel length direction. The highly contractile material region 403 is a region that is formed from a material having contractile characteristics (i.e., a material that causes tensile stress). With this structure, tensile stress can be applied to the NMOS region 405 in the channel length direction in an NMOSFET having a gate length direction of <100> orientation. No highly contractile material region is formed in the element isolation region 404 that is adjacent to the NMOS region 405 in the channel width direction (the gate width direction). Therefore, compressive stress can be applied to the NMOS region 405 in the channel width direction. As a result, carrier mobility (electron mobility) of the NMOSFET can be improved, whereby driving capability of the NMOSFET can be reliably improved.

In this embodiment, the highly contractile material region 403 is formed in the element isolation region 402. In this case, a larger number of steps are required than in the case where a void region is formed. However, if overetching occurs during an etching process in the transistor formation step, etching of the element isolation region 402 proceeds at a lower rate than that in the case where the void region is formed. Moreover, the element isolation region 402 contracts more than the case where the void region is formed.

It should be noted that the above effects can be obtained even when the volume ratio of the highly contractile material region 403 to the element isolation region 402 is 1%. However, this volume ratio is preferably 30% or less in order to prevent reduction in strength.

In this embodiment, the highly contractile material region 403 is formed in the element isolation region 402 that divides the NMOS region 405 and the PMOS region 408 and in the element isolation region 402 that is adjacent to the PMOS region 408 in the channel length direction on the opposite side of the NMOS region 405. However, in a PMOSFET having a gate length direction of <100> orientation, carrier mobility (hole mobility) of the PMOSFET is hardly changed by tensile stress that is applied in the channel length direction by the highly contractile material region 403 and compressive stress that is applied in the channel width direction by the element isolation region 404 having no highly contractile material region 403.

FIG. 18 shows that the sidewall spacers 417 and 427 are respectively formed on the side walls of the gate portions 413 and 423 which face the channel length direction. However, the sidewall spacers 417 and 427 may also be formed on the end faces of the gate portions 413 and 423 which face the channel width direction, respectively.

In this embodiment, an example of the highly contractile material is a SiN film containing hydrogen. For example, this hydrogen-containing SiN film is deposited by a CVD method in a gas atmosphere with an increased hydrogen composition (an increased partial pressure of hydrogen). However, the highly contractile material is not limited to the hydrogen-containing SiN film. Especially when a material having an etching selectivity to a silicon oxide film is used as a highly contractile material, damage to the highly contractile material region 403 can be prevented in the step of etching an insulating film after formation of the element isolation region.

The semiconductor device of this embodiment can be manufactured by using a highly contractile material instead of a lower Young's modulus material in the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment show in FIGS. 15A through 15H and FIGS. 16A and 16B, or the manufacturing method of the third modification of the third embodiment shown in FIGS. 17A through 17F.

The highly contractile material region 403 is formed in the element isolation region 402 in this embodiment. The highly contractile material region 403 can be caused to contract not only by heat treatment such as an annealing process of, e.g., about 900° C. to about 1,000° C. but by ultraviolet radiation. Accordingly, tensile stress can be reliably applied to an active region near the highly contractive material region 403.

Fifth Embodiment

Hereinafter, a semiconductor device and a manufacturing method thereof according to a fifth embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <110> orientation (an allowable tolerance from the <110> orientation is about ±10°).

Figure 20:
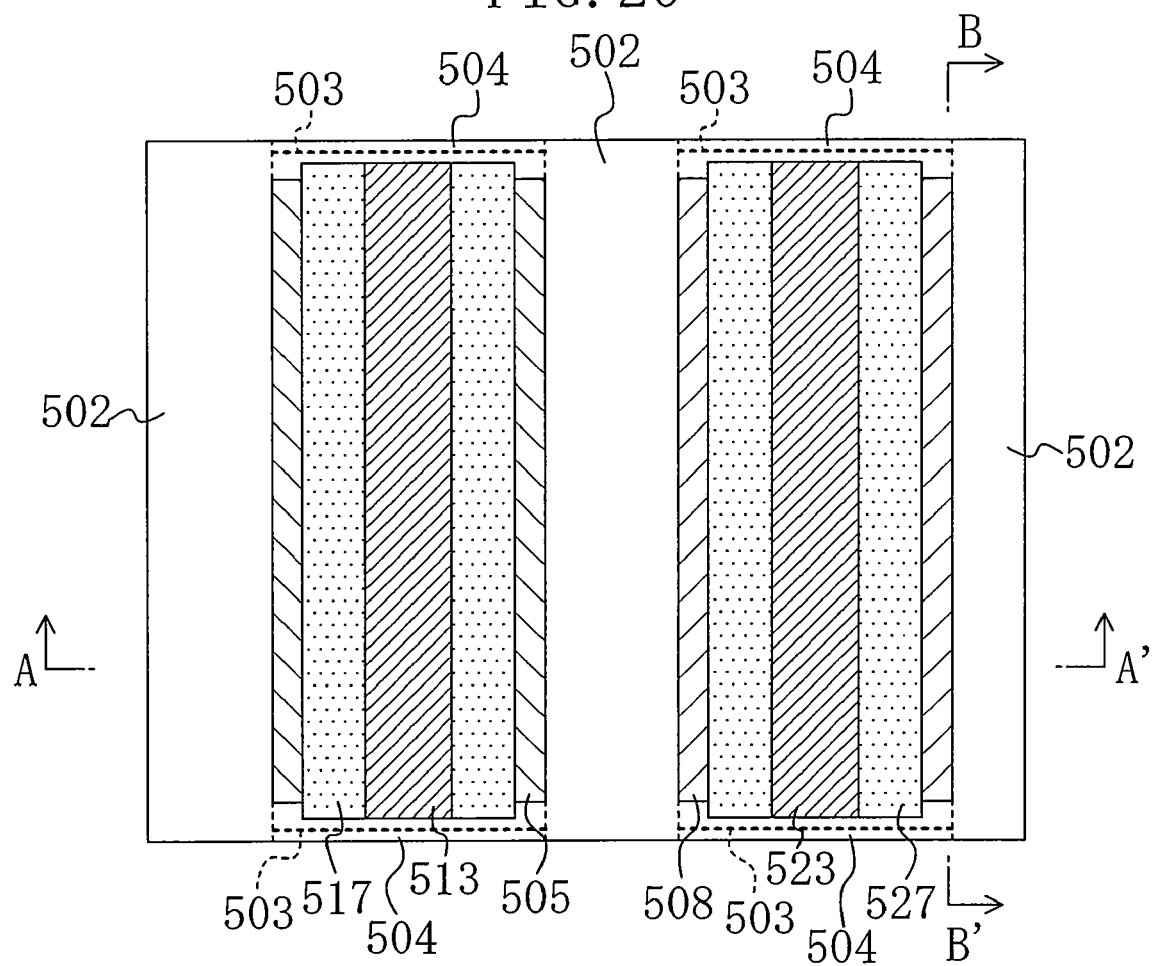
FIG. 20 is a plan view showing a main part of the structure of a semiconductor device according to a fifth embodiment of the invention.
Figure 21A:
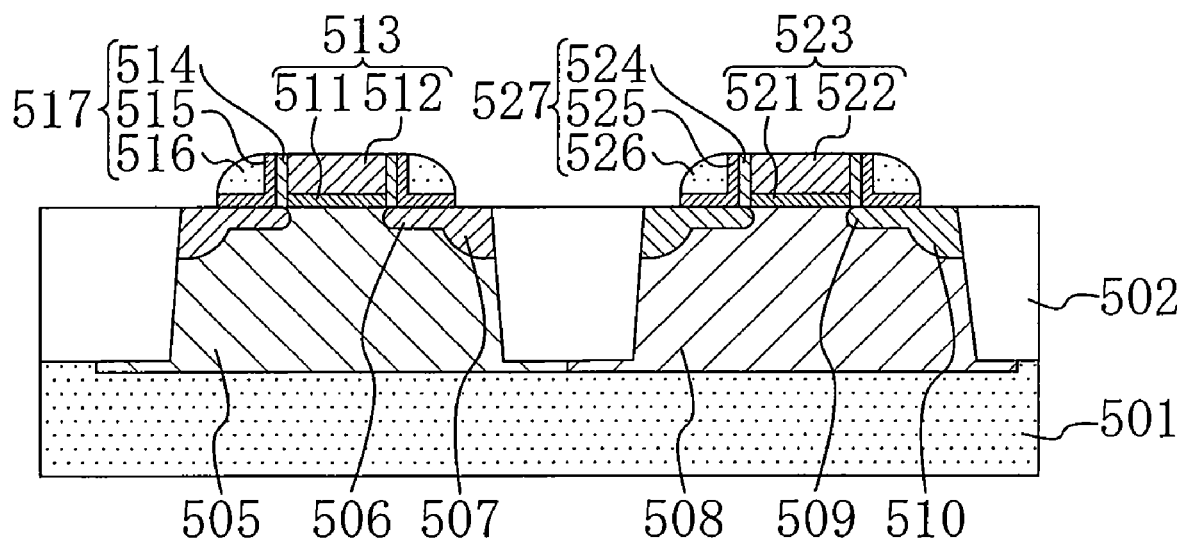
Figure 21B:
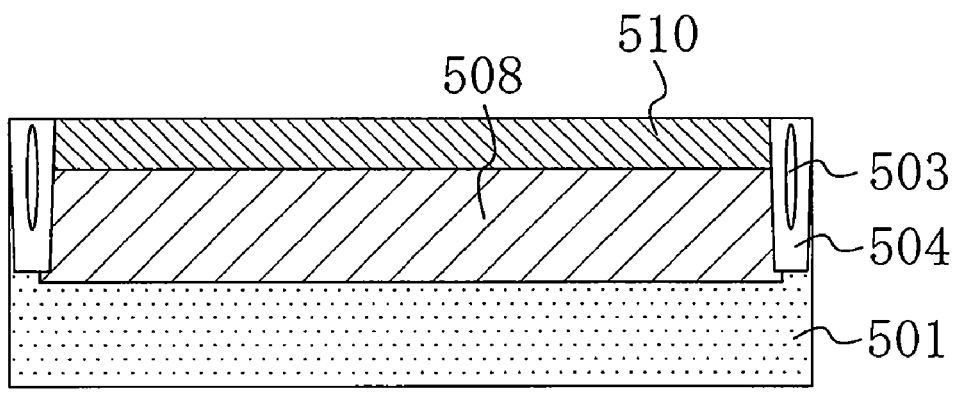

FIG. 20 and FIGS. 21A and 21B show the structure of a semiconductor device according to the fifth embodiment of the invention. FIG. 20 is a plan view, FIG. 21A is a cross-sectional view taken along line A-A' of FIG. 20, and FIG. 21B is a cross-sectional view taken along line B-B' of FIG. 20.

As shown in FIG. 20 and FIGS. 21A and 21B, an NMOS region (active region) 505 including a p-type well is formed in a first region of a semiconductor substrate 501. The first region is a region defined by element isolation regions 502 and 504. The semiconductor substrate 501 is formed from, e.g., silicon. The element isolation region 502 is located adjacent to the NMOS region 505 in a channel length direction and the element isolation region 504 is located adjacent to the NMOS region 505 in a channel width direction. A gate insulating film 511 and a gate electrode 512 are sequentially formed on the NMOS region 505. The gate insulating film 511 and the gate electrode 512 form a gate portion 513. An insulating sidewall spacer 517 is formed on the side wall of the gate portion 513. The sidewall spacer 517 is formed from, e.g., an I-shaped (plate-like) offset spacer 514, an L-shaped oxide film 515, and a SiN film 516. The I-shaped offset spacer 514 is formed from an oxide film and is in contact with the side wall of the gate portion 513. The L-shaped oxide film 515 covers the side surface of the offset spacer 514. The SiN film 516 covers the side surface and the bottom surface of the L-shaped oxide film 515. An n-type extension diffusion layer 506 and an n-type source/drain diffusion layer 507 are formed on both sides of the gate portion 513 in the NMOS region 505 in the same manner as that shown in the first embodiment. The n-type extension diffusion layer 506 is an impurity diffusion layer formed by implantation of n-type impurity ions such as arsenic. The n-type source/drain diffusion layer 507 has a deeper junction depth than that of the n-type extension diffusion layer 506.

As shown in FIG. 20 and FIGS. 21A and 21B, a PMOS region (active region) 508 including an n-type well is formed in a second region of the semiconductor substrate 501. The second region is a region defined by the element isolation regions 502 and 504. The PMOS region 508 is located next to the NMOS region 505 in the channel length direction. The element isolation region 502 is located adjacent to the PMOS region 508 in the channel length direction and the element isolation region 504 is located adjacent to the PMOS region 508 in the channel width direction. A gate insulating film 521 and a gate electrode 522 are sequentially formed on the PMOS region 508. The gate insulating film 521 and the gate electrode 522 form a gate portion 523. An insulating sidewall spacer 527 is formed on the side wall of the gate portion 523. The sidewall spacer 527 is formed from, e.g., an I-shaped (plate-like) offset spacer 524, an L-shaped oxide film 525, and a SiN film 526. The I-shaped offset spacer 524 is formed from an oxide film and is in contact with the side wall of the gate portion 523. The L-shaped oxide film 525 covers the side surface of the offset spacer 524. The SiN film 526 covers the side surface and the bottom surface of the L-shaped oxide film 525. A p-type extension diffusion layer 509 and a p-type source/drain diffusion layer 510 are formed on both sides of the gate portion 523 in the PMOS region 508 in the same manner as that shown in the first embodiment. The p-type extension diffusion layer 509 is an impurity diffusion layer formed by implantation of p-type impurity ions such as boron. The p-type source/drain diffusion layer 510 has a deeper junction depth than that of the p-type extension diffusion layer 509.

This embodiment is characterized in that, as shown in FIG. 20 and FIGS. 21A and 21B, a void region 503 is formed in the element isolation region 504 that is adjacent to the PMOS region 508 in the channel width direction. With this structure, tensile stress can be applied to the PMOS region 508 in the channel width direction in a PMOSFET having a gate length direction of <110> orientation. No void region is formed in the element isolation region 502 that is adjacent to the PMOS region 508 in the channel length direction (the gate length direction). Therefore, compressive stress can be applied to the PMOS region 508 in the channel length direction. As a result, carrier mobility (hole mobility) of the PMOSFET can be improved, whereby driving capability of the PMOSFET can be reliably improved.

It should be noted that the above effect can be obtained even when the volume ratio of the void region 503 to the element isolation region 504 is 0.1%. However, this volume ratio is preferably 10% or less in order to prevent reduction in strength.

In this embodiment, the void region 503 is formed in the element isolation region 504 that is adjacent to the NMOS region 505 in the channel width direction. Therefore, in an NMOSFET having a gate length direction of <110> orientation, carrier mobility (electron mobility) of the NMOSFET is increased by tensile stress that is applied in the channel width direction, but is decreased by compressive stress that is applied in the channel length direction by the element isolation region 502 having no void region 503.

FIG. 20 shows that the sidewall spacers 517 and 527 are respectively formed on the side walls of the gate portions 513 and 523 which face the channel length direction. However, the sidewall spacers 517 and 527 may also be formed on the end faces of the gate portions 513 and 523 which face the channel width direction, respectively.

The semiconductor device of this embodiment can be manufactured by the same method as the manufacturing method of the first embodiment shown in FIGS. 3A through 3H and FIGS. 4A through 4H, the manufacturing method of the first modification of the first embodiment shown in FIGS. 5A and 5B, or the manufacturing method of the second modification of the first embodiment shown in FIGS. 6A through 6J.

The same effects as those of this embodiment can also be obtained when the void region 503 of this embodiment is replaced with a lower Young's modulus material region. In this case, the semiconductor device can be manufactured by the same method as the manufacturing method of the second embodiment shown in FIGS. 9A through 9F, the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F.

The same effects as those of this embodiment can be obtained when the void region 503 of this embodiment is replaced with a highly contractile material region. In this case, the semiconductor device can be manufactured by using a highly contractile material instead of a lower Young's modulus material in the same method as the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F (see the fourth embodiment).

Sixth Embodiment

Hereinafter, a semiconductor device and a manufacturing method thereof according to a sixth embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <110> orientation (an allowable tolerance from the <110> orientation is about ±10°).

Figure 22:
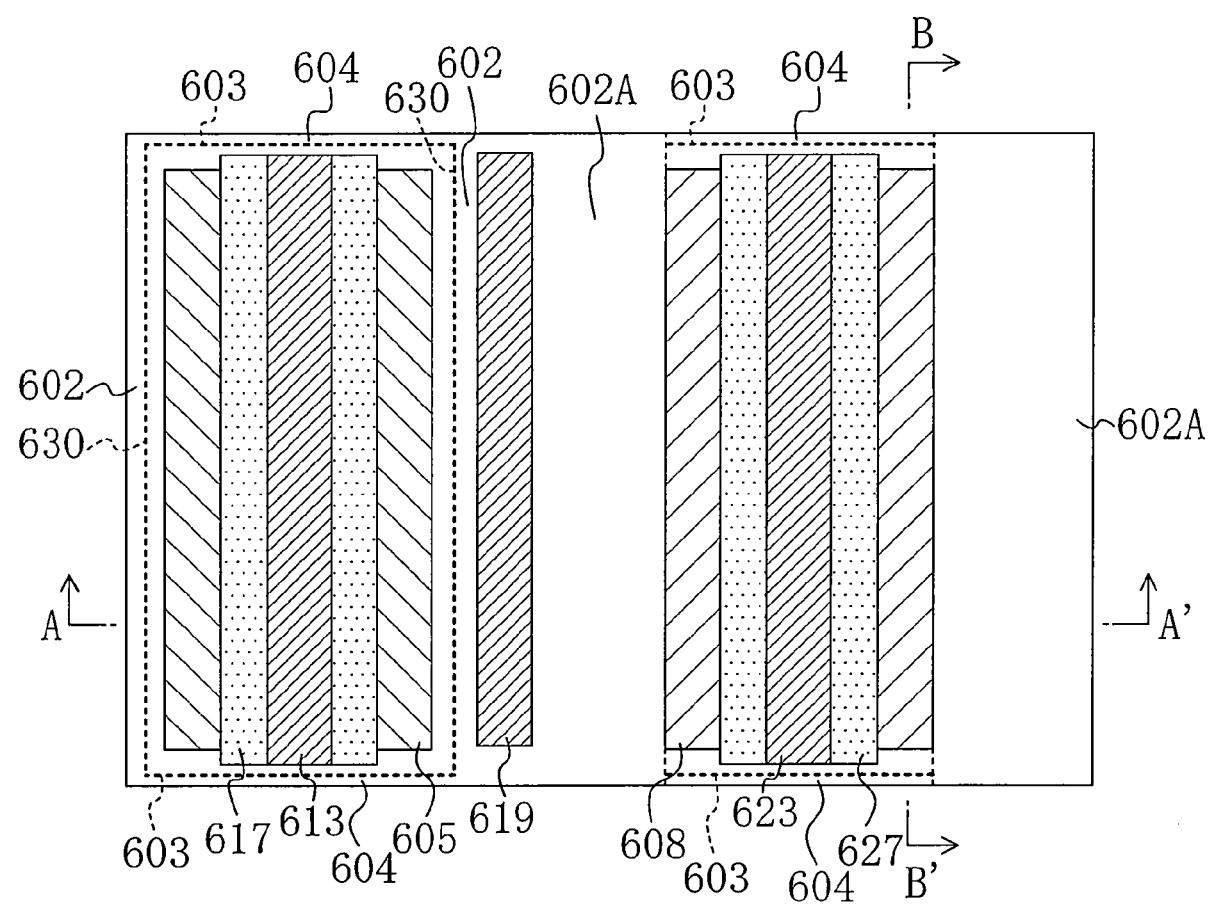
FIG. 22 is a plan view showing a main part of the structure of a semiconductor device according to a sixth embodiment of the invention.
Figure 23A:
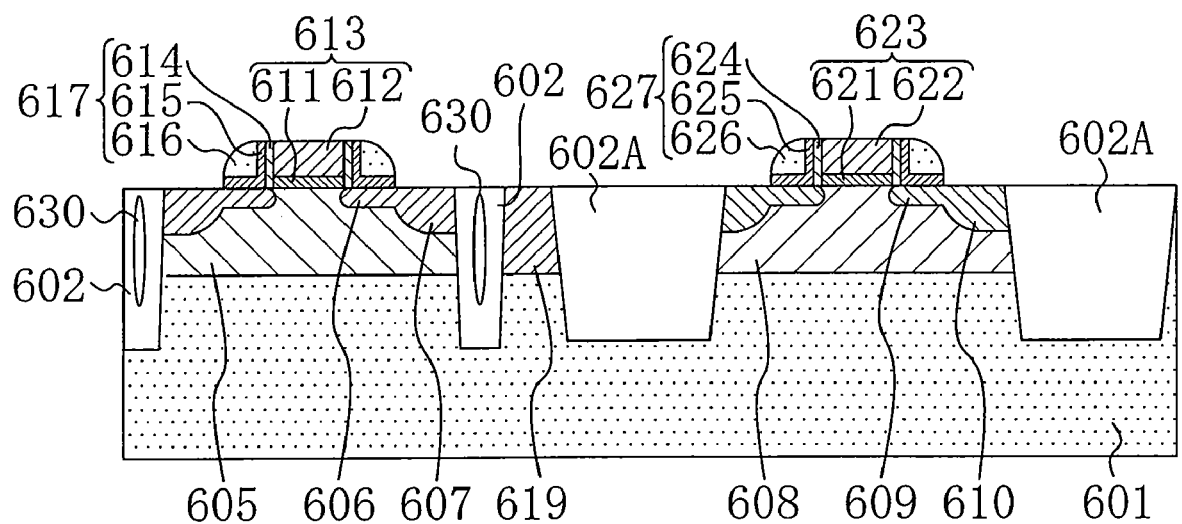
Figure 23B:
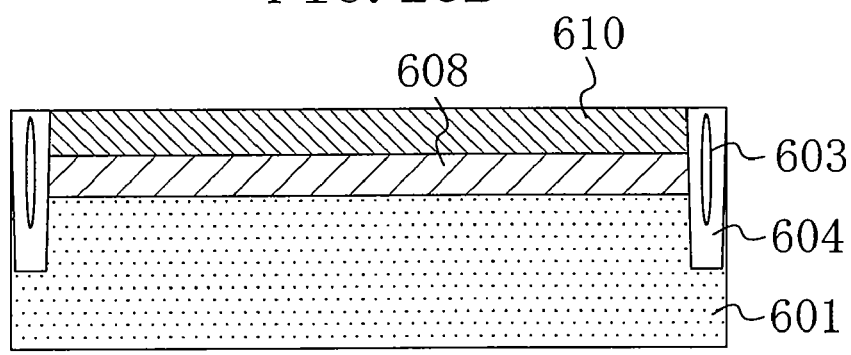

FIG. 22 and FIGS. 23A and 23B show the structure of a semiconductor device according to the sixth embodiment of the invention. FIG. 22 is a plan view, FIG. 23A is a cross-sectional view taken along line A-A' of FIG. 22, and FIG. 23B is a cross-sectional view taken along line B-B' of FIG. 22.

As shown in FIG. 22 and FIGS. 23A and 23B, an NMOS region (active region) 605 including a p-type well is formed in a first region of a semiconductor substrate 601. The first region is a region defined by element isolation regions 602 and 604. The semiconductor substrate 601 is formed from, e.g., silicon. The element isolation region 602 is located adjacent to the NMOS region 605 in a channel length direction and the element isolation region 604 is located adjacent to the NMOS region 605 in a channel width direction. A gate insulating film 611 and a gate electrode 612 are sequentially formed on the NMOS region 605. The gate insulating film 611 and the gate electrode 612 form a gate portion 613. An insulating sidewall spacer 617 is formed on the side wall of the gate portion 613. The sidewall spacer 617 is formed from, e.g., an I-shaped (plate-like) offset spacer 614, an L-shaped oxide film 615, and a SiN film 616. The I-shaped offset spacer 614 is formed from an oxide film and is in contact with the side wall of the gate portion 613. The L-shaped oxide film 615 covers the side surface of the offset spacer 614. The SiN film 616 covers the side surface and the bottom surface of the L-shaped oxide film 615. An n-type extension diffusion layer 606 and an n-type source/drain diffusion layer 607 are formed on both sides of the gate portion 613 in the NMOS region 605 in the same manner as that shown in the first embodiment. The n-type extension diffusion layer 606 is an impurity diffusion layer formed by implantation of n-type impurity ions such as arsenic. The n-type source/drain diffusion layer 607 has a deeper junction depth than that of the n-type extension diffusion layer 606.

As shown in FIG. 22 and FIGS. 23A and 23B, a PMOS region (active region) 608 including an n-type well is formed in a second region of the semiconductor substrate 601. The second region is a region defined by element isolation regions 602A and 604. The PMOS region 608 is located next to the NMOS region 605 in the channel length direction. The element isolation region 602A is located adjacent to the PMOS region 608 in the channel length direction and the element isolation region 604 is located adjacent to the PMOS region 608 in the channel width direction. A gate insulating film 621 and a gate electrode 622 are sequentially formed on the PMOS region 608. The gate insulating film 621 and the gate electrode 622 form a gate portion 623. An insulating sidewall spacer 627 is formed on the side wall of the gate portion 623. The sidewall spacer 627 is formed from, e.g., an I-shaped (plate-like) offset spacer 624, an L-shaped oxide film 625, and a SiN film 626. The I-shaped offset spacer 624 is formed from an oxide film and is in contact with the side wall of the gate portion 623. The L-shaped oxide film 625 covers the side surface of the offset spacer 624. The SiN film 626 covers the side surface and the bottom surface of the L-shaped oxide film 625. A p-type extension diffusion layer 609 and a p-type source/drain diffusion layer 610 are formed on both sides of the gate portion 623 in the PMOS region 608 in the same manner as that shown in the first embodiment. The p-type extension diffusion layer 609 is an impurity diffusion layer formed by implantation of p-type impurity ions such as boron. The p-type source/drain diffusion layer 610 has a deeper junction depth than that of the p-type extension diffusion layer 609.

In this embodiment, as shown in FIG. 22 and FIGS. 23A and 23B, a void region 603 is formed in the element isolation region 604 that is adjacent to the PMOS region 608 in the channel width direction. With this structure, tensile stress can be applied to the PMOS region 608 in the channel width direction in a PMOSFET having a gate length direction of <110> orientation. No void region is formed in the element isolation region 602A that is adjacent to the PMOS region 608 in the channel length direction (the gate length direction). Therefore, compressive stress can be applied to the PMOS region 608 in the channel length direction. As a result, carrier mobility (hole mobility) of the PMOSFET can be improved, whereby driving capability of the PMOSFET can be reliably improved.

It should be noted that the above effect can be obtained even when the volume ratio of the void region 603 to the element isolation region 604 is 0.1%. However, this volume ratio is preferably 10% or less in order to prevent reduction in strength.

In this embodiment, the void region 603 is also formed in the element isolation region 604 that is adjacent to the NMOS region 605 in the channel width direction. Therefore, in an NMOSFET having a gate length direction of <110> orientation, carrier mobility (electron mobility) of the NMOSFET is increased by tensile stress that is applied in the channel width direction.

In this embodiment, the element isolation regions 602 and 602A formed between the NMOS region 605 and the PMOS region 608 are divided by a substrate region 619 extending in the gate width direction (the substrate region 619 may have impurities implanted therein). The width of the element isolation region 602 between the substrate region 619 and the NMOS region 605 is narrower than that of the element isolation region 602A between the substrate region 619 and the PMOS region 608. A void region 630 is formed in the element isolation region 602 located between the substrate region 619 and the NMOS region 605, that is, in the element isolation region 602 that is adjacent to the NMOS region 605 in the channel length direction. With this structure, carrier mobility (hole mobility) in the PMOS region 608 having a gate length direction of <110> orientation is improved, whereby driving capability of the PMOSFET can be improved. Moreover, tensile stress can be applied both in the channel width direction and the channel length direction to the NMOS region 605 having a gate length direction of <110> orientation. Therefore, carrier mobility (electron mobility) in the NMOS region 605 can be improved, whereby driving capability of the NMOSFET can be improved.

It should be noted that the above effect can be obtained even when the volume ratio of the void region 630 to the element isolation region 602 is 0.1%. However, this volume ratio is preferably 30% or less in order to prevent reduction in strength.

FIG. 22 shows that the sidewall spacers 617 and 627 are respectively formed on the side walls of the gate portions 613 and 623 which face the channel length direction. However, the sidewall spacers 617 and 627 may also be formed on the end faces of the gate portions 613 and 623 which face the channel width direction, respectively. In FIG. 22 and FIG. 23A, the substrate region 619 and the void region 630 are provided on the right side of the NMOS region 605. However, the same structure may also be provided on the left side of the NMOS region 605.

The semiconductor device of this embodiment can be manufactured by the same method as the manufacturing method of the first embodiment shown in FIGS. 3A through 3H and FIGS. 4A through 4H, the manufacturing method of the first modification of the first embodiment shown in FIGS. 5A and 5B, or the manufacturing method of the second modification of the first embodiment shown in FIGS. 6A through 6J.

The same effects as those of this embodiment can be obtained when the void regions 603 and 630 of this embodiment are replaced with lower Young's modulus material regions. In this case, the semiconductor device can be manufactured by the same method as the manufacturing method of the second embodiment shown in FIGS. 9A through 9F, the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F.

The same effects as those of this embodiment can be obtained when the void regions 603 and 630 of this embodiment are replaced with highly contractile material regions. In this case, the semiconductor device can be manufactured by using a highly contractile material instead of a lower Young's modulus material in the same method as the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F (see the fourth embodiment).

Seventh Embodiment

Hereinafter, a semiconductor device and a manufacturing method thereof according to a seventh embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <100> orientation (an allowable tolerance from the <100> orientation is about ±10°).

Figure 24:
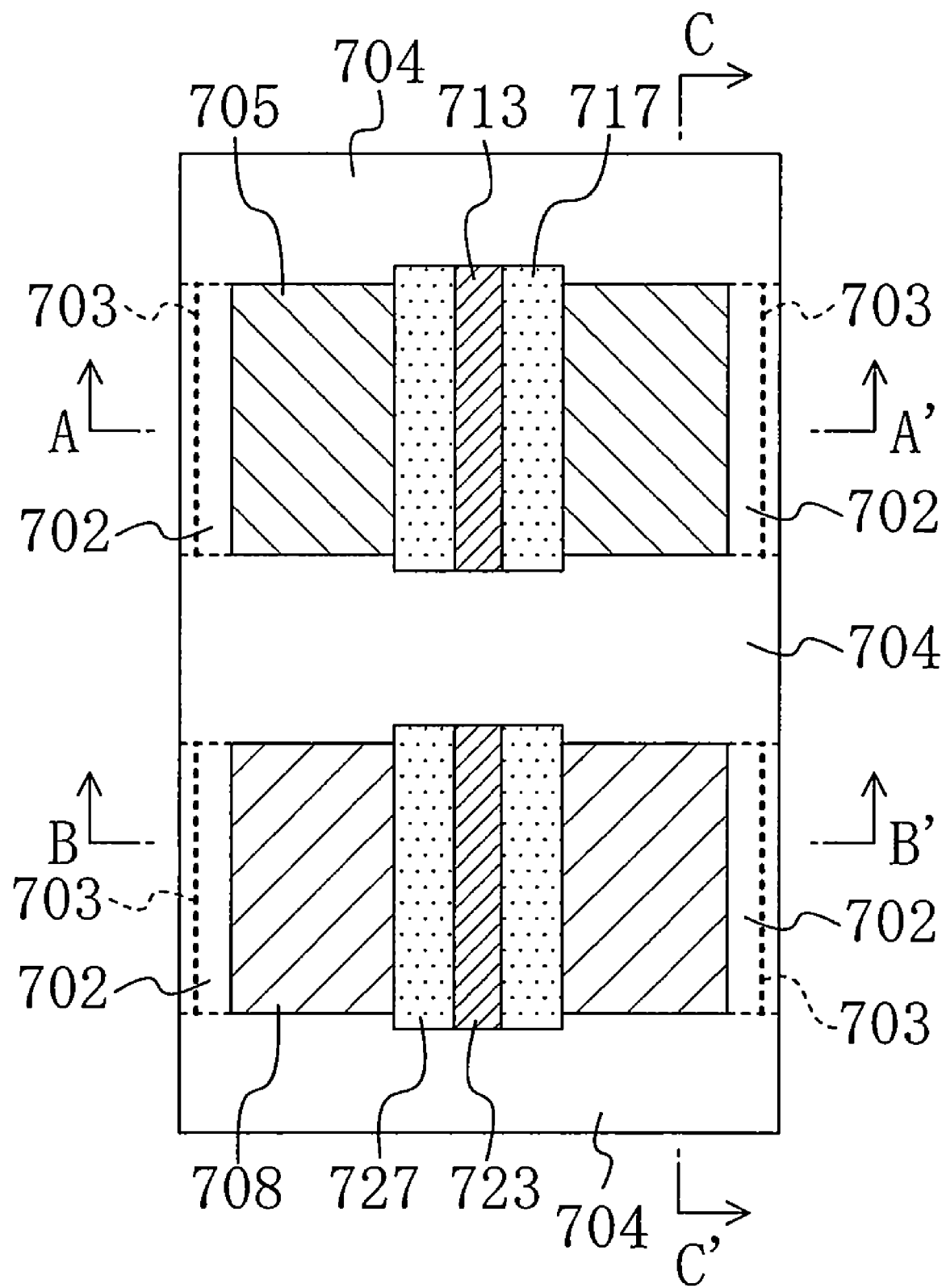
FIG. 24 is a plan view showing a main part of the structure of a semiconductor device according to a seventh embodiment of the invention.
Figure 25A:
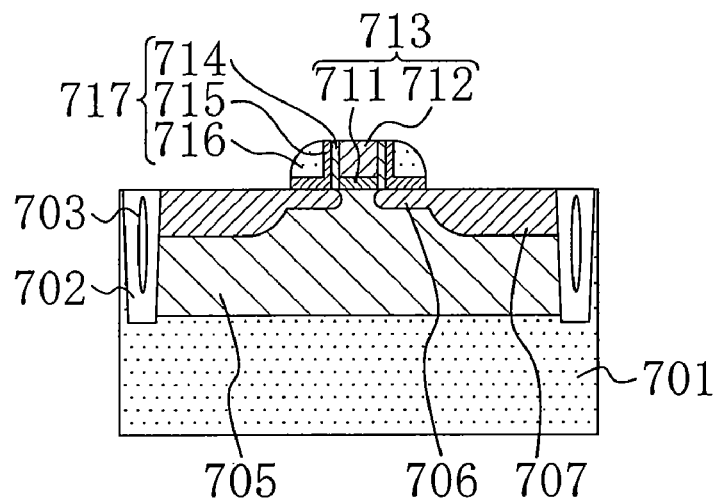
Figure 25B:
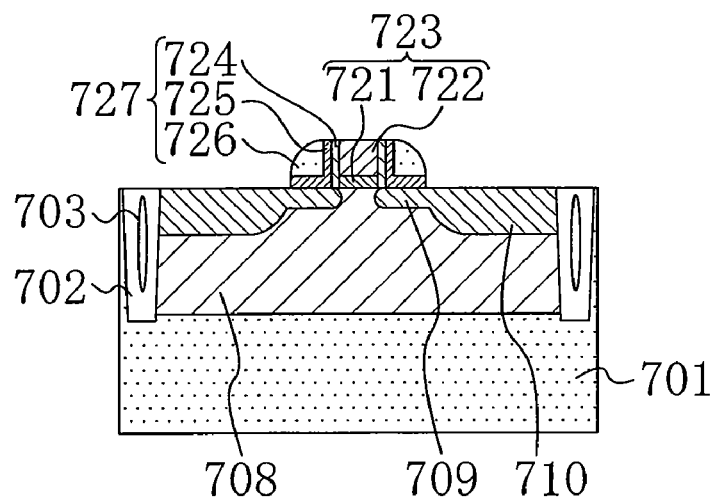
Figure 25C:
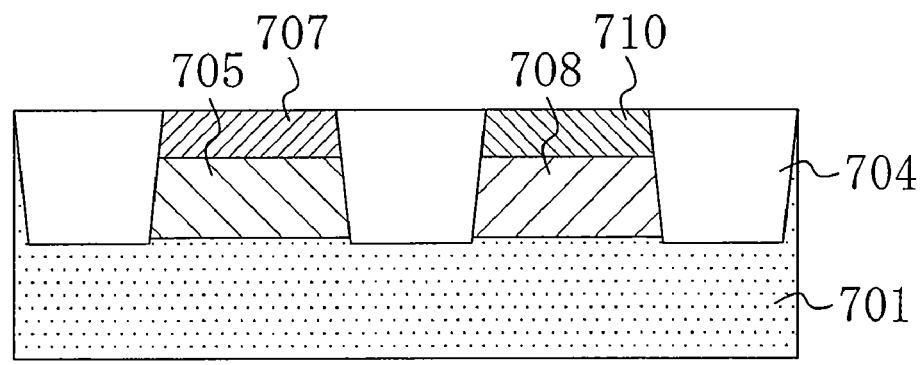

FIG. 24 and FIGS. 25A through 25C show the structure of a semiconductor device according to the seventh embodiment of the invention. FIG. 24 is a plan view, FIG. 25A is a cross-sectional view taken along line A-A' of FIG. 24, FIG. 25B is a cross-sectional view taken along line B-B' of FIG. 24, and FIG. 25C is a cross-sectional view taken along line C-C' of FIG. 24.

As shown in FIG. 24, in a semiconductor substrate 701, an NMOS region 705 and a PMOS region 708 are provided next to each other in a channel width direction (a gate width direction) with an element isolation region 704 interposed therebetween. The semiconductor substrate 701 is formed from, e.g., silicon.

More specifically, as shown in FIG. 24 and FIGS. 25A through 25C, an NMOS region (active region) 705 including a p-type well is formed in a first region of a semiconductor substrate 701. The first region is a region defined by element isolation regions 702 and 704. The element isolation region 702 is located adjacent to the NMOS region 705 in a channel length direction and the element isolation region 704 is located adjacent to the NMOS region 705 in a channel width direction. A gate insulating film 711 and a gate electrode 712 are sequentially formed on the NMOS region 705. The gate insulating film 711 and the gate electrode 712 form a gate portion 713. An insulating sidewall spacer 717 is formed on the side wall of the gate portion 713. The sidewall spacer 717 is formed from, e.g., an I-shaped (plate-like) offset spacer 714, an L-shaped oxide film 715, and a SiN film 716. The I-shaped offset spacer 714 is formed from an oxide film and is in contact with the side wall of the gate portion 713. The L-shaped oxide film 715 covers the side surface of the offset spacer 714. The SiN film 716 covers the side surface and the bottom surface of the L-shaped oxide film 715. An n-type extension diffusion layer 706 and an n-type source/drain diffusion layer 707 are formed on both sides of the gate portion 713 in the NMOS region 705 in the same manner as that shown in the first embodiment. The n-type extension diffusion layer 706 is an impurity diffusion layer formed by implantation of n-type impurity ions such as arsenic. The n-type source/drain diffusion layer 707 has a deeper junction depth than that of the n-type extension diffusion layer 706.

As shown in FIG. 24 and FIGS. 25A through 25C, a PMOS region (active region) 708 including an n-type well is formed in a second region of the semiconductor substrate 701. The second region is a region defined by the element isolation regions 702 and 704. The element isolation region 702 is located adjacent to the PMOS region 708 in the channel length direction and the element isolation region 704 is located adjacent to the PMOS region 708 in the channel width direction. A gate insulating film 721 and a gate electrode 722 are sequentially formed on the PMOS region 708. The gate insulating film 721 and the gate electrode 722 form a gate portion 723. An insulating sidewall spacer 727 is formed on the side wall of the gate portion 723. The sidewall spacer 727 is formed from, e.g., an I-shaped (plate-like) offset spacer 724, an L-shaped oxide film 725, and a SiN film 726. The I-shaped offset spacer 724 is formed from an oxide film and is in contact with the side wall of the gate portion 723. The L-shaped oxide film 725 covers the side surface of the offset spacer 724. The SiN film 726 covers the side surface and the bottom surface of the L-shaped oxide film 725. A p-type extension diffusion layer 709 and a p-type source/drain diffusion layer 710 are formed on both sides of the gate portion 723 in the PMOS region 708 in the same manner as that shown in the first embodiment. The p-type extension diffusion layer 709 is an impurity diffusion layer formed by implantation of p-type impurity ions such as boron. The p-type source/drain diffusion layer 710 has a deeper junction depth than that of the p-type extension diffusion layer 709.

This embodiment is characterized in that, as shown in FIG. 24 and FIGS. 25A through 25C, a void region 703 is formed in the element isolation region 702 that is adjacent to the NMOS region 705 in the channel length direction. With this structure, tensile stress can be applied to the NMOS region 705 in the channel length direction in an NMOSFET having a gate length direction of <100> orientation. No void region is formed in the element isolation region 704 that is adjacent to the NMOS region 705 in the channel width direction (the gate width direction). Therefore, compressive stress can be applied to the NMOS region 705 in the channel width direction. As a result, carrier mobility (electron mobility) of the NMOSFET can be improved, whereby driving capability of the NMOSFET can be reliably improved.

It should be noted that the above effect can be obtained even when the volume ratio of the void region 703 to the element isolation region 702 is 0.1%. However, this volume ratio is preferably 10% or less in order to prevent reduction in strength.

In this embodiment, the void region 703 is formed in the element isolation region 702 that is adjacent to the PMOS region 708 in the channel length direction. In a PMOSFET having a gate length direction of <100> orientation, carrier mobility (hole mobility) of the PMOSFET is hardly changed by tensile stress that is applied in the channel length direction by the void region 703 and compressive stress that is applied in the channel width direction by the element isolation region 704 having no void region 703.

FIG. 24 shows that the sidewall spacers 717 and 727 are respectively formed on the side walls of the gate portions 713 and 723 which face the channel length direction. However, the sidewall spacers 717 and 727 may also be formed on the end faces of the gate portions 713 and 723 which face the channel width direction, respectively. The gate electrode 712 of the NMOS region 705 and the gate electrode 722 of the PMOS region 708 may be connected to each other through a gate wiring that is formed on the element isolation region 704 between the NMOS region 705 and the PMOS region 708.

The semiconductor device of this embodiment can be manufactured by the same method as the manufacturing method of the first embodiment shown in FIGS. 3A through 3H and FIGS. 4A through 4H, the manufacturing method of the first modification of the first embodiment shown in FIGS. 5A and 5B, or the manufacturing method of the second modification of the first embodiment shown in FIGS. 6A through 6J.

The same effects as those of this embodiment can also be obtained when the void region 703 of this embodiment is replaced with a lower Young's modulus material region. In this case, the semiconductor device can be manufactured by the same method as the manufacturing method of the second embodiment shown in FIGS. 9A through 9F, the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F.

The same effects as those of this embodiment can be obtained when the void region 703 of this embodiment is replaced with a highly contractile material region. In this case, the semiconductor device can be manufactured by using a highly contractile material instead of a lower Young's modulus material in the same method as the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F (see the fourth embodiment).

Eighth Embodiment

Hereinafter, a semiconductor device and a manufacturing method thereof according to an eighth embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <110> orientation (an allowable tolerance from the <110> orientation is about ±10°).

Figure 26:
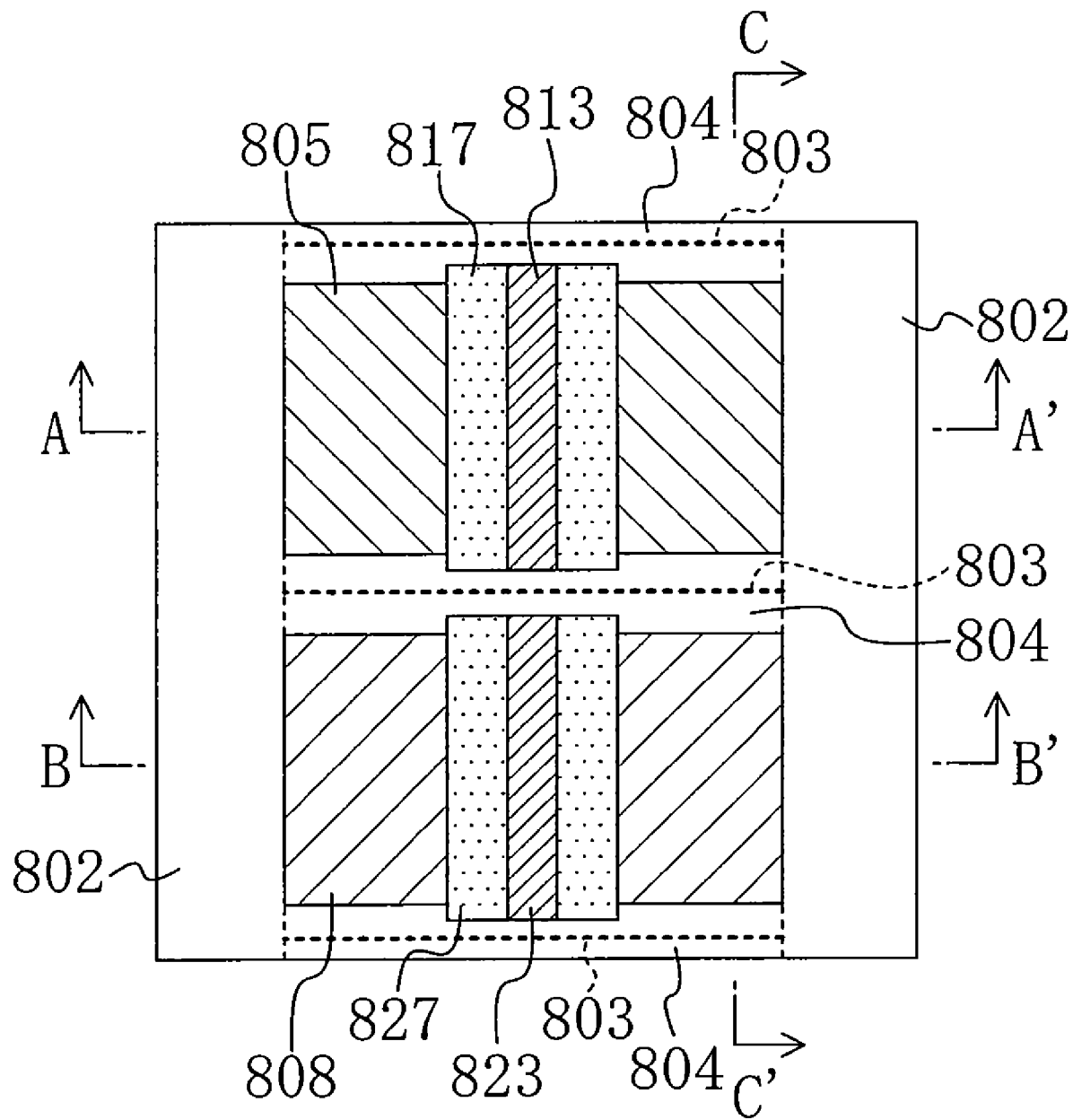
FIG. 26 is a plan view showing a main part of the structure of a semiconductor device according to an eighth embodiment of the invention.
Figure 27A:
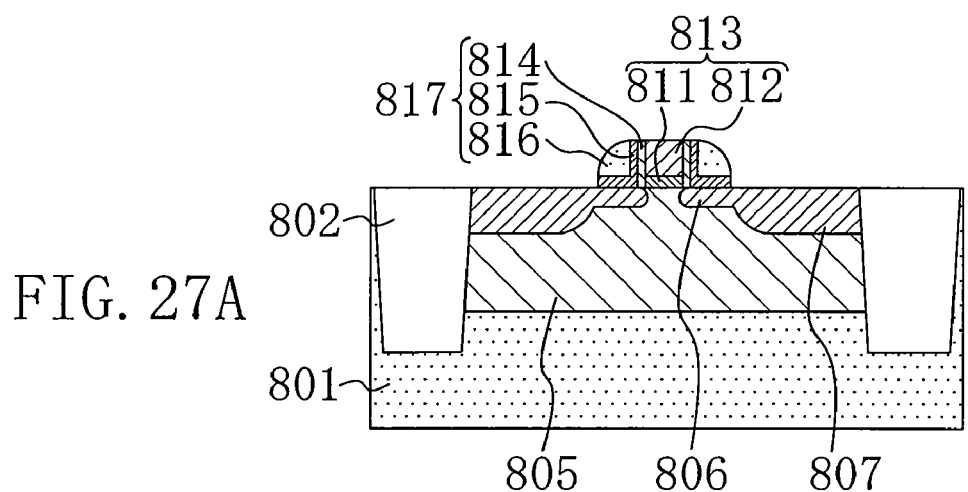
Figure 27B:
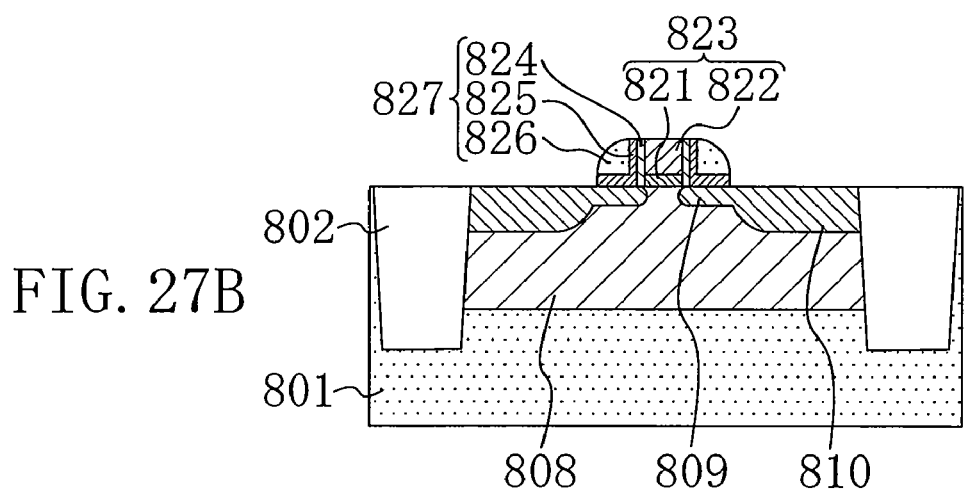
Figure 27C:
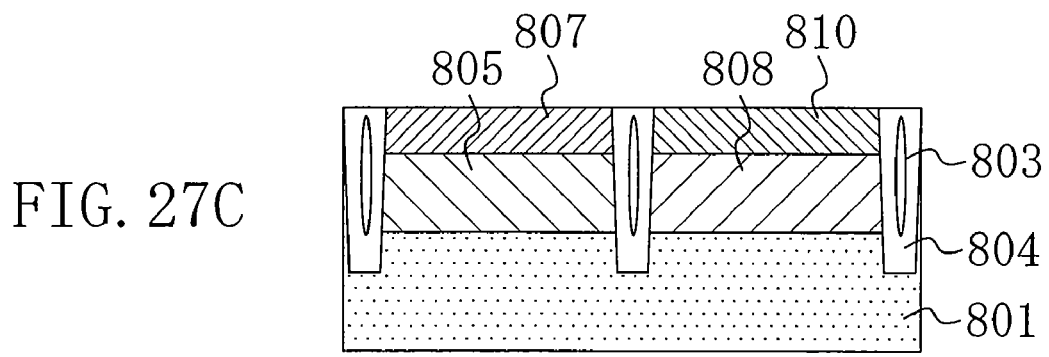

FIG. 26 and FIGS. 27A through 27C show the structure of a semiconductor device according to the eighth embodiment of the invention. FIG. 26 is a plan view, FIG. 27A is a cross-sectional view taken along line A-A' of FIG. 26, FIG. 27B is a cross-sectional view taken along line B-B' of FIG. 26, and FIG. 27C is a cross-sectional view taken along line C-C' of FIG. 26.

As shown in FIG. 26, in a semiconductor substrate 801, an NMOS region 805 and a PMOS region 808 are provided next to each other in a channel width direction (a gate width direction) with an element isolation region 804 interposed therebetween. The semiconductor substrate 801 is formed from, e.g., silicon.

More specifically, as shown in FIG. 26 and FIGS. 27A through 27C, an NMOS region (active region) 805 including a p-type well is formed in a first region of a semiconductor substrate 801. The first region is a region defined by element isolation regions 802 and 804. The element isolation region 802 is located adjacent to the NMOS region 805 in a channel length direction and the element isolation region 804 is located adjacent to the NMOS region 805 in a channel width direction. A gate insulating film 811 and a gate electrode 812 are sequentially formed on the NMOS region 805. The gate insulating film 811 and the gate electrode 812 form a gate portion 813. An insulating sidewall spacer 817 is formed on the side wall of the gate portion 813. The sidewall spacer 817 is formed from, e.g., an I-shaped (plate-like) offset spacer 814, an L-shaped oxide film 815, and a SiN film 816. The I-shaped offset spacer 814 is formed from an oxide film and is in contact with the side wall of the gate portion 813. The L-shaped oxide film 815 covers the side surface of the offset spacer 814. The SiN film 816 covers the side surface and the bottom surface of the L-shaped oxide film 815. An n-type extension diffusion layer 806 and an n-type source/drain diffusion layer 807 are formed on both sides of the gate portion 813 in the NMOS region 805 in the same manner as that shown in the first embodiment. The n-type extension diffusion layer 806 is an impurity diffusion layer formed by implantation of n-type impurity ions such as arsenic. The n-type source/drain diffusion layer 807 has a deeper junction depth than that of the n-type extension diffusion layer 806.

As shown in FIG. 26 and FIGS. 27A through 27C, a PMOS region (active region) 808 including an n-type well is formed in a second region of the semiconductor substrate 801. The second region is a region defined by the element isolation regions 802 and 804. The element isolation region 802 is located adjacent to the PMOS region 808 in the channel length direction and the element isolation region 804 is located adjacent to the PMOS region 808 in the channel width direction. A gate insulating film 821 and a gate electrode 822 are sequentially formed on the PMOS region 808. The gate insulating film 821 and the gate electrode 822 form a gate portion 823. An insulating sidewall spacer 827 is formed on the side wall of the gate portion 823. The sidewall spacer 827 is formed from, e.g., an I-shaped (plate-like) offset spacer 824, an L-shaped oxide film 825, and a SiN film 826. The I-shaped offset spacer 824 is formed from an oxide film and is in contact with the side wall of the gate portion 823. The L-shaped oxide film 825 covers the side surface of the offset spacer 824. The SiN film 826 covers the side surface and the bottom surface of the L-shaped oxide film 825. A p-type extension diffusion layer 809 and a p-type source/drain diffusion layer 810 are formed on both sides of the gate portion 823 in the PMOS region 808 in the same manner as that shown in the first embodiment. The p-type extension diffusion layer 809 is an impurity diffusion layer formed by implantation of p-type impurity ions such as boron. The p-type source/drain diffusion layer 810 has a deeper junction depth than that of the p-type extension diffusion layer 809.

This embodiment is characterized in that, as shown in FIG. 26 and FIGS. 27A through 27C, a void region 803 is formed in the element isolation region 804 that is adjacent to the PMOS region 808 in the channel width direction. With this structure, tensile stress can be applied to the PMOS region 808 in the channel width direction in a PMOSFET having a gate length direction of <110> orientation. No void region is formed in the element isolation region 802 that is adjacent to the PMOS region 808 in the channel length direction (the gate length direction). Therefore, compressive stress can be applied to the PMOS region 808 in the channel length direction. As a result, carrier mobility (hole mobility) of the PMOSFET can be improved, whereby driving capability of the PMOSFET can be reliably improved.

It should be noted that the above effect can be obtained even when the volume ratio of the void region 803 to the element isolation region 804 is 0.1%. However, this volume ratio is preferably 10% or less in order to prevent reduction in strength.

In this embodiment, the void region 803 is formed in the element isolation region 804 that divides the NMOS region 805 and the PMOS region 808 and in the element isolation region 804 that is adjacent to the NMOS region 805 in the channel width direction on the opposite side of the PMOS region 808. Therefore, in an NMOSFET having a gate length direction of <110> orientation, carrier mobility (electron mobility) of the NMOSFET is increased by tensile stress that is applied in the channel width direction, but is decreased by compressive stress that is applied in the channel length direction by the element isolation region 802 having no void region 803.

FIG. 26 shows that the sidewall spacers 817 and 827 are respectively formed on the side walls of the gate portions 813 and 823 which face the channel length direction. However, the sidewall spacers 817 and 827 may also be formed on the end faces of the gate portions 813 and 823 which face the channel width direction, respectively. The gate electrode 812 of the NMOS region 805 and the gate electrode 822 of the PMOS region 808 may be connected to each other through a gate wiring that is formed on the element isolation region 804 between the NMOS region 805 and the PMOS region 808.

The semiconductor device of this embodiment can be manufactured by the same method as the manufacturing method of the first embodiment shown in FIGS. 3A through 3H and FIGS. 4A through 4H, the manufacturing method of the first modification of the first embodiment shown in FIGS. 5A and 5B, or the manufacturing method of the second modification of the first embodiment shown in FIGS. 6A through 6J.

The same effects as those of this embodiment can also be obtained when the void region 803 of this embodiment is replaced with a lower Young's modulus material region. In this case, the semiconductor device can be manufactured by the same method as the manufacturing method of the second embodiment shown in FIGS. 9A through 9F, the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F.

The same effects as those of this embodiment can be obtained when the void region 803 of this embodiment is replaced with a highly contractile material region. In this case, the semiconductor device can be manufactured by using a highly contractile material instead of a lower Young's modulus material in the same method as the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F (see the fourth embodiment).

Ninth Embodiment

Hereinafter, a semiconductor device and a manufacturing method thereof according to a ninth embodiment of the invention will be described with reference to the accompanying drawings. In this embodiment, a CMOSFET will be described as an example of a semiconductor device of the invention. It should be noted that, in this embodiment, a gate length direction (a channel length direction) of an NMOSFET and a PMOSFET is a <110> orientation (an allowable tolerance from the <110> orientation is about ±10°).

Figure 28:
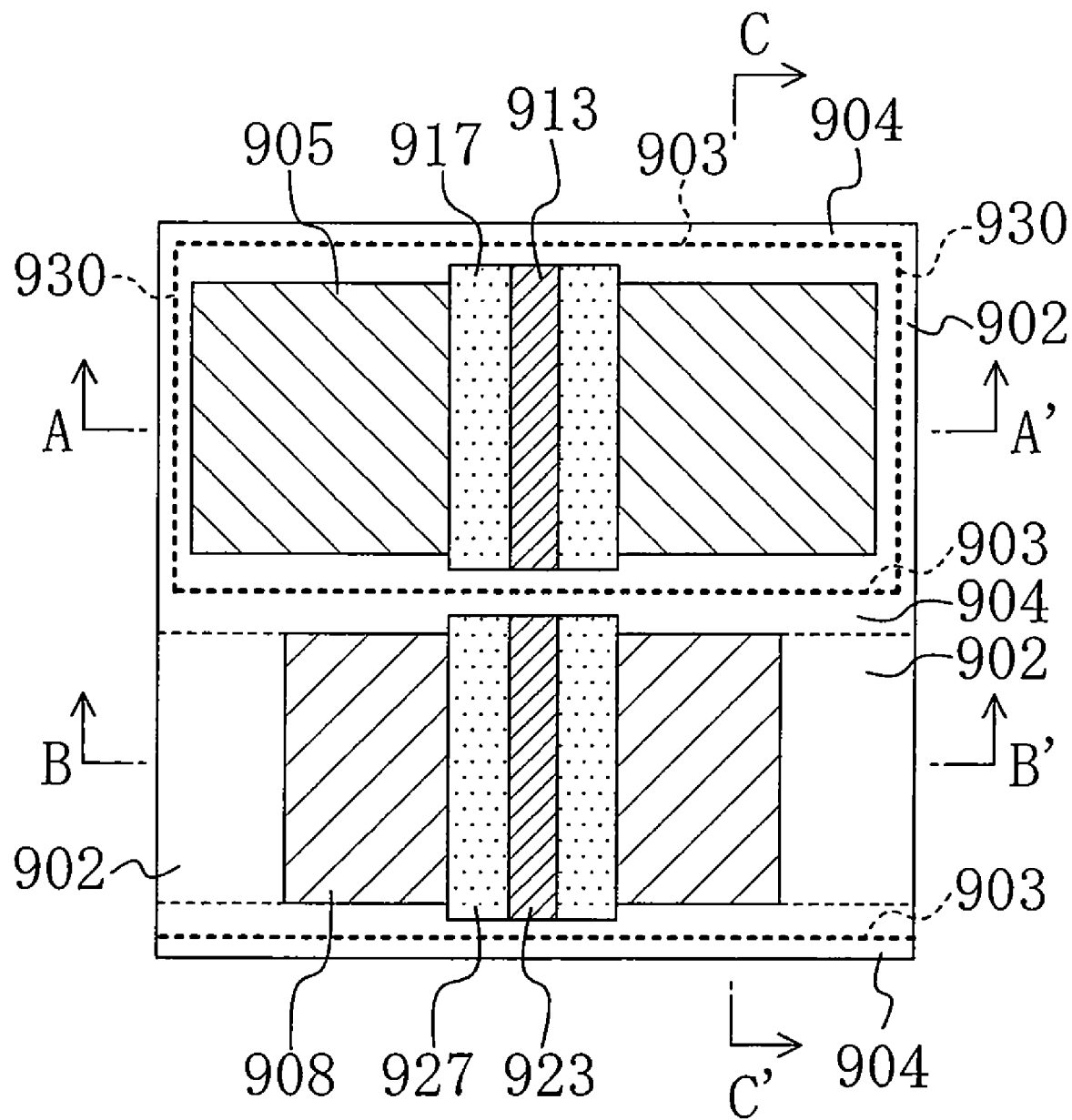
FIG. 28 is a plan view showing a main part of the structure of a semiconductor device according to a ninth embodiment of the invention.
Figure 29A:
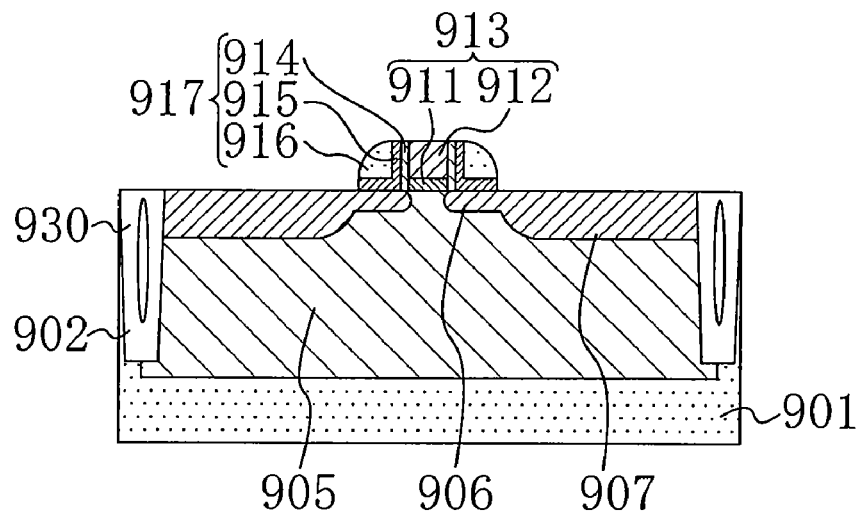
Figure 29B:
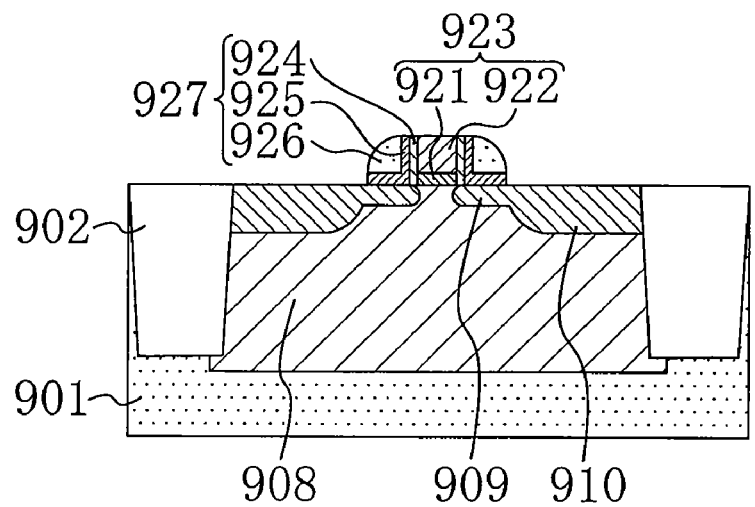
Figure 29C:
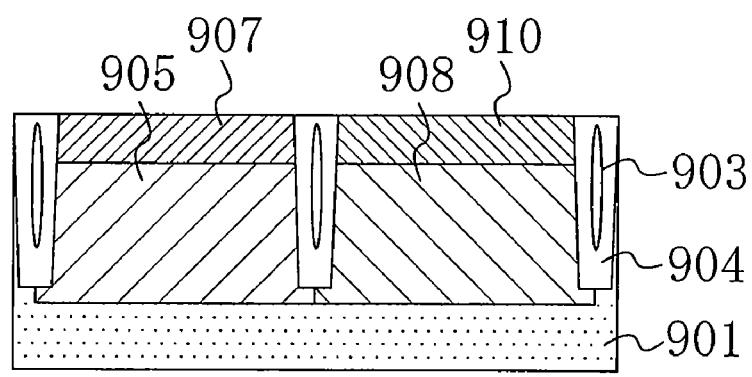
Figure 30:
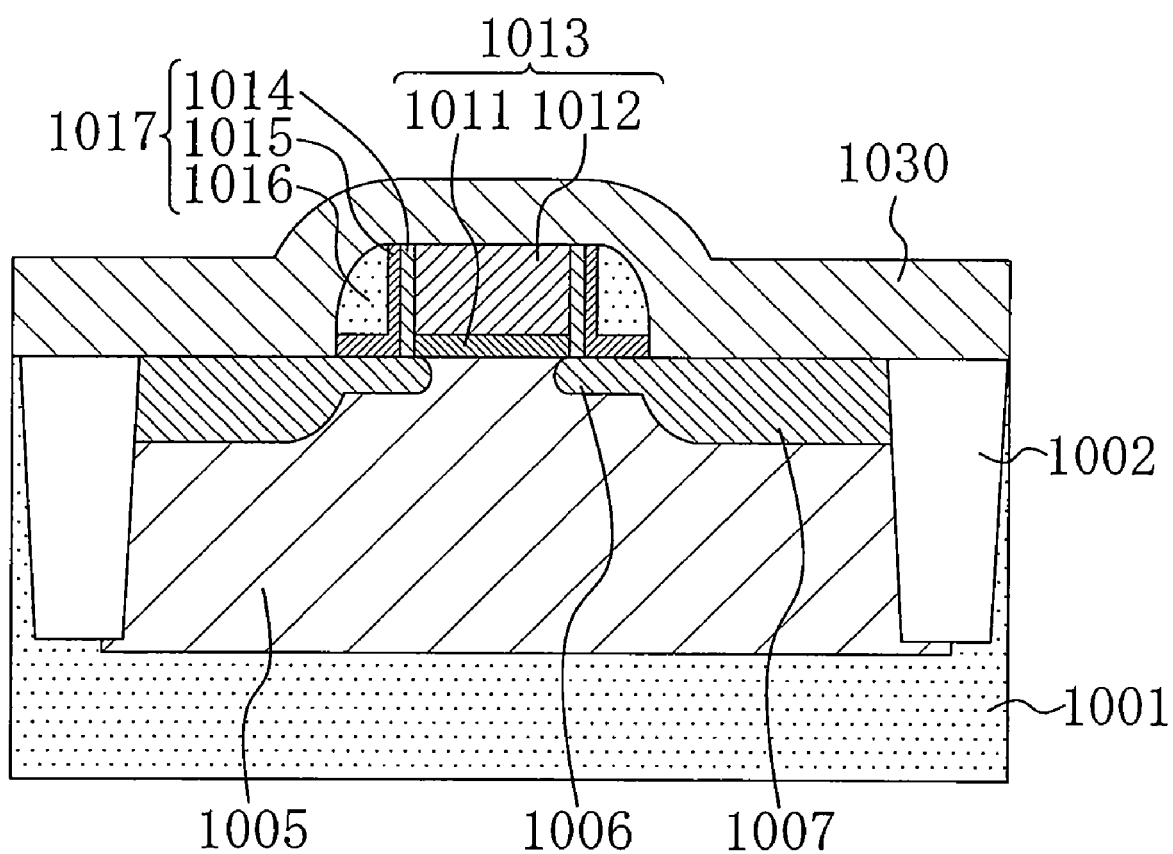
FIG. 30 is a cross-sectional view showing a main part of the structure of a conventional semiconductor device.

FIG. 28 and FIGS. 29A through 29C show the structure of a semiconductor device according to the ninth embodiment of the invention. FIG. 28 is a plan view, FIG. 29A is a cross-sectional view taken along line A-A' of FIG. 28, FIG. 29B is a cross-sectional view taken along line B-B' of FIG. 28, and FIG. 29C is a cross-sectional view taken along line C-C' of FIG. 28.

As shown in FIG. 28, in a semiconductor substrate 901, an NMOS region 905 and a PMOS region 908 are provided next to each other in a channel width direction (a gate width direction) with an element isolation region 904 interposed therebetween. The semiconductor substrate 901 is formed from, e.g., silicon.

More specifically, as shown in FIG. 28 and FIGS. 29A through 29C, an NMOS region (active region) 905 including a p-type well is formed in a first region of a semiconductor substrate 901. The first region is a region defined by element isolation regions 902 and 904. The element isolation region 902 is located adjacent to the NMOS region 905 in a channel length direction and the element isolation region 904 is located adjacent to the NMOS region 905 in a channel width direction. A gate insulating film 911 and a gate electrode 912 are sequentially formed on the NMOS region 905. The gate insulating film 911 and the gate electrode 912 form a gate portion 913. An insulating sidewall spacer 917 is formed on the side wall of the gate portion 913. The sidewall spacer 917 is formed from, e.g., an I-shaped (plate-like) offset spacer 914, an L-shaped oxide film 915, and a SiN film 916. The I-shaped offset spacer 914 is formed from an oxide film and is in contact with the side wall of the gate portion 913. The L-shaped oxide film 915 covers the side surface of the offset spacer 914. The SiN film 916 covers the side surface and the bottom surface of the L-shaped oxide film 915. An n-type extension diffusion layer 906 and an n-type source/drain diffusion layer 907 are formed on both sides of the gate portion 913 in the NMOS region 905 in the same manner as that shown in the first embodiment. The n-type extension diffusion layer 906 is an impurity diffusion layer formed by implantation of n-type impurity ions such as arsenic. The n-type source/drain diffusion layer 907 has a deeper junction depth than that of the n-type extension diffusion layer 906.

As shown in FIG. 28 and FIGS. 29A through 29C, a PMOS region (active region) 908 including an n-type well is formed in a second region of the semiconductor substrate 901. The second region is a region defined by the element isolation regions 902 and 904. The element isolation region 902 is located adjacent to the PMOS region 908 in the channel length direction and the element isolation region 904 is located adjacent to the PMOS region 908 in the channel width direction. A gate insulating film 921 and a gate electrode 922 are sequentially formed on the PMOS region 908. The gate insulating film 921 and the gate electrode 922 form a gate portion 923. An insulating sidewall spacer 927 is formed on the side wall of the gate portion 923. The sidewall spacer 927 is formed from, e.g., an I-shaped (plate-like) offset spacer 924, an L-shaped oxide film 925, and a SiN film 926. The I-shaped offset spacer 924 is formed from an oxide film and is in contact with the side wall of the gate portion 923. The L-shaped oxide film 925 covers the side surface of the offset spacer 924. The SiN film 926 covers the side surface and the bottom surface of the L-shaped oxide film 925. A p-type extension diffusion layer 909 and a p-type source/drain diffusion layer 910 are formed on both sides of the gate portion 923 in the PMOS region 908 in the same manner as that shown in the first embodiment. The p-type extension diffusion layer 909 is an impurity diffusion layer formed by implantation of p-type impurity ions such as boron. The p-type source/drain diffusion layer 910 has a deeper junction depth than that of the p-type extension diffusion layer 909.

In this embodiment, as shown in FIG. 28 and FIGS. 29A through 29C, the dimension of the PMOS region 908 in the channel length direction is smaller that of the NMOS region 905 in the channel length direction. Therefore, the width of the element isolation region 902 that is adjacent to the NMOS region 905 in the channel length direction is narrower than that of the element isolation region 902 that is adjacent to the PMOS region 908 in the channel length direction.

In this embodiment, as shown in FIG. 28 and FIGS. 29A through 29C, a void region 903 is formed in the element isolation region 904 that is adjacent to the PMOS region 908 in the channel width direction. With this structure, tensile stress can be applied to the PMOS region 908 in the channel width direction in a PMOSFET having a gate length direction of <110> orientation. No void region is formed in the element isolation region 902 that is adjacent to the PMOS region 908 in the channel length direction (the gate length direction). Therefore, compressive stress can be applied to the PMOS region 908 in the channel length direction. As a result, carrier mobility (hole mobility) of the PMOSFET can be improved, whereby driving capability of the PMOSFET can be reliably improved.

It should be noted that the above effect can be obtained even when the volume ratio of the void region 903 to the element isolation region 904 is 0.1%. However, this volume ratio is preferably 10% or less in order to prevent reduction in strength.

In this embodiment, the void region 903 is also formed in the element isolation region 904 located between the PMOS region 908 and the NMOS region 905 and in the element isolation region 904 that is adjacent to the NMOS region 905 in the channel width direction on the opposite side of the PMOS region 908. Therefore, in an NMOSFET having a gate length direction of <110> orientation, carrier mobility (electron mobility) of the NMOSFET is increased by tensile stress that is applied in the channel width direction.

In this embodiment, a void region 930 is formed in the element isolation region 902 that is adjacent to the NMOS region 905 in the channel length direction. With this structure, in the NMOS region 905 having a gate length direction of <110> orientation, tensile stress can be applied both in the channel width direction and the channel length direction. Therefore, carrier mobility (electron mobility) in the NMOS region 905 can be improved, whereby driving capability of the NMOSFET can be improved. In other words, since carrier mobility in both the PMOS region 908 and the NMOS region 905 can be improved, driving capability of both the PMOSFET and the NMOSFET can be improved.

It should be noted that the above effect can be obtained even when the volume ratio of the void region 930 to the element isolation region 902 is 0.1%. However, this volume ratio is preferably 10% or less in order to prevent reduction in strength.

FIG. 28 shows that the sidewall spacers 917 and 927 are respectively formed on the side walls of the gate portions 913 and 923 which face the channel length direction. However, the sidewall spacers 917 and 927 may also be formed on the end faces of the gate portions 913 and 923 which face the channel width direction, respectively. The gate electrode 912 of the NMOS region 905 and the gate electrode 922 of the PMOS region 908 may be connected to each other through a gate wiring that is formed on the element isolation region 904 between the NMOS region 905 and the PMOS region 908.

The semiconductor device of this embodiment can be manufactured by the same method as the manufacturing method of the first embodiment shown in FIGS. 3A through 3H and FIGS. 4A through 4H, the manufacturing method of the first modification of the first embodiment shown in FIGS. 5A and 5B, or the manufacturing method of the second modification of the first embodiment shown in FIGS. 6A through 6J. When the same method as the manufacturing method of the first modification or the second modification of the first embodiment is used, the width of the element isolation region 902 that is adjacent to the NMOS region 905 in the channel length direction need not be made narrower than that of the element isolation region 902 that is adjacent to the PMOS region 908 in the channel length direction. Therefore, the dimension of the PMOS region 908 in the channel length direction may be the same as that of the NMOS region 905 in the channel length direction.

The same effects as those of this embodiment can also be obtained when the void regions 903 and 930 of this embodiment are replaced with lower Young's modulus material regions. In this case, the semiconductor device can be manufactured by the same method as the manufacturing method of the second embodiment shown in FIGS. 9A through 9F, the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F. When the same method as the manufacturing method of the second modification or the third modification of the third embodiment is used, the width of the element isolation region 902 that is adjacent to the NMOS region 905 in the channel length direction need not be made narrower than that of the element isolation region 902 that is adjacent to the PMOS region 908 in the channel length direction. Therefore, the dimension of the PMOS region 908 in the channel length direction may be the same as that of the NMOS region 905 in the channel length direction.

The same effects as those of this embodiment can be obtained when the void regions 903 and 930 of this embodiment are replaced with highly contractile material regions. In this case, the semiconductor device can be manufactured by using a highly contractile material instead of a lower Young's modulus material in the same method as the manufacturing method of the third embodiment shown in FIGS. 12A through 12H and FIGS. 13A and 13B, the manufacturing method of the first modification of the third embodiment shown in FIGS. 14A through 14F, the manufacturing method of the second modification of the third embodiment shown in FIGS. 15A through 15H and FIGS. 16A and 16B, or the manufacturing method of the third modification of the third embodiment shown in FIGS. 17A through 17F (see the fourth embodiment). When the same method as the manufacturing method of the second modification or the third modification of the third embodiment is used, the width of the element isolation region 902 that is adjacent to the NMOS region 905 in the channel length direction need not be made narrower than that of the element isolation region 902 that is adjacent to the PMOS region 908 in the channel length direction. Therefore, the dimension of the PMOS region 908 in the channel length direction may be the same as that of the NMOS region 905 in the channel length direction.

What is claimed is:

1. A semiconductor device, comprising:
   an active region formed on a semiconductor substrate;
   an element isolation region formed on the semiconductor substrate so as to surround the active region; and
   a gate electrode formed on the active region, wherein
   a first element isolation region that causes tensile stress so as to improve carrier mobility in the active region is provided in the element isolation region,
   the first element isolation region is formed in a trench arranged in the semiconductor substrate and has a first insulating film that causes the tensile stress and a void which is located so that the entire of the void is surrounded by the first insulating film,
   the active region is an N-type MISFET (Metal Insulator Semiconductor Field Effect Transistor) region,
   the first element isolation region is provided in a portion of the element isolation region which is adjacent to the active region in a gate length direction,
   a second element isolation region is provided in a portion of the element isolation region which is adjacent to the active region in a gate width direction, and
   the second element isolation region has a second insulating film formed in a trench arranged in the semiconductor substrate but has no void.

2. The semiconductor device according to claim 1, further comprising another active region as a P-type MISFET region that is formed on the semiconductor substrate so as to be located next to the active region in the gate length direction and to be surrounded by the element isolation region, wherein the another active region has a gate length direction of <100> orientation.

3. The semiconductor device according to claim 1, further comprising another active region as a P-type MISFET region that is formed on the semiconductor substrate so as to be located next to the active region in the gate width direction and to be surrounded by the element isolation region, wherein the another active region has a gate length direction of <100> orientation.

4. The semiconductor device according to claim 1, wherein the first insulating film is formed from a silicon oxide film.

5. The semiconductor device according to claim 1, wherein the first and second insulating films are formed from a silicon oxide film.

6. The semiconductor device according to claim 1, wherein a width of the trench of the first element isolation region is narrower than a width of the trench of the second element isolation region.

7. The semiconductor device according to claim 1, wherein a sidewall taper angle of the trench of the first element isolation region is smaller than a sidewall taper angle of the trench of the second element isolation region.

8. The semiconductor device according to claim 7, wherein a width of an upper part of the trench of the first element isolation region is the same as a width of an upper part of the trench of the second element isolation region.

9. A semiconductor device, comprising:
   an active region formed on a semiconductor substrate;
   an element isolation region formed on the semiconductor substrate so as to surround the active region; and
   a gate electrode formed on the active region,
   wherein a first element isolation region that causes tensile stress so as to improve carrier mobility in the active region is provided in the element isolation region,
   the first element isolation region is formed in a trench arranged in the semiconductor substrate and has a first insulating film that causes the tensile stress and a void which is located so that the entire of the void is surrounded by the first insulating film,
   the active region is a P-type MISFET region, and the first element isolation region is provided in a portion of the element isolation region which is adjacent to the active region in a gate width direction,
   a second element isolation region is provided in a portion of the element isolation region which is adjacent to the active region in a gate length direction, and
   the second element isolation region has a second insulating film formed in a trench arranged in the semiconductor substrate but has no void.

10. The semiconductor device according to claim 9, further comprising another active region as an N-type MISFET region that is formed on the semiconductor substrate so as to be located next to the active region in the gate length direction and to be surrounded by the element isolation region, wherein the another active region has a gate length direction of <110> orientation.

11. The semiconductor device according to claim 10, wherein a portion of the element isolation region which is located between the active region and the another active region is divided by a substrate region that extends in the gate width direction, and the first element isolation region is provided also in one of the divided portions which is located adjacent to the another active region.

12. The semiconductor device according to claim 9, further comprising another active region as an N-type MISFET region that is formed on the semiconductor substrate so as to be located next to the active region in the gate width direction and to be surrounded by the element isolation region, wherein the another active region has a gate length direction of <110> orientation.

13. The semiconductor device according to claim 12, wherein the first element isolation region is provided also in a portion of the element isolation region which is adjacent to the another active region in the gate length direction.

14. The semiconductor device according to claim 9, wherein the first and second insulating films are formed from a silicon oxide film.

15. The semiconductor device according to claim 9, wherein a width of the trench of the first element isolation region is narrower than the width of the trench of the second element isolation region.

* * * * *